United States Patent [19]

Kosugi et al.

[11] Patent Number: 4,814,829
[45] Date of Patent: Mar. 21, 1989

[54] PROJECTION EXPOSURE APPARATUS

[75] Inventors: Masao Kosugi, Yokohama; Akiyoshi Suzuki, Tokyo; Hideki Ina, Kawasaki; Kazuhito Outsuka, Tokyo; Shigeki Ogawa, Yokohama; Masao Totsuka, Ohmiya; Fumio Sakai, Yokohama, all of Japan

[73] Assignee: Canon Kabushiki Kaisha, Tokyo, Japan

[21] Appl. No.: 60,398

[22] Filed: Jun. 10, 1987

[30] Foreign Application Priority Data

| Jun. 12, 1986 | [JP] | Japan | 61-134873 |
| May 6, 1987 | [JP] | Japan | 62-109113 |
| May 6, 1987 | [JP] | Japan | 62-109114 |
| May 6, 1987 | [JP] | Japan | 62-109115 |
| May 6, 1987 | [JP] | Japan | 62-109116 |
| May 6, 1987 | [JP] | Japan | 62-109117 |
| May 6, 1987 | [JP] | Japan | 62-109118 |
| May 6, 1987 | [JP] | Japan | 62-109119 |
| May 6, 1987 | [JP] | Japan | 62-109120 |
| May 6, 1987 | [JP] | Japan | 62-109121 |
| May 6, 1987 | [JP] | Japan | 62-109122 |
| May 6, 1987 | [JP] | Japan | 62-109123 |
| May 6, 1987 | [JP] | Japan | 62-109124 |

[51] Int. Cl.⁴ .................. G03B 27/52; G03B 27/70
[52] U.S. Cl. .................................. 355/43; 355/53
[58] Field of Search ..................... 355/43, 45, 53; 356/400, 401

[56] References Cited

U.S. PATENT DOCUMENTS

| 4,441,250 | 4/1984 | Imhashi | 356/401 X |
| 4,558,949 | 12/1985 | Uehara et al. | 356/400 X |
| 4,699,515 | 10/1987 | Tanimoto et al. | 356/401 |

Primary Examiner—L. T. Hix
Assistant Examiner—D. Rutledge
Attorney, Agent, or Firm—Fitzpatrick, Cella, Harper & Scinto

[57] ABSTRACT

A projection exposure apparatus for projecting a pattern of a reticle upon a wafer by use of a projection lens system, is disclosed. The apparatus is arranged so that a mark illuminating light is projected upon the wafer from between the projection lens system and the wafer and not by way of the projection lens system. The light diffracted by an edge of a wafer alignment mark is photoelectrically detected by way of the projection lens system, whereby an electrical signal corresponding to an image of the alignment mark is obtained. On the basis of the detected signal, the wafer is aligned with the reticle. This arrangement allows detection of the alignment mark without being affected by a photoresist applied to the wafer surface. Thus, the reticle-to-wafer alignment can be made accurately. Also, a novel and unique alignment method is disclosed. The disclosed method assures high-accuracy reticle-to-wafer alignment.

43 Claims, 45 Drawing Sheets

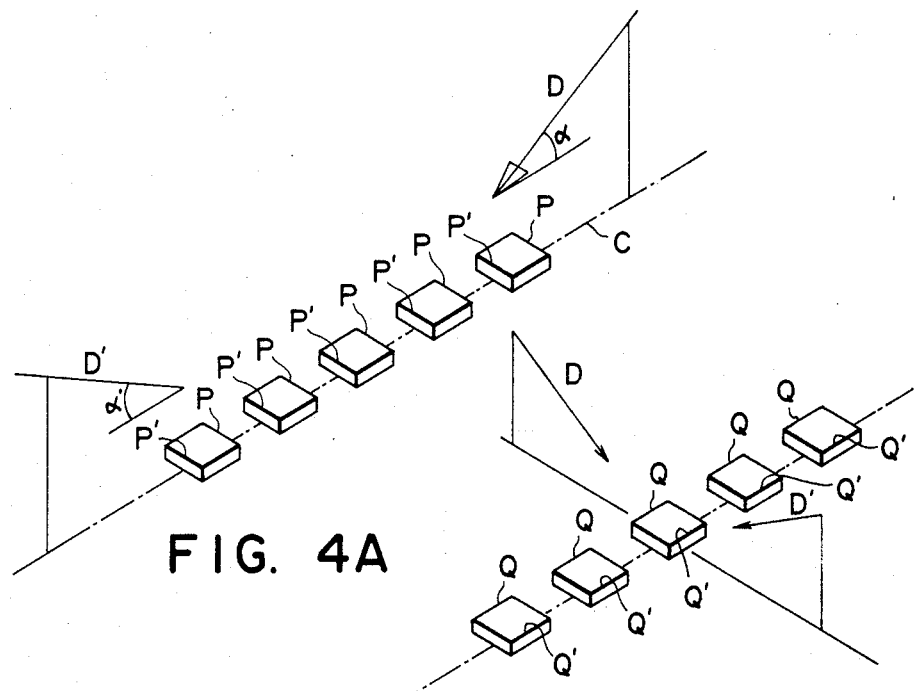
FIG. 4A
FIG. 4B
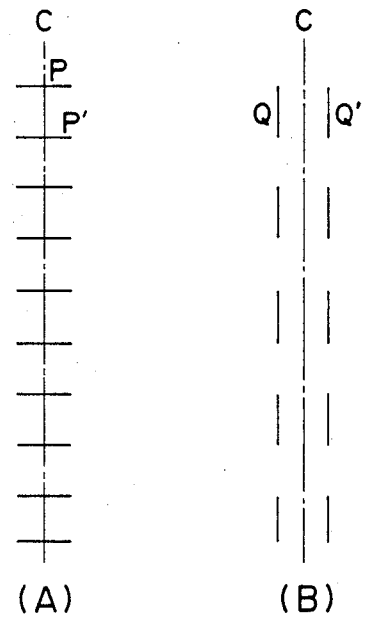
(A)   (B)
FIG. 5

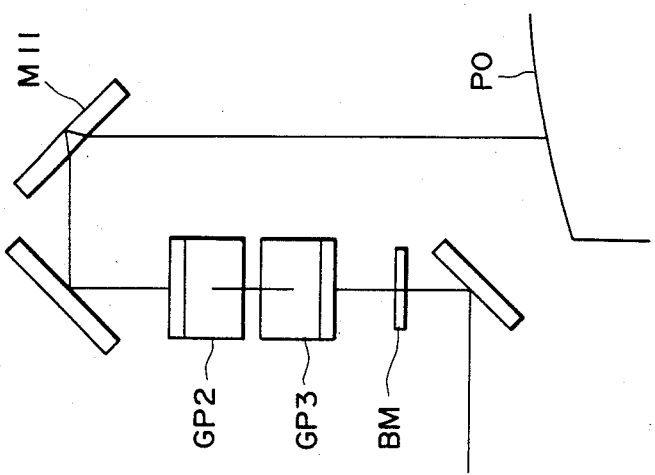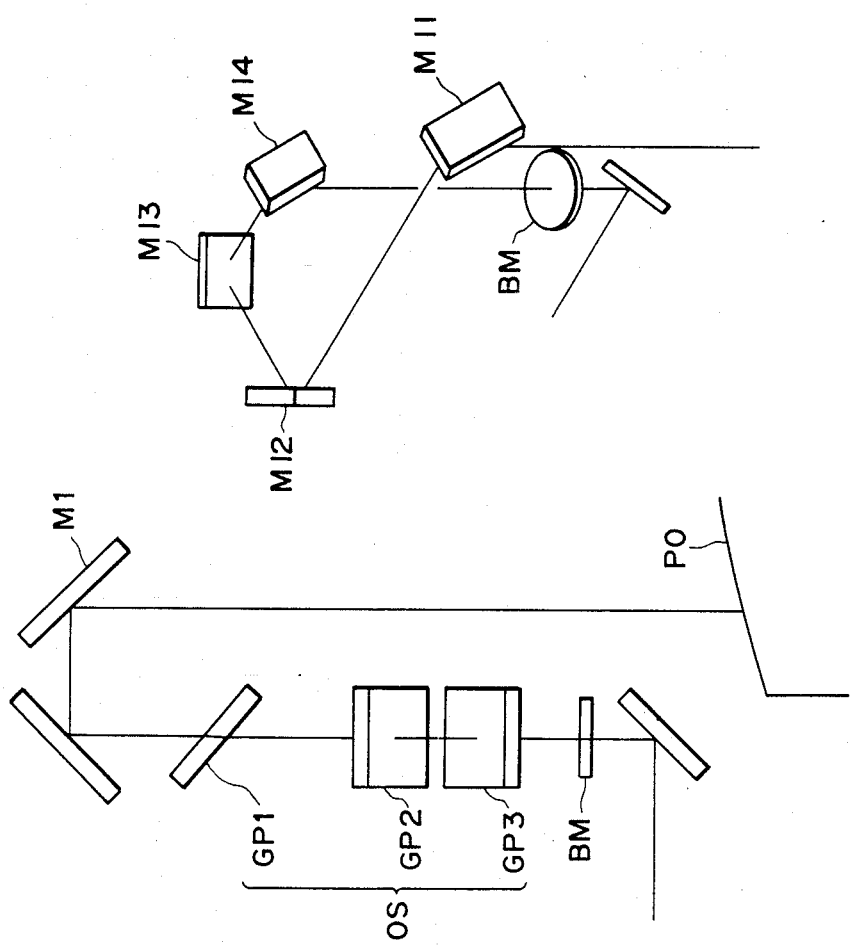
FIG. 25
FIG. 24
FIG. 23

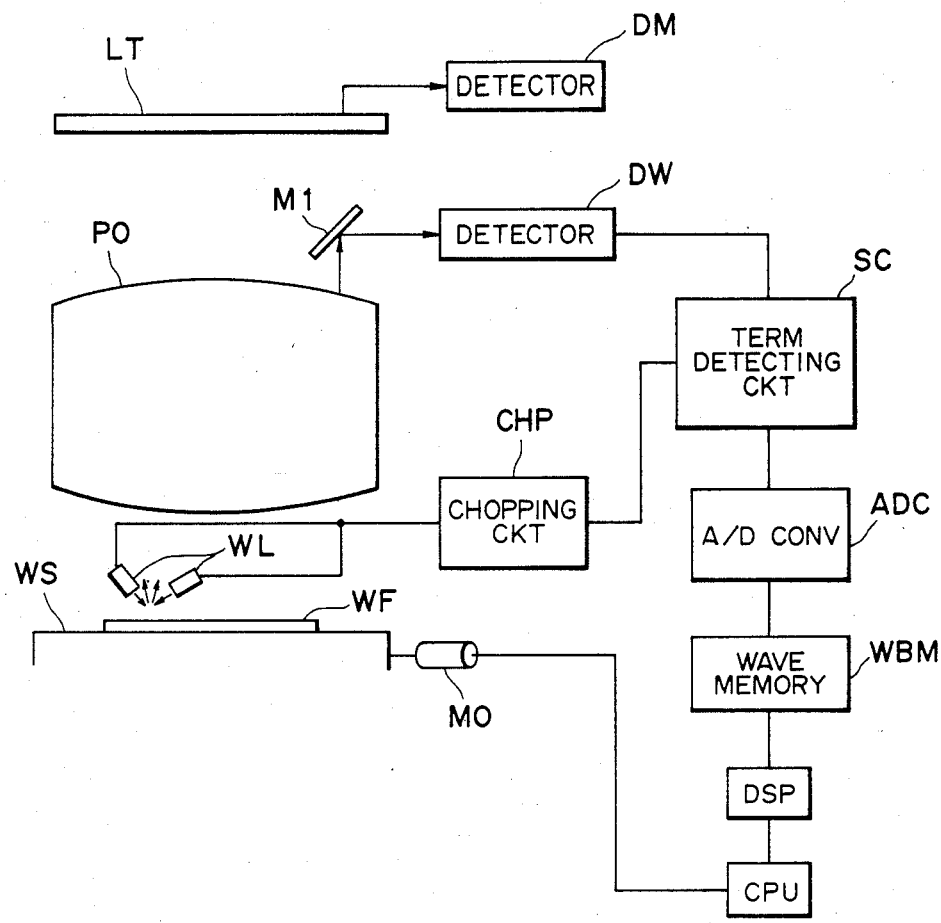
F I G. 37

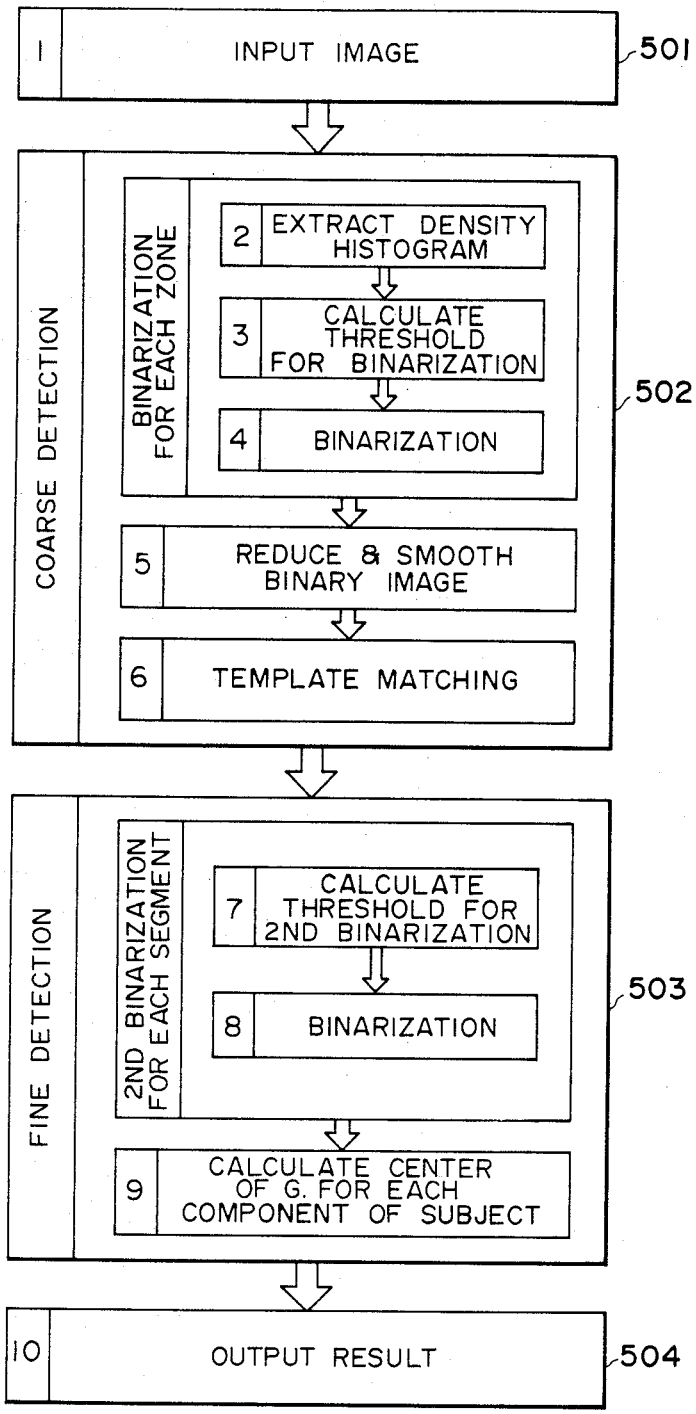
F I G. 53

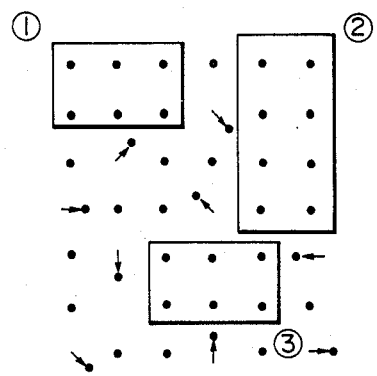
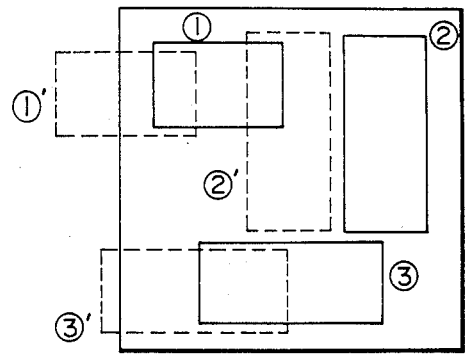
FIG. 64A  FIG. 64B
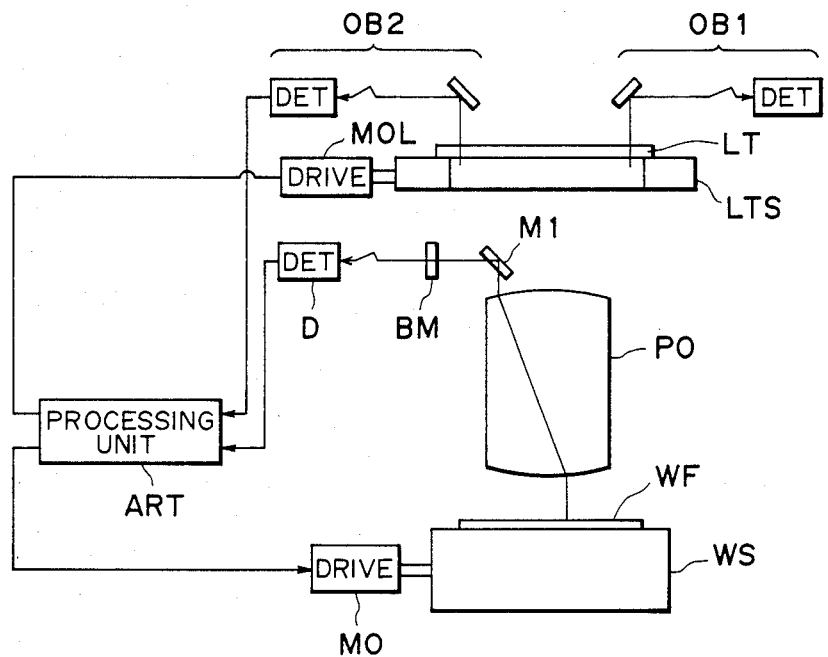
FIG. 65

PROJECTION EXPOSURE APPARATUS

FIELD OF THE INVENTION AND RELATED ART

This invention relates to a projection exposure apparatus and, more particularly, to a projection exposure apparatus having an optical system for detecting image information concerning an object having a surface transparent film. Typically, the invention is suitably applicable to projection exposure apparatuses (called "steppers") usable in the manufacture of semiconductor devices such as integrated circuits, for aligning a wafer coated with a photoresist material with respect to a reticle and, after alignment, for exposing the wafer to a pattern of the reticle with radiation.

In the projection exposure apparatus of the type described above, resolving power and superimposing accuracy are two basic performances required. As for the resolving power, it only needs very simple treatment because only a few parameters determine the resolving power. In the projection exposure apparatuses, called "steppers", used in the field of manufacture of semiconductor devices, it is easy to estimate the resolving power of a projection lens system once the numerical aperture (NA) and the wavelength to be used for the photoprinting through the projection lens system are determined. Also, in the case of X-ray exposure apparatuses, there are only a limited number of parameters such as "half shade" which is determined by the size of an X-ray source used.

In field of semiconductor devices, the progress in developing higher capacities and further miniaturization mainly owes to the advance of the photolithography technique (i.e. the technique of printing a pattern of a very narrow linewidth) and to the advance of the process technique such as the etching process technique. As regards the resolving power, the history of projection lens systems used in the steppers shows a steady advance of the resolving power. Recently, the minimum resolvable linewidth has become less than 1 micron which was a threshold in the past, and a variety of lens systems having resolution of an order of submicron linewidth have been developed.

On the side of the wafer process, there have recently been proposed various ideas such as a trenching process, a low-step structure, a high-step structure or the like. Briefly, these ideas relate to the development of developing three-dimensional integrated-circuits.

The advance of the resolving power having been achieved on the exposure apparatus side and the advance having been achieved on the process technique side come into intimate contact with each other, on the same stage of pattern superimposition. In this respect, the superimposing accuracy has become more and more important in the exposure apparatus.

It is difficult to treat the superimposing accuracy in terms of simple parameters with which the resolving power can be treated. This is just the implication of the variation of the wafer process. On the other hand, this is because of the multifariousness of the structures of alignment systems used for the superimposition. What makes the factors of the wafer process more complicated is the fact that the problem should be discussed not only in the phase of a wafer substrate but also in the phase of a photoresist coating applied to the wafer surface. One of the targets which are currently and apparently aimed at in field of semiconductor device is a three-dimensionally constructed integrated-circuit. In such a circuit the surface step (recess/protrusion) of the wafer must be made much deeper or higher. Clearly, this adversely affects the state of resist coating. Also, there is a tendency to further enlargement of the wafer size, i.e. from 6-inch wafers to 8-inch or 10-inch wafers. Where a large-diameter wafer is coated with a photoresist material in accordance with the drop-and-spin method, apparently the state of coating is uneven between a central portion and a peripheral portion of the wafer. Also, the unevenness grows with the increase in the depth/height of the surface recess/protrusion of the wafer. In fact, it is known that the state of alignment changes due to the influence of the application of the resist material to the wafer. The importance will be understood from the fact that studies have been made of how to uniformly apply the resist material.

Further, with regard to the photoresist, consideration has to be made of a tendency to using a multilayer resist in accordance with the "age" of submicron linewidth. Since, in a few manufacturing processes, some measures such as the aforementioned multilayer resist process or the contrast enhancement lithography (CEL) technique must be inevitably adopted in order to improve the resolving power, it is also necessary to arrange the exposure apparatus so as to meet them. It can be said that, in the phase of the pattern superimposition, it is required to provide the exposure apparatuses with effective measures for such newly proposed wafer processes as described above.

On the other hand, the multifariousness of alignment systems is evidence of the flexibility and difficulty in constructing the system. Every alignment system having been proposed or developed has a difference from the others, and each system has its own advantages and disadvantages. An example is found in an alignment system of a projection exposure apparatus of the type disclosed in Japanese Laid-Open Patent Application, Laid-Open No. 25638/1983. This is an example of excellent arrangement which practically embodies a so-called TTL (through the lens) on-axis alignment system with the aid of a projection lens optical system that is telecentric both on the reticle side and on the wafer side. While the projection lens system is arranged so that aberrations are corrected with respect to g-line rays (436 nm in wavelength), it shows substantially the same optical performance with respect to a He-Cd laser beam (442 nm in wavelength). The proposed alignment system uses the laser beam scanning method, using the He-Cd laser beam, for the detection of alignment signals. For this reason, the exposure operation can be initiated just in the state of completion of the alignment. Namely, the TTL on-axis alignment is practically embodied. The TTL on-axis alignment system is nearly ideal in a sense that the error in the detection of the alignment signals is the sole factor in the inaccurate operation of the exposure apparatus. Its only weak point is that the signal detection is not easy when the system is used with a resist material, such as the multilayer resist, having an absorbency with respect to wavelengths near that to be used for the photoprinting.

On the other hand, many proposals have been made for alignment systems using a wavelength other than the photoprinting wavelength, more particularly using a longer wavelength such as that of e-line rays (546 nm) or that of a He-Ne laser beam (633 nm). Because of the use of a wavelength longer than the photoprinting wavelength, these alignment systems are reliable, for the wafer process using absorptive resist materials such as the multilaser resist. However, due to various aberrations of the projection lens system caused in relation to the "chromaticity", the position that allows detection of a wafer alignment mark by way of the projection lens system (in other words, the position in the image height direction related to the projection lens system) is usually fixed. Therefore, while it depends on the positional relation of the alignment mark with an associated shot area of the wafer, it is necessary to move the wafer after the mark is detected, so as to move the associated shot area to the exposure position. Such movement leads to a factor of inaccuracy.

However, recent demands for the superimposing accuracy are very strict. Even the above-described signal detection error which is the sole factor of inaccuracy in the idealistic alignment system of the type described in the aforementioned Japanese Patent Application, Laid-Open No. 25638/1983, has to be treated as a problem.

The inventors of the subject application have made an analysis of components of the error in the detection of the alignment signal and, from the results, it has been found that almost all the error components result chiefly from the application of the photoresist to the wafer surface. While there are many factors of inaccuracy related to the resist coating, it is considered that the most important factors are the following two:

The first is the effect of interference between the light reflected by the surface of the resist layer and the light passing through the resist layer and reflected backwardly from the substrate of the wafer. Particularly, as described hereinbefore, the application of the photoresist material to the wafer is not always uniform. In many cases, the resist coating is uneven between the central portion and the peripheral portion. Also, the wafer substrate itself is involved in unevenness in the working processes such as the etching, the sputtering, etc. As a consequence, the structures of respective alignment marks associated with different shot areas on the wafer, when they are considered in the condition that the resist coating exists on the wafer, are different from each other (the variation occurring with the difference in the location on the wafer). Accordingly, the effect of interference varies with the location on the wafer. It appears that the interference described above is the most striking one of the effects of the resist coating that causes the alignment error.

The second factor is that of multiple reflection. One function of the resist layer is to act as an optical waveguide. For this reason, a portion of the light reflected by the wafer substrate is reflected a interface between the resist layer and the air. This portion of light goes back to the wafer substrate and is reflected thereby again. The higher the reflection factor of the wafer substrate, the more noticeable is the effect of multi-reflection. Moreover, the multiple reflection finally causes interference which results in further deterioration of the alignment accuracy.

As another factor of inaccuracy resulting from the photoresist, there is the shift of an image due to the refraction by the resist material. However, such factor is merely a secondary factor. It has been confirmed as a result of the above analysis that the exclusion of the above-discusses two factors, particularly the effect of interference, is contributive to the improvement of the alignment accuracy, to a great extent.

SUMMARY OF THE INVENTION

It is accordingly a primary object of the present invention to provide a systematic arrangement which alleviates the effect of interference to thereby ensure higher alignment detection accuracy. Also, it is an object of the present invention to provide a projection exposure apparatus having such a systematic arrangement.

According to one aspect of the present invention, to achieve these objects, there is provided a projection exposure apparatus for transferring a pattern of a first member onto a second member by way of an imaging projection optical system, wherein a detection optical system is provided so as to detect the second member by way of the projection optical system. The detection optical system is arranged to detect light from an illumination optical system which is adapted to project an illumination light from between the projection optical system and the second member and without irradiating the projection optical system.

Problems which are encountered in practically embodying the above-described systematic arrangement, have already been considered by the inventors of the subject application.

For the position detection, for example, there is proposed a method wherein the first member is used as a reference and the position of the second member with respect to the reference is directly detected. Also, there is a method wherein the first member is preparatorily aligned with respect to a stationary portion of the apparatus while, on the other hand, the position of the second member is detected while using, as a reference, a mark provided on the stationary portion of the apparatus. In a case, such as the latter case, where it is desired to detect the position with respect to a reference mark thereby to indirectly detect the relative position of the first and second members, the problem to be considered is how to detect such reference mark, more particularly how to obtain signals of a good signal-to-noise ratio (S/N ratio) from the reference mark.

It is accordingly another object of the present invention to provide a systematic arrangement and a projection exposure apparatus using the same, wherein mark detection signals of a high signal-to-noise ratio are obtainable, with a simple structure, from a reference mark usable as a reference upon the position detection.

According to another aspect of the present invntion, to achieve this object, there is provided a position detecting device, usable with a first member such as a reticle and a second member such as a wafer, for detecting the position of the second member relative to the first member, wherein a reference mark is provided in a predetermined positional relation with the first member and wherein the relative position of the second member is detected by detecting the position of the second member with respect to the reference mark.

In one preferred form, the reference mark is defined by a light-transmitting window formed in a light-blocking member. An illumination system for illuminating the reference mark is disposed on one side of the light-blocking member, and a photodetector is disposed on the other side of the light-blocking member. Thus, a transmitted illumination system is defined with the result that the alignment mark (light-transmitting window) is detected on the basis of detection of light transmitted through the mark.

The position of the second member is detected by detecting the relative position of the reference mark and a mark provided on the second member. Since the eeference mark signal is obtained by illuminating the reference mark from the back thereof, a mark signal of good S/N ratio is obtainable.

Also, to achieve the same object, the present invention in one aspect thereof provides an alignment system, usable in an apparatus for projecting a pattern of a first member upon a second member by use of a projection exposure apparatus, for aligning the first member with the second member, wherein a reference mark is used as a reference upon alignment of the second member and wherein the reference mark is formed by a light-transmitting portion effective to transmit a portion of an image of the second member, and by a member effective to block another portion of the image of the second member as it passes through the light-transmitting portion. The second member is aligned in accordance with the detection of the relative position of the reference mark and a mark provided on the second member. At the final stage, the reference mark is used in the form of a shadow mark which blocks a portion of the image of the mark of the second member. By this, signals of a good signal-to-noise ratio are obtainable.

Further, for the alignment, a mark provided on a member such as a wafer is optically detected to obtain an optical signal the optical signal is converted into an electrical signal. On the basis of the electrical signal, the alignment is executed. In order to accomplish high-accuracy alignment of the member such as the wafer, it is necessary to obtain a mark signal of high resolution and good S/N ratio.

Accordingly, it is a further object of the present invention to provide a systematic arrangement and a projection exposure apparatus using the same, by which arrangement a mark signal of high resolution and good S/N ratio is obtainable with a simple structure, and whereby high-accuracy alignment is attainable.

In accordance with one aspect of the invention, to achieve this object, a projection optical system is provided to project a pattern of a first member upon a second member having a mark, and the mark of the second member is illuminated by use of a light projected thereupon from between the projection optical system and the second member and without use of the projection optical system. By the light illuminating the mark of the second member and by use of the projection optical system, an image of the mark is formed. The image of the mark of the second member and an image of a reference mark are scanned with slit means, and the thus scanned images are converted into electrical signals, on the basis of which any positional deviation of the second member from the reference mark is detected.

This allows detection of the relative position of the second member with respect to the reference mark as well as the alignment of the second member, only by a simple structure which comprises a few photoreceptors and slit means. The reception of the image of the reference mark and the image of the mark provided on the second member, is attainable in various ways. For example, these images may be received by separate light-receiving means. Alternatively, they may be received time-sequentially, i.e. at different times. The mark of the second member and the reference mark may be formed so as to allow detection of positional components in two orthogonal X and Y directions. Conveniently, these mark images may be scanned with the slit means with the aid of a common polygonal mirror.

Another problem is encountered in a case where a light of a wavelength different from the photoprinting wavelength is used as an illumination light for the position detection. In such case, it is necessary to correct chromatic aberrations, and it is desirable to achieve this by use of a correcting optical system which is simple and compact in structure and which can be manufactured at a low cost.

It is accordingly a still further object of the present invention to provide a systematic arrangement and a projection exposure apparatus using the same, by which various aberrations of a projection optical system caused in relation to the "chromaticity" can be corrected with a simple and compact and low-cost structure, and whereby clear detection and, therefore, high-accuracy position detection are ensured.

To achieve this object, the present invention in one aspect thereof provides a position detecting device which uses a light of a wavelength, different from a photoprinting wavelength to be used for projecting a firs member upon a second member by use of a projection optical system, for the detection of the second member, wherein the device includes a detection optical system having an optical path and wherein a plurality of rear reflection type mirrors each having parallel surfaces are disposed in a portion of the optical path and are inclined with respect to each other and with respect to the optical axis of the detection optical system. With this arrangement, various optical aberrations related to the chromaticity can be corrected with a compact and low-cost structure.

Another problem is the deterioration of the alignment accuracy due to the change in the sensitivity of a detector which is used to photoelectrically detect a mark provided on a member such as a wafer, for its alignment purpose.

Accordingly, it is a yet another object of the present invention to provide a systematic arrangement and a projection exposure apparatus using the same, by which any change in the sensitivity of detector means can be detected with a simple structure.

According to one aspect of the invention, to achieve this object, there is provided an alignment system usable with a projection lens system for projecting a pattern of a first member upon a second member, wherein the second member is illuminated by use of a light projected thereupon from between the projection lens system and the second member and without use of the projection lens system, such that the second member is detected by use of the light illuminating the same, and wherein the system includes a detector for receiving an image of the second member and a standard light source emitting a light which is directed to the detector so as to allow monitoring of any change in the sensitivity of the detector. The change in the sensitivity of the detector, detected as a result of the monitoring, can be compensated for by controlling the intensity of the light supplied or to be supplied from the illumination optical system. Thus, in the present invention, the standard light from the standard light source is introduced to the detector and, on the basis of the output of the detector at this time, any change in the sensitivity of the detector is detectable.

A further problem is that, in order to assure high-accuracy alignment on the basis of photoelectric detectoon of a mark provided on a member such as a wafer, the mark should be illuminated with uniform illuminance. Accordingly, it is a further object of the present invention to provide a systematic arrangement and a projection exposure apparatus using the same, which assures with a simple structure the illumination of a mark of a member such as a wafer with uniform illumination.

According to an aspect of the present invention, to achieve this object, there is provided an illumination device, usable with a projection optical system for projecting a pattern of a first member upon a second member, for illuminating the second member, wherein the second member is illuminated by a light supplied from between the projection optical system and the second member and not by way of the projection optical system and wherein, for this purpose, a single-mode fiber is provided so as to introduce the light to the second member to irradiate the same. This arrangement allows observation of the second member which is illuminated at uniform illuminance.

The single-mode fiber may be provided with a gradient index type lens and an expander lens at opposite ends thereof. By doing so, the incident light can be efficiently collected and introduced into the fiber. Also, the light can be emitted from the fiber as a collimated light. As a consequence, the second member can be illuminated with a light of high intensity and uniform illuminance distribution. Further, the second member may be detected by way of the projection optical system and with the aid of the light supplied from the illumination optical system to irradiate the second member, and the position of the second member may be adjusted in accordance with the detection. This is effective to improve the detection accuracy. Moreover, the second member may be illuminated by use of plural illuminating lights. If, in such case, there occurs interference between these lights, the optical path length for such light that extends in a direction causing the interference may conveniently be changed so that these lights become mutually non-interfering.

Further, there is a problem that, when a mark provided on a member such as a wafer is illuminated and photoelectrically detected to obtain a positional signal to be used for the alignment of the mark and if there occurs interference of the light reflected from the mark, the positional signal detected has a distorted waveform which results in degradation of the accuracy of position detection.

In consideration of this, it is a still further object of the present invention to provide a systematic arrangement and a projection exposure apparatus using the same, by which the mark of the member can be detected without adverse effects of the interference of the reflected light.

According to an aspect of the invention, to achieve this object, there is provided a position detecting device usable with a projection optical system for projecting a pattern of a first member upon a second member, wherein the second member is illuminated by use of lights, in sequence, projected thereupon from between the projection optical system and the second member in a predetermined direction and without use of the projection optical system, and wherein the second member is detected by way of the projection optical system and with the aid of the illuminating lights emitted, in sequence, from that illumination optical system. On the basis of the result of detection, the position of the second member is adjusted. The manner of illumination and/or detection with the aid of sequentially supplied lights is called in this Specification as "chopping". By such chopping illumination, the second member can be observed and detected without being adversely affected by the interference of the reflected light. When the illumination lights are to be emitted from the illumination optical system, they may be projected in four directions along the axes of an X-Y co-ordinate system of the second member such that they are emitted sequentially at four different times. Alternatively, these four directions may be classified into two groups, such that in the groups the lights are emitted alternately.

For the alignment, where it is desired to align a first member such as a reticle with respect to a predetermined first reference, e.g. a reference mark fixedly provided on a stationary portion of the apparatus, and also to align a second member such as a wafer with respect to a second reference also fixedly provided on the stationary portion of the apparatus, it is possible that the first member becomes out of the alignment with the first reference. This is a problem because it results in degraded alignment accuracy.

In consideration of this, it is a still another object of the present invention to provide a systematic arrangement and a projection exposure apparatus using the same, wherein the position of the first member can be monitored continuously.

According to an aspect of the invention, to achieve this object, there is provided an alignment system, usable with a projection optical system for projecting a pattern of a first member upon a second member, for relatively aligning the second member with respect to the first member, wherein there are provided a first reference which is operable as a target or index for the alignment of the first member, a second reference which is operable as a target or index for the alignment of the second member and which is in a predetermined positional relation with the first reference, and means for continuously monitoring the position of the first member with respect to the first reference. On the basis of the result of monitoring, the first member may be moved so that it is constantly retained at a predetermined position. Alternatively, in place of moving the first member, the positional deviation of the first member may be compensated for by adjusting the position of the second member. Further, on the basis of the result of monitoring, both the first and second members may be moved to effect the alignment. In any case, according to this aspect of the invention, the position of the first member can always be assured.

As a further problem, in order to achieve alignment on the basis of photoelectric detection of a mark provided on a member such as a wafer, the hardware of the detecting system is liable to become complicated. In consideration of this, it is a yet further object of the present invention to provide a systematic arrangement and a projection exposure apparatus using the same, by which the positional deviation of the member can be detected with a simple structure.

According to an aspect of the invention, to achieve this object, there is provided a detecting device usable with a projection optical system for projecting a pattern of a first member upon a second member, wherein the second member is illuminated by a light supplied from between the projection optical system and the second member without use of the projection optical system and wherein, from an image of the second member formed with the aid of the illumination thereof by the light and with the aid of the projection optical system, imagewise data is obtained and, on the basis of the thus obtained data, the position of the second member is detected. Since the light illuminating the second member is introduced to the second member from between the projection optical system and the second member, the detection of the position of the second member is attainable by use of an image having no interference fringe. The illumination of the second member may be executed in the chopping manner wherein lights supplied sequentially from the illumination optical system are projected, in sequence, upon the second member in a predetermined direction or directions. If this is done, it is possible to obtain imagewise data in which the effect of interference is further reduced.

In a case where, for the alignment purpose, it is desired to align a first member such as a reticle with respect to a predetermined first reference, e.g. a reference mark fixedly provided on a stationary portion of the apparatus, and to align a second member such as a wafer with respect to a second reference also fixedly provided on the stationary portion of the apparatus, it is a requisition that the first member is aligned with the first reference very accurately. However, if, in such case, the mark detection is based upon the detection of reflected light, any variation in the gap between the mark provided on the reticle and the reference mark provided on the stationary portion of the apparatus directly results in a change in the optical path length of the signal light, which change causes interference. As a consequence, the waveform of the mark signal is distorted and, therefore, the alignment accuracy is deteriorated.

In consideration of this, it is yet another object of the present invention to provide a systematic arrangement and a projection exposure apparatus using the same, by which the first member can be aligned very accurately and with a stable signal output, without causing any interference. According to an aspect of the invention, to achieve this object, there is provided an alignment system usable with a projection optical system for projecting a pattern of a first member upon a second member, for relatively aligning the second member with respect to the first member, wherein a reference mark provided on a stationary portion of the apparatus and an alignment mark provided on the first member are illuminated in a transmitted illumination manner with an incoherent light advancing in a direction opposite to the direction of projection of a light to be used for the photoprinting. The light transmitted through the mark is received, whereby imagewise data concerning the mark is obtained. Then, the first member is moved in accordance with the relative positional deviation between the reference mark and the alignment mark, as detected by calculations made on the basis of the imagewise information, whereby the first member is brought into alignment. Since the light used for the transmitted illumination comprises an incoherent light, there occurs no interference. Further, the contrast is good because of the transmitted illumination. As for the mark illuminating light, g-line rays from a Hg lamp, which is often used for the photoprinting purpose, may be used while introducing the same by means of optical fibers or the like.

In the case of indirect alignment of the first and second members, such as described above, there is another problem. That is, in such indirect alignment, it is a requisition that the first member is aligned with the first reference very accurately. If, however, an image pickup system used therefor involves distortion or the like, the alignment accuracy is inevitably deteriorated. This results in the failure of high-accuracy alignment of the first and second members.

In consideration of this, it is accordingly a yet further object of the present invention to provide a systematic arrangement and a projection exposure apparatus using the same, wherein means is provided to correct any distortion of an image pickup system, to be used for aligning a mark provided on the apparatus side and a mark provided on a first member, thereby to assure high-accuracy alignment of the first member. According to an aspect of the invention, to achieve this object, there is provided an alignment system usable with a projection optical system for projecting a pattern of a first member upon a second member, for relatively aligning the second member with respect to the first member, wherein image pickup means is provided to observe, for the alignment of the first member, an image of an alignment mark provided on the first member and an image of a reference mark which is provided on the apparatus side and which is operable as an index for the alignment of the first member. A distortion measuring reference mark of a grid-like shape is provided. By use of the image pickup means, the distortion measuring reference mark is observed prior to the observation of the alignment mark of the first member and the reference mark provided on the apparatus side. Distortion correcting data is prepared from the actual positions of intersections of the grid-like distortion measuring reference mark and from the detected positions of the intersections of the grid, obtained as a result of the image pickup. Then, the reference mark of the apparatus side and the alignment mark of the first member are aligned with each other, while using the correction data. This is effective to correct any geometrical distortion of the input image, resulting from the distortion of the optical lens system, the graphic distortion of the image pickup device, a sampling error at the time of analog-to-device, digital conversion of video signals, and the like. Accordingly, the alignment is attainable with very high accuracy. The detection of the distortion measuring reference mark may be made at different positions within an observable range of the image pickup means. Where only a portion of the data that does not include any extraordinary value is used for the preparation of the correction data, it is possible to obtain more precise correction data.

A further problem is that, in order to ensure high-accuracy alignment of first and second members, it is necessary to obtain mark detection signals having an S/N ratio not less than a certain value. However, if the illuminance defined by the light irradiating the mark is not constant, it is difficult to obtain such mark detection signals.

In consideration of this, it is a further object of the present invention to provide a systematic arrangement for maintaining constant illuminance by the light illuminating the mark for its detection purpose, and to provide a projection exposure apparatus using such systematic arrangement. In accordance with an aspect of the invention, to achieve this object, there is provided an alignment system usable with a projection optical system for projecting a pattern of a first member upon a second member, for aligning the first member with the second member, wherein an illumination is provided to illuminate the second member and an image of the second member as illuminated is received by a detector for the alignment purpose. Prior to the detection of the image of the second member, an additional member which is operable as a standard is placed at a predetermined position and is illuminated by the illumination optical system. An image of the standard member as illuminated is detected by the same detector, whereby a signal is produced therefrom. The thus produced signal is compared with a reference value having been preparatoril stored, and, in accordance with the result of comparison, the quantity of light supplied from or to be supplied from the illumination optical system as adjusted. By this, the illuminance can be maintained constant.

The adjustment of the illuminance may be made by a polarizing plate or a neutral density (ND) filter. Also, prior to detection of the signal by use of the standard member, the correction of the sensitivity of the detector may be effected. If this is done, the illuminance can be controlled more precisely. Further, where the system is arranged so that the second member is illuminated by use of a light projected thereupon from between the projection optical system and the second member without use of the projection optical system and that the image of the second member as illuminated is detected by way of the projection optical system, then the interference of the reflected light is sufficiently suppressed, with the result that the alignment accuracy is improved significantly.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B are schematic views each explicating the direction of light projection in a case where a mark formed by dots (square dots) is used.

FIG. 5 is a schematic view showing images of the dot-like mark as actually observable in the plane of the image surface, when the mark is illuminated in the manners shown in FIG. 4.

FIGS. 23–25 are schematic views, respectively, showing examples of chromatic-aberration correcting optical system.

FIG. 37 is a schematic and diagrammatic view showing a control system of the appratus shown in FIG. 17.

FIG. 53 is a flow chart, showing the manner of image processing.

FIGS. 64A and 64B are principle views, respectively, for explicating the manner of changing the viewfield for the preparation of the correction map.

FIG. 65 is a schematic and diagrammatic view showing a reticle monitoring system.

DESCRIPTION OF THE PREFERRED EMBODIMENTS

Figure 1:
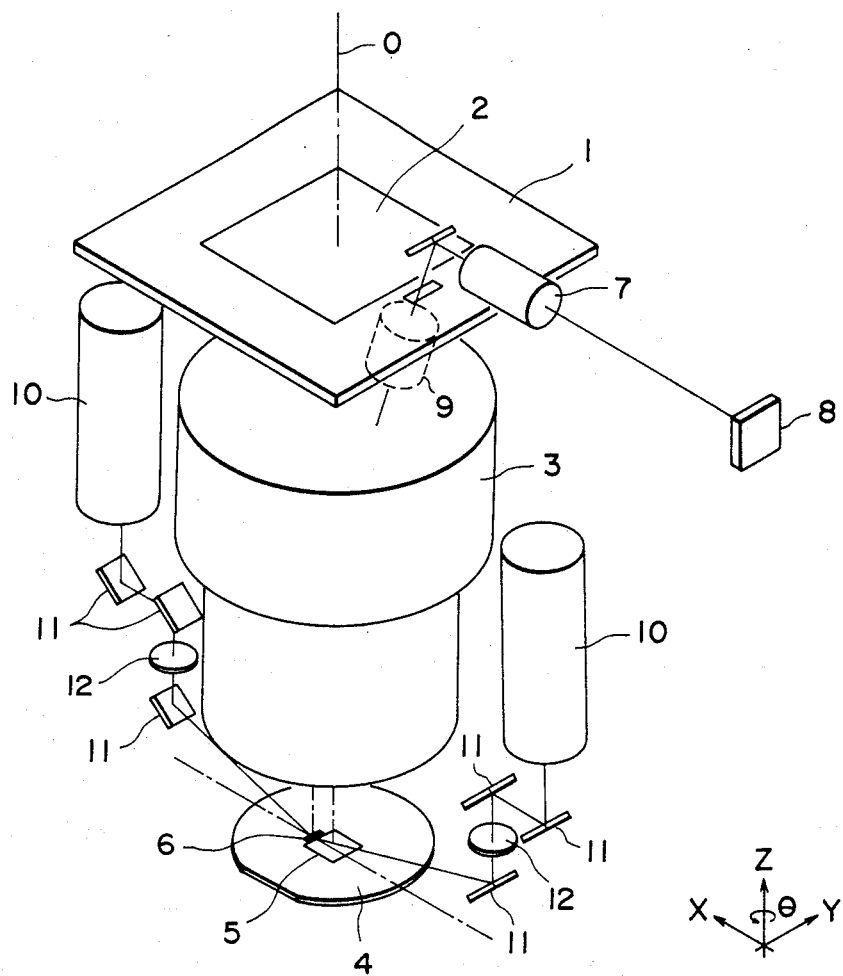
FIG. 1 is a perspective view schematically showing a major portion of a projection exposure apparatus according to one embodiment of the present invention.

An embodiment of the present invention is illustrated in FIG. 1. In the FIG. 1 embodiment, the invention is applied to a reduction projection type exposure apparatus, called "stepper".

In the apparatus of FIG. 1, a reduction projection lens system 3 has the function of optically projecting a pattern 2, formed on a reticle 1, upon a wafer 4 in a reduced scale. Usually, the projection lens system 3 is telecentric on the wafer 4 side so as to avoid undesirable changes in the magnification, resulting from the surface irregularity of the wafer which is the subject or a workpiece to which the reticle pattern is to be photoprinted, and/or from the shift of focus due to a measuring error or a driving error of an automatic focusing system which is usually provided between the projection lens system 3 and the wafer 4. It will be understood in the illustration of FIG. 1 that the location on the wafer 4, which corresponds to the pattern 2 of the reticle 1, is occupied by a wafer portion (shot area) denoted at 5.

In each of the preferred embodiments of the present invention which will be described later in detail, one of the most significant features lies in the provision of an illumination system which is disposed generally below the projection lens system 3. In the state shown in FIG. 1, an alignment mark 6 which is associated with the shot area 5 of the wafer 4 (which is the current shot area that is just going to be subjected to the photoprinting), is illuminated by lights projected inclinedly thereupon from an illumination system provided, in this embodiment, between the wafer 4 and the projection lens system 3.

Figure 2:
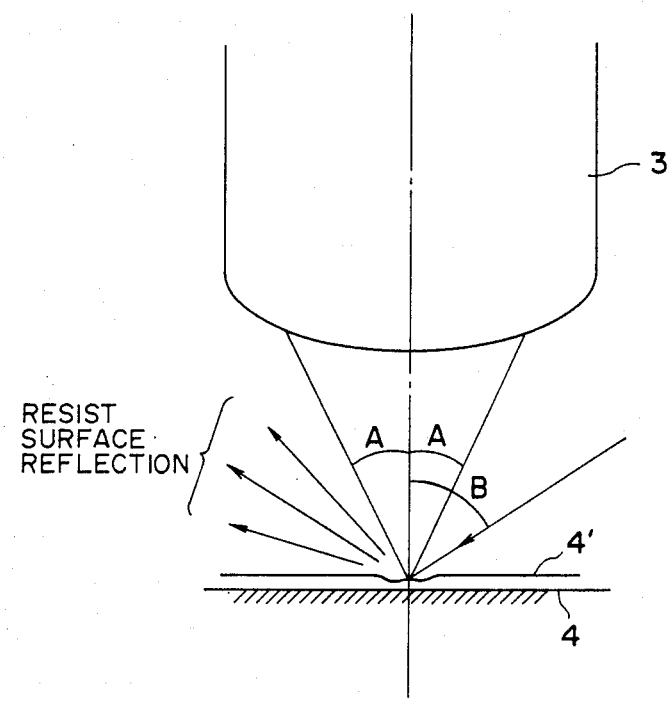
FIG. 2 is a schematic view explicating a light illuminating a wafer and reflection components from the surface of a resist on the wafer.

As has been described hereinbefore, the most important factor in generating an error in the detection of alignment signals is the interference between the light reflected by the surface of the resist layer and the light reflected from the wafer substrate. While the effect of such interference may be removed in some ways, the most fundamental solution is to extinguish one of them. The results of observation of the state of existence of the resist coating on the wafer surface by use of a scan type electron microscope (SEM) or an interference microscope have showed that, even for a wafer having a very large surface step (recess/protrusion), the angle of inclination of the surface of the resist material covering such surface step is, at the maximum, of an order of 5 degrees or more or less, and that there is little possibility of existence of a more steep slope. From the viewpoint of step coverage, usually a wafer having a large surface step is coated with a resist layer of a thickness greater than the size (depth or height) of the step (recess/protrusion). For this reason, the surface inclination is held approximately at an order of 5 degrees or more or less. In consideration of this, where it is desired to illuminate the wafer 4 by use of light projected and inclined to the wafer, as in the case of FIG. 1 embodiment, it is most preferable to satisfy the following condition:

$$A + 10° \leq B \quad (1)$$

wherein A is the maximum detection angle which the detection optical system makes with respect to the detection of the wafer, as illustrated in FIG. 2, and B is the angle of incidence of the illumination light upon the wafer.

Figure 3:
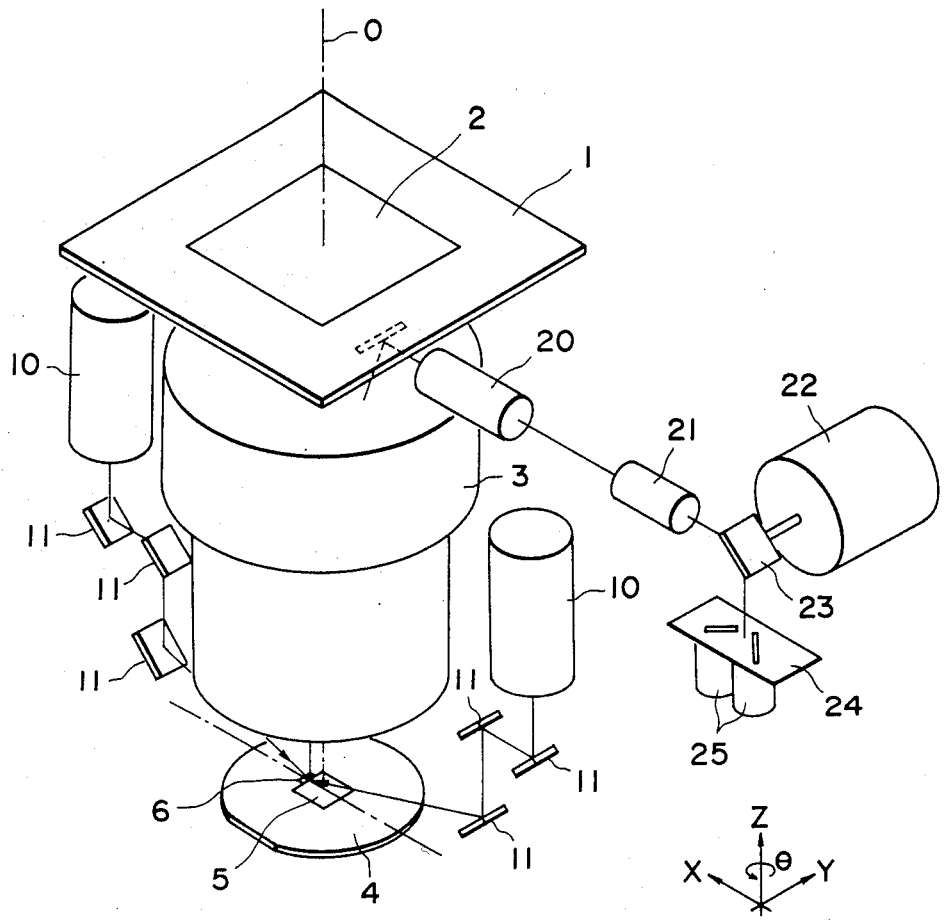
FIG. 3 is a perspective view schematically showing an example wherein an alignment scope optical system is disposed between a reticle and a projection lens system.

When the condition (1) is satisfied, the components of the wafer illuminating light as reflected by the surface of the resist layer 4' do not enter into the detection optical system but extend outward of the detection optical system, as is seen in FIG. 2. Thus, only the components of the light as reflected from the wafer substrate can be received by the detection optical system. In the FIG. 1 embodiment, the term "detection optical system" is used to refer to the whole optical arrangement including the projection lens system 3, an alignment scope optical system 7, photoelectric converting means 8 such as a CCD (charge coupled device) image sensor and some other elements provided therebetween, all of which are necessary to detect the wafer. Where the light used for the detection has a wavelength different from the photoprinting wavelength, a correcting optical system 9 may be inserted so as to allow simultaneous observation of the reticle 1 and the wafer 4. Alternatively, the alignment scope optical system 7 may be disposed between the reticle 1 and the projection lens system 3, such as in the case of FIG. 3, provided that detection of only the wafer 4 is desired. In the case of FIG. 3, the reticle 1 is arranged to be aligned independently by means of a separate alignment scope system, with the calibration of reference being executed so as to bring, into a predetermined relation, a reference provided for the wafer alignment and a separate reference provided for the reticle alignment.

The maximum angle A which the detection optical system possesses with respect to the wafer 4 agrees with a value determined by the numerical aperture (NA) of the projection lens system 3, unless a special stop member is inserted at the alignment scope side so as to restrict the numerical aperture of the projection lens system 3. Namely, if NA=0.35, then $A = -\sin^{-1} 0.35 = 20.49°$. Therefore, the angle B of incidence to be defined by the illumination system has to be not less than 20.49°. If a stop member is provided on the alignment scope side so that the numerical aperture of the projection lens system is restricted, the value A becomes less than the value determined by NA. In conventional TTL alignment systems employed in the steppers, the mark illuminating light is introduced by way of the alignment scope and from the above. According to the present embodiment, as compared therewith, the wafer 4 is illuminatd by use of light supplied from outside of the projection lens system 3. Additionally, a specific limitation "10" is set. With this arrangement, the light reflected from the surface of the resist layer can be excluded. The capability of separately extracting the light scatteringly or diffractively reflected from the wafer substrate, having a resist surface coating 4′, directly leads to enhanced alignment accuracy. Where it is desired to detect the scatter or diffracted reflected light from the wafer substrate, as in the present embodiment, it is advantageous to use P-polarized light as the wafer illuminating light in order to reduce the loss of light by the reflection at the resist surface. The P-polarized light causes less reflection at the resist surface, as compared with S-polarized light. Therefore, a larger quantity of light can reach the wafer substrate. Further, the angle of incidence may be so set as to satisfy the Brewster angle. This is preferable because the surface reflection becomes minimum. Moreover, it is of course possible to determine other factors of degree of freedom (i.e. variance), such as the configuration of the mark, so as to comply with this condition.

The FIG. 1 embodiment includes lasers 10. The laser beam emitted from each laser 10 is directed by mirrors 11 and a lens 12 to the wafer 4, so as to irradiate the alignment mark 6 formed thereon. One important features of the illumination system of the FIG. 1 embodiment is that each light is projected upon the wafer 4 in a predetermined direction corresponding to the direction of the pattern (mark) which is predetermined or predetected. More specifically, it is desirable to direct each wafer illuminating light in the manner that it is incident on the wafer along a direction which is orthogonal to the edge of the mark, to be detected, as viewed in the direction of the Z-axis (optical axis O).

FIGS. 4A and 4B each shows the manner of projection of illuminating lights where a mark comprising dots (square dots) is used. In the illustrated cases, the position of a center C in the widthwise direction of the mark will be detected in the form of an alignment signal. In the example illustrated in FIG. 4A, the mark illuminating lights are incident upon the mark in such directions that cause edges P and P′ of the mark to "lighten".

These edges P and P′ of the mark extend in the widthwise direction of the grating, and the directions of incidence of the illuminating lights are denoted at D and D′. In this case, an image such as illustrated in the part (A) of FIG. 5 can be actually observed in the plane of the image surface. This image is received by the CCD image sensor 8 or, alternatively, is scanned by use of a slit-like aperture, whereby the position of the center C can be detected. The manner of "lightening" of the edge P (P′) depends on the direction D (D′) of incidence. However, it is to be noted that the illuminating light projected in the direction D does not always cause the edge P to lighten. According to the depth/height of the surface recess/protrusion of the wafer and/or the state of existence of the resist layer 4′, it is possible that the illuminating light D causes the edge P′ to lighten intensely, as compared with the edge P. Projecting two illuminating lights in the two directions D and D′ is effective to reduce the asymmetry of the edges P and P′. However, it is seen from the part (A) of FIG. 5 that the symmetry of the edges is not particularly necessary upon the detection of the center C. Therefore, it is not always necessary to arrange the system so that the illuminating lights are projected in two symmetrical directions. One of them may be omitted. When both are used, they may be incident asymmetrically. That is, the two illuminating lights may be incident upon the mark with different angles. In this case, $\alpha \neq \alpha'$. The center C is still detectable sufficiently accurately.

In the example illustrated in FIG. 4B, the illuminating lights are directed in a plane perpendicular to the lengthwise direction of the mark, as compared with the case of FIG. 4A. In the FIG. 4B case, an image such as schematically shown in the part (B) of FIG. 5 can be observed. That is, edges Q and Q′ of the mark extending in the lengthwise direction are caused to lighten, as compared with the FIG. 4A case. Whether the widthwise edges (FIG. 4A) or the lengthwise edges (FIG. 4B) showed are caused to lighten, depends on the type of mark signal processing to be adopted. Also, while the description has been provided of the manner of illumination of a mark comprising square dots, this is because such mark has two directionalities. The mark is not limited to the illustrated example.

By adopting the manner of illumination described hereinbefore, a bright image having a good S/N ratio can be observed without the adverse effects of surface reflection. Also this is attainable by use of a monochromatic light. The mark region 6 of the wafer 4, as illuminated, is once imaged upon the reticle 1 by means of the projection lens system 3 and the correcting optical system 9. From the reticle 1, the light having been imaged is directed to the alignment scope unit 7 and to the CCD image sensor 9, so that it is imaged again on the image sensor 8. As for the manner of transition to the exposure operation after the detection of the state of alignment, the system may be arranged in a known manner to execute suitable operations. For example, the wafer may be moved to the exposure position by a preset distance. As another example, the correcting optical system 9 may be retracted out of the path for the photoprinting light.

FIG. 3 shows a modification of the FIG. 1 arrangement, and shows an example in which the wafer signal is picked up from between the reticle 1 and the projection lens system 3. In this case, the reticle 1 is aligned independently by use of a reticle alignment optical system, not shown. For the illumination, the lasers 10 are used similarly. In this case, however, the directionality of the laser beam is utilized. That is, the laser beams are directly projected upon the wafer alignment mark 6. The wafer signal is introduced, by way of the projection lens system 3, to a wafer detecting optical system comprising an element 20 and the elements following it. The wafer detecting optical system includes an objective lens 20, an erector lens 21 and a rotatable galvano mirror 23 disposed behind the erector 21. With the aid of this galvano mirror 23, the image of the alignment mark 6 is scanned on the surface of a slit member 24 which is disposed in the image plane. The light passing through the slit member 24 is received by a photomultiplier 25, whereby alignment signals are detected. Where the wavelength of the light, illuminating the mark 6 in the dark-field illumination manner, is different from the wavelength to be used for the photoprinting, a correcting optical system similar to the correcting optical system 9 shown in FIG. 1 may be disposed in front of the objective lens 20 or between the elements of the wafer detecting optical system.

Figure 6:
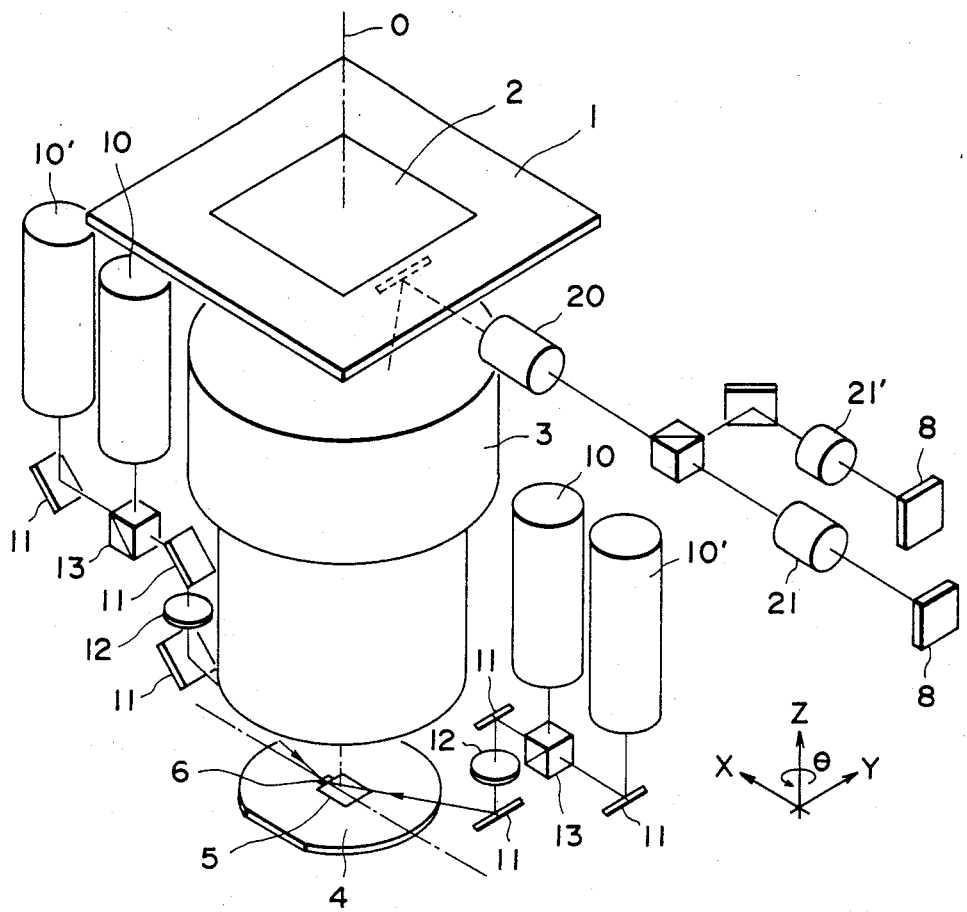
FIG. 6 is similar to FIG. 3, but shows an example in which two kinds of laser beams having different wavelengths are used.

FIG. 6 shows a modification of the FIG. 3 arrangement. In the FIG. 6 case, additional lasers 10' which produce laser beams of the same wavelength, but different from the wavelength of the laser beams from the lasers 10, are used. He-Ne laser (producing 633 +nm wavelength) may be used as each laser 10, while Ar ion laser (515 nm wavelength) or Green He-Ne laser (543 nm wavelength) may be used as each laser 10'. The addition of the lasers 10' is because of the possibility that, depending on the structure of the surface step (recess or protrusion) of the wafer mark, the irradiation of the mark only by use of the He-Ne laser beam causes a very low intensity of scattered light. The condition which causes such decrease in the intensity has an intimate relation with the wavelength. Accordingly, if the mark is irradiated with laser beams of different wavelengths, the output characteristics corresponding respectively to such laser beams become mutually complementary and, therefore, stable measurement is made attainble. In such case, it is preferable to provide separate wafer detection optical systems in consideration of the difference in chromatic aberrations of the projection lens system 3 to be caused in relation to the different wavelengths. A beam splitter 13 is provided to combine the laser beams of different wavelengths. The beam splitter 13 preferably comprises a dichroic film for an enhanced efficiency.

In accordance with the above-described concept of the present invention, the wafer is illuminated in a specific manner that prevents the light, reflected by the resist surface, from entering into the wafer detecting optical system. Such a concept of the present invention is clearly illustrated in FIGS. 1, 3 and 6.

Figure 16:
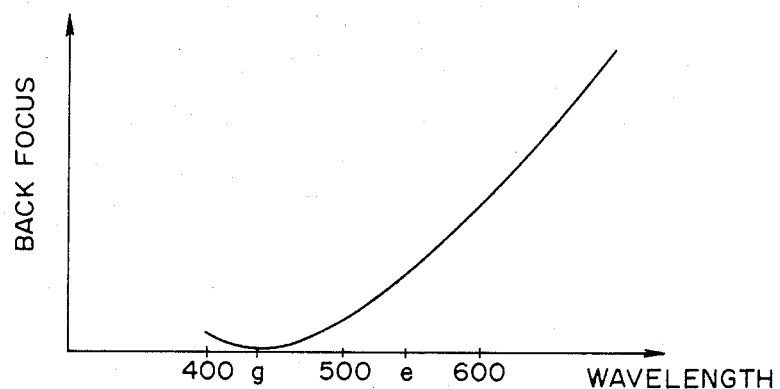
FIG. 16 is a graph showing the relation between the wavelength and the focus.

One of the most important problems to be considered in relation to the dark-field technique is the quantity of light. In this connection, the present invention uses the combination of laser dark-field illumination with a projection lens system. This is because of the chromatic aberrations of the projection lens system which are caused when a wavelength different from the photoprinting wavelength is used for the detection. Usually, the projection lens system is designed so as to show the highest optical performance with respect to the photoprinting wavelength while, on the other hand, it is not designed while paying specific attention to the other wavelengths. For example, a lens system for use with g-line ray (436 nm) is usually designed while paying attention even to the spectral width of the g-line ray, and such a lens system shows wavelength vs. focus characteristics as illustrated in FIG. 16 wherein the curve contacts the axis at the wavelength of the g-line ray. From FIG. 16, it is seen that when a wavelength different from the photoprinting wavelength is used, the focus is shifted by a remarkably large amount. For example, e-line rays (546 nm) can be used as the light for the dark-field illumination. When, in such case, consideration is made of the bottom of the spectral width of the e-line ray, it is seen that there occurs a focus shift of an order of 10 microns. Such chromatic aberration can not at all be corrected within the alignment optical system illustrated in FIG. 1. As a solution, a narrow-band type band-pass filter may be used. In such case, however, the quantity of light decreases by an amount that can not be disregarded. If, to the contrary, the spectral band is not narrowed, there occurs the problem of deterioration of the contrast due to the focus shift in the range of the spectral band. Use of a laser beam for the dark-field illumination, as in the present embodiment, is effective because the laser beam has only a very narrow spectral width of an order that can be disregarded, such that there is substantially no restriction upon the projection lens system side. While there occur various aberrations in relation to the "chromaticity", in addition to the focus shift, such aberrations can be corrected by utilizing the monochromaticity of the laser beam. Actually, in the FIG. 1 embodiment, this is practiced by the optical means denoted at 9. Details of the correction of chromatic aberrations are described in U.S. patent application which was filed while claiming the convention priority based upon Japanese Patent Application No. 125102/1986 filed, in Japan, May 30, 1986.

Figure 7:
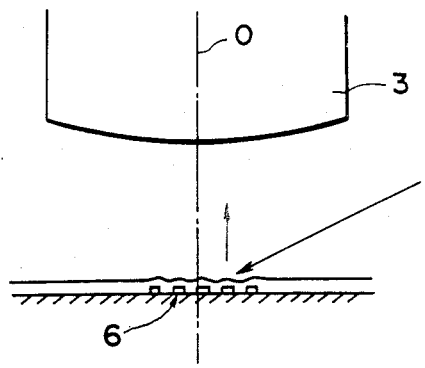
FIG. 7 is a schematic view showing wafer illumination light and light scattered or diffracted by a mark.

Use of a laser is very advantageous with respect to the quantity of point of light, because the light source itself has a high luminance. Also, as a solution for a problem of extinction of a signal, resulting from the interference due to the monochromaticity, plural laser beams can be superimposed to observe the mark with plural wavelengths, as in the FIG. 6 case. As for the angle of incidence, where the mark 6 has a certain pitch as in the FIG. 4A or 4B case and when it is irradiated with the illuminating lights in the directions as illustrated in of FIG. 4A, the angle of incidence may preferably be selected so that the light of the n-th order diffraction caused as a result of illumination emerges in a direction parallel to the optical axis of the projection lens system 3. Since the mark having such a pitch can be considered as a grating, the diffraction theory of the grating which is well known in the art is applicable. Usually, in such condition that satisfies the equation (1), the detection system often detects the light of high-order diffraction, such as the third-order diffraction light or the fourth-order difraction light. Since higher-order diffraction provides is a less intense light, it is preferable, if the direction of diffraction is predictable, to conduct the illumination so that light of n-th order diffraction advances in parallel to the optical axis O of the projection lens system 3, such as illustrated in FIG. 7. This is related to the telecentric arrangement, on the wafer side, of the projection lens system 3 which is adopted so as to prevent a variation of the magnification due to the surface irregularity of the wafer 4 or due to the effect of precision of the automatic focusing. Namely, in each of the examples shown in FIGS. 1, 3 and 6, the position as observed by the detection optical system is out of the optical axis of the projection lens system 3. However, because of the telecentric arrangement, the chief ray concerning such observation point and lying on the wafer 4 side is still parallel to the optical axis O, i.e. perpendicular to the wafer 4 surface.

For ordinary silicone wafers, such simple-manner illumination allows one to obtain signals of a sufficiently high S/N ratio. If, however, it is desired to improve the S/N ratio or the detection rate, the illumination may be conducted in the manner illustrated in FIGS. 8A and 8B.

Figure 8A:
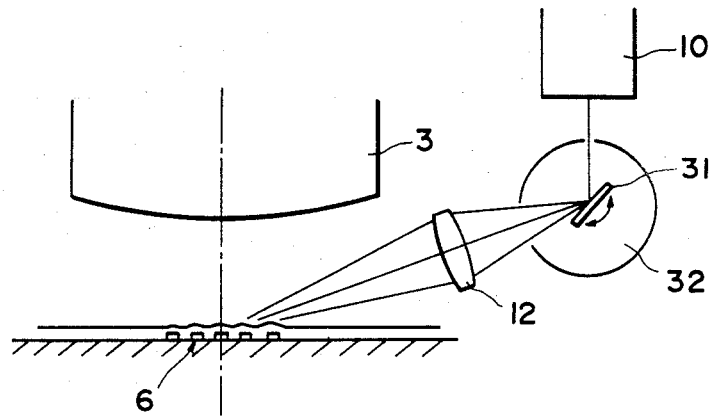
FIGS. 8A and 8B are schematic views, respectively, showing examples in which a wafer alignment mark is irradiated with light having been oscillated.
Figure 8B:
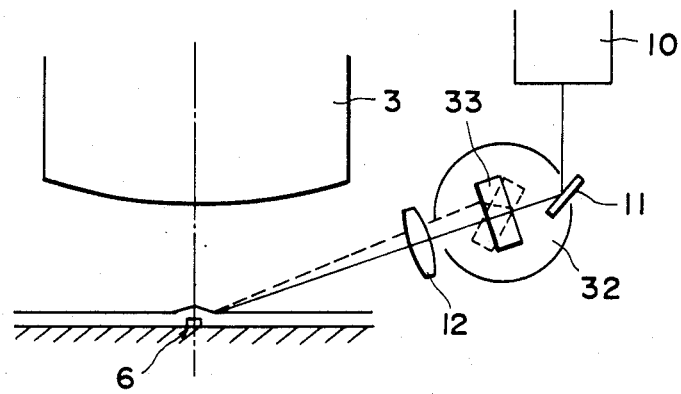

FIG. 8A shows an example wherein the laser beam from the laser 10 is oscillated by means of a galvano mirror 31, and the wafer alignment mark 6 is irradiated with the oscillated laser beam. In this example, the reflection point on the oscillatingly moving mirror 31 is at a position which is optically conjugate with the alignment mark 6, and the angle of incidence of the light upon the mark 6 changes with the movement of the mirror 31. The change in the angle of incidence changes the scattering or diffracting condition. As a result, the signal output changes. Particularly when the surface-height difference at the edge of the mark is congruent with the wavelength of the laser beam so that the mark signal is easily extingished, the effect of changing the angle of incidence becomes quite advantageous. The changing of the angle of incidence is attainable not only by the reflection type as in the FIG. 8A example but also by the transmission type such as illustrated in FIG. 8B. Further, various modifications are possible. Where the angle of incidence is changed with time, it is necessary to provide synchronism with the detection system. For example, in the case of FIG. 1, the mark is detected by use of the CCD image sensor 8. In such case, it is necessary to synchronize the change of angle of incidence with the read-out timing of the CCD image sensor 8. Alternatively, the angle of incidence may be changed very quickly as compared with the readout so as to avoid the adverse effects of the change. As a further alternative, the changing of the angle of incidence is controlled so that it ceases to define a fixed angle of incidence which is most suitable in the point of signal output.

Figure 9A:
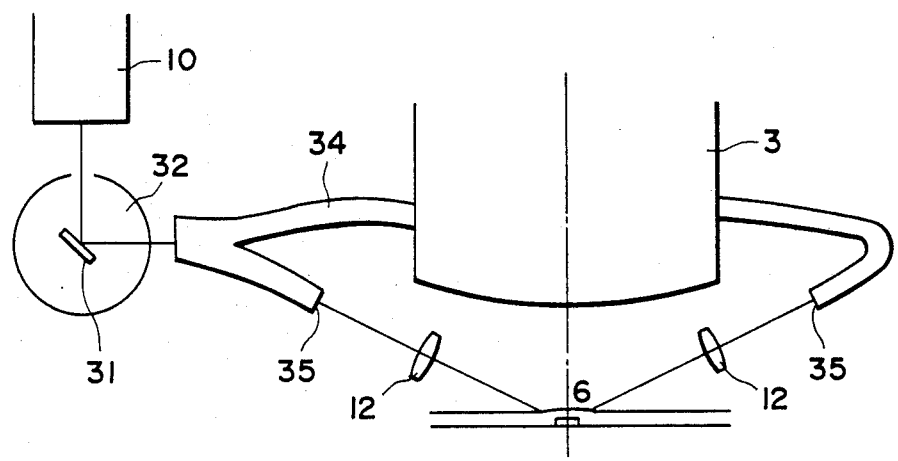
FIGS. 9A and 9B are schematic views, respectively, showing examples in which optical fibers are used for the illumination.
Figure 9B:
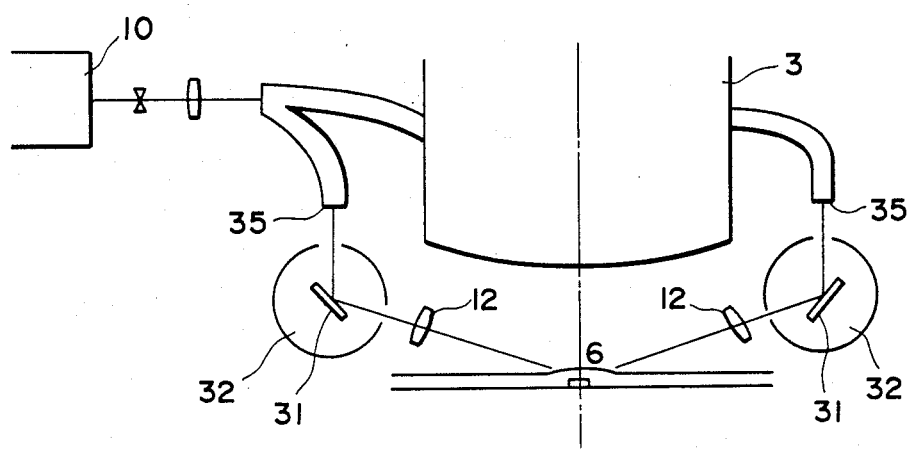

FIGS. 9A and 9B show examples in each of which optical fiber means is used for the illumination. Because of the limited space between the projection lens system 3 and the wafer 4, it is not easy in some cases to introduce the laser beam to the wafer 4. The FIG. 9A example is one solution. In this example, light-emitting ends 35 of fiber bundles 34 are operable as secondary light sources to conduct the Kohler illumination. Depending on the distance, lenses 12 may be omitted. When an optical fiber bundle such as at 34 in the FIG. 9A example is used, there may occur on the wafer surface the speckle interference of the laser beam. To avoid speckle effects, in the present example, the laser beam which is going to enter into the fiber bundle 34 is oscillated by means of a galvano mirror 31 and a motor 32 so that it is integrated with time. Thus, the speckle on the wafer surface is prevented as a result of the integration. While the galvano mirror 31 may be replaced by a rotatable polygonal mirror or a suitable acoustooptic element, a similar relation with the detection system is necessary as in the cases of FIGS. 8A and 8B.

FIG. 9B is an example of critical illumination. In this case, the light-emitting ends 35 of the fiber bundles are operable as secondary light sources which are imaged upon the wafer mark 6 by means of respective lenses 12. In such case, there is a possibility that the non-uniformity of the illumination due to the core portion of the fiber is combined with the speckle effect. To avoid this, in the FIG. 9B example, galvano mirrors 31 are disposed in respective optical paths to scanningly deflect the laser beams, to thereby remove the unevenness of illumination. Also, a similar synchronous relation with the detection system is necessary.

Figures 10A, 10B:
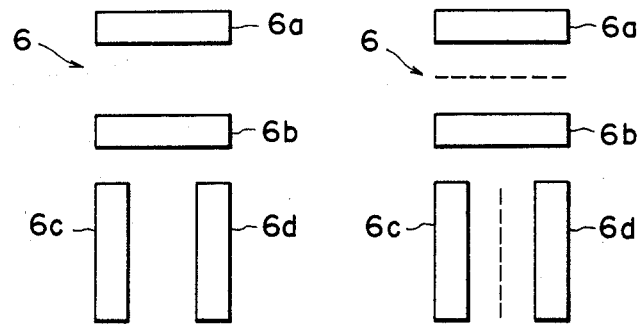
FIGS. 10A and 10B are schematic views, respectively, showing an example of alignment mark.

In the foregoing, description has been provided of the fundamental features of some preferred forms, chiefly in conjunction with two-dimensional sections of FIGS. 7–9B. Actually, however, further consideration should be provided for be made to the illumination system which should be provided on the apparatus side, in correlation with the alignment mark. In the FIG. 9A or 9B case, for example, the wafer alignment mark 6 is formed as a pattern extending in a direction perpendicular to the sheet of the drawing. While the edges of the mark 6 extending in this direction are detectable satisfactorily, if to the contrary, the mark 6 has additional edges extending perpendicularly to the first-mentioned edges, such additional edges can not be detected by the same detection system (see FIGS. 4 and 5). For example, it is now assumed that the mark 6 is formed by four oblong mark elements $6a$–$6d$ as illustrated in FIG. 10A. When the wafer mark elements $6a$–$6d$, as being projected upon the reticle exactly sandwich, therebetween, the reticle alignment mark comprising linear patterns depicted by broken lines in FIG. 10B is aligned, and the alignment is accomplished.

Figures 11A, 11B:
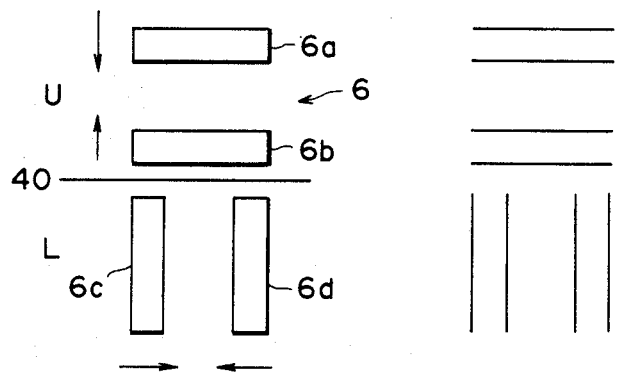
FIGS. 11A and 11B are schematic views, respectively, for explicating the direction of projection of the illumination light upon the alignment mark shown in FIG. 10.

From the viewpoint of function, the wafer alignment mark shown in FIG. 10A can be separated by a line 40 (FIG. 11A) into two regions U and L. When lights are projected upon the mark elements of these regions in the directions denoted by arrows in FIG. 11A as viewed from the above, the longitudinal edges of the mark elements $6a$–$6d$ are caused to lighten such as schematically illustrated in FIG. 11B. At this time, it may be possible to irradiate the mark with the lights, simultaneously, projected in the four directions. If, however, the wafer 4 surface is rough, the irradiation of the region L with lights advancing in the vertical directions, as viewed in FIG. 11A, which lights are in fact necessary for the irradiation of the region U, will cause background noise, resulting in deterioration of the S/N ratio. This is also with the case of the irradiation of the region U with lights advancing in the horizontal directions as viewed in FIG. 11A.

Figure 12:
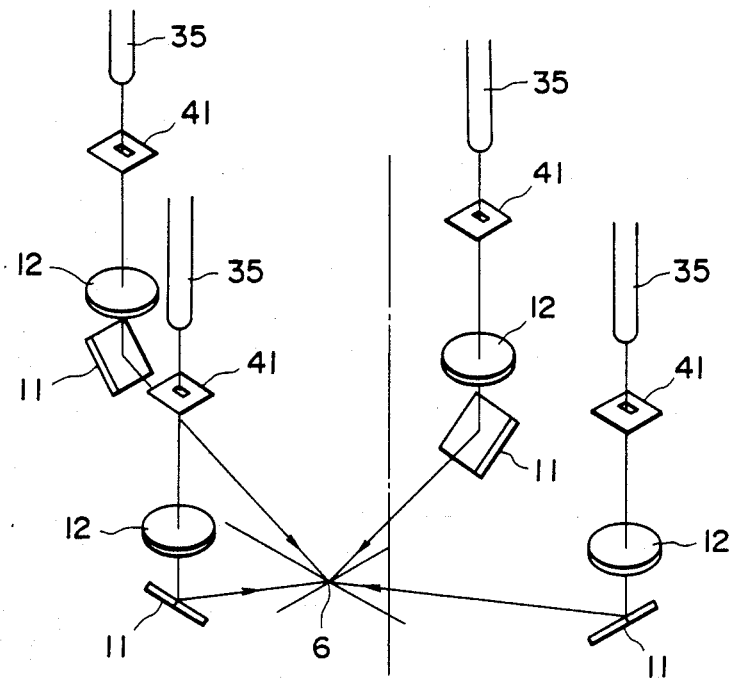
FIG. 12 is a schematic view showing an example of illumination system having irradiation area restricting slit means.
Figure 13:
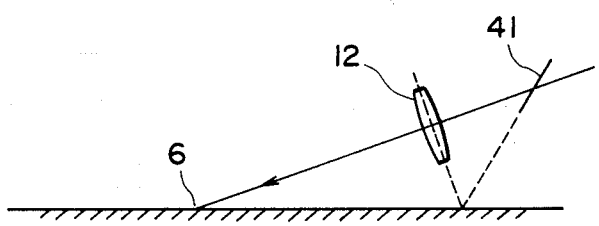
FIG. 13 is a schematic view showing an example having slit means inclined with respect to an optical axis so as to satisfy the condition of tilting.

In consideration of this, in the example shown in FIG. 12, the illumination system is provided with field stops each of which is effective to restrict the range of illumination so that only a desired region of the mark 6 is illuminated. Reference numerals 41—41 in FIG. 12 denote illumination range restricting slit members used for this purpose. There are provided imaging lenses 12—12 in association with the slit members, respectively. Each imaging lens 12 is operable to provide, upon the wafer mark, an image of a slit aperture of corresponding one of the slit members 41—41, whereby the range of illumination on the wafer is restricted. The FIG. 12 example uses optical fiber means of the type shown in FIG. 9A. In order more sharply to define the illumination range, each slit member 41 may preferably be inclined with respect to the corresponding optical axis so as to satisfy the condition of "tilting", as schematically illustrated in FIG. 13.

Figures 14A, 14B:
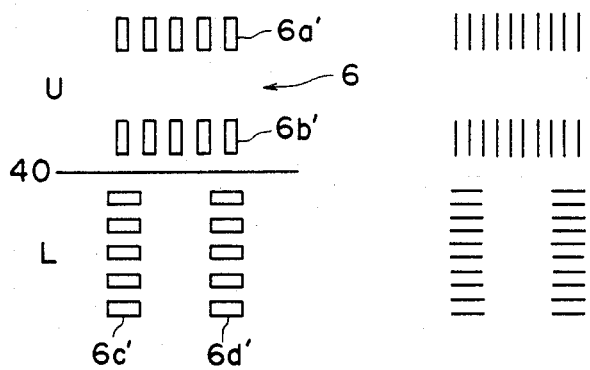
FIGS. 14A and 14B are schematic views, respectively, showing an example of alignment mark which is suitable to be illuminated with light projected thereupon in a direction perpendicular to the projecting direction shown in FIG. 11A.

FIG. 14A shows another example of wafer alignment mark having mark elements $6a'$–$6d'$. It will be readily understood that the mark of this example is suitably usable with the illuminating lights which are to be projected upon the regions U and L in the directions, perpendicular to those illustrated in FIG. 11A, respectively. Also, it will be readily understood that the edges of the mark elements can be detected, as illustrated in FIG. 14B.

Each slit member 41 provided in the illumination system has another advantageous effect. One of the important aims of the present embodiment lies in the exclusion of the light reflected by the resist surface. Accordingly, either the photoprinting wavelength (resist-sensitizing wavelength) or the nonphotoprinting wavelength is usable as the wafer detecting light. If, however, the light of the photoprinting wavelength is used to illuminate the wafer mark without use of the slit member 41, a portion of the resist material covering the circuit pattern in the neighborhood of the wafer alignment mark is sensitized by the light incident thereupon. Accordingly, when it is desired to use the light of the resist-sensitizing wavelength, it is desirable to use the field stop, i.e., the slit member 41, in the illumination system so as to allow irradiation of only a desired portion of the alignment mark.

While the field-restricting slit means 41 is used in the FIG. 12 example to improve the S/N ratio, similar effects are attainble simply by changing the direction of light irradiation. For example, when the scanning system of the type shown in FIG. 3 is used, suitable switching means such as an acoustooptic element may be provided at the light-receiving ends of the four fibers so as to sequentially open/close the entrances of the fibers in synchronism with the scan.

While, in the foregoing, a description has been provided of various possible forms to be adopted between the projection lens system 3 and the wafer 4, it is to be noted that in any of these cases the angle of incidence satisfies the equation (1). Thus, in the point of exclusion of the surface reflection light from the resist, correct wafer signals can be detected with the result that the alignment accuracy can be improved remarkably.

With regard to the detection system, it is sufficient to finally connect the same with an ordinary microscope system, unless the wafer surface is extraordinarily rough or the height of the surface step formed on the wafer is enormousy high, although there is a possibility of insertion of any correction optical system. For the rough surface, however, it is difficult to extract only the edge signal out of the light having been scattered in various directions by the rough surface. Also, for the large surface step, bending or diffraction of light due to the multiple reflection can not be disregarded.

Figures 15A, 15B, 15C:
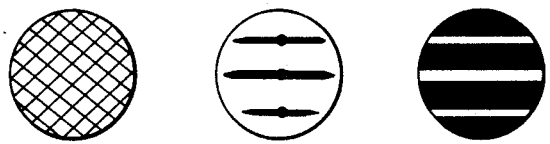
FIGS. 15A–15C are schematic views, respectively, illustrating examples of distribution of light quantity at the position of a pupil of an objective lens of a detection system.

In this connection, reference will now be made to FIGS. 15A and 15B, wherein examples of light-quantity distribution as can be observed at the position of the pupil of the objective lens, included in the detection system, are illustrated. FIG. 15A corresponds to a case where the wafer surface is rough, and it is seen that the reflected light is uniformly spreaded in the pupil plane. On the other hand, FIG. 15B shows the distribution of diffracted light from an alignment mark, comprising a dot pattern such as shown in FIG. 4A, when the mark is illuminated in the manner also shown in FIG. 4A. It is seen that higher-order diffration lights, three lights in this case, are incident upon the pupil plane. Accordingly, when a spatial filter such as illustrated in FIG. 15C is used with the objective lens, the S/N ratio can be improved and a desired pattern signal can be extracted.

In FIG. 15C, the shaded portion corresponds to light-intercepting portion, while the bright portion corresponds to the light-transmitting portion. As for the spatial filter, various configurations are usable in accordance with the configuration of the mark used. Use of a spatial filter corresponding to the alignment mark has an additional advantage of reducing the effect of multiple reflection.

It will be readily understood that the abovedescribed technique is very effective for the purpose of detecting, with high accuracy, the information concerning a wafer having a resist surface layer, and therefore is very effective for the automatic alignment purpose, an automatic focusing purpose, etc.

In an arrangement, such as shown in FIG. 3 or 6, in which a mirror is disposed between the reticle and the projection lens system so as to pick up the light from the wafer before it reaches the reticle, it is not possible to detect, for the reticle-to-wafer alignment, the reticle alignment mark and the wafer alignment mark at the same time and by use of one and the same detection system. Accordingly, the manner of providing a reference for the reticle-to-wafer alignment (e.g. the reticle alignment mark in the case of FIG. 1) is important. Particularly, in the foregoing embodiments wherein the wafer is illuminated in the dark-field illumination manner by use of light projected from between the projection lens system and the wafer, how to illuminate and detect the provided reference is very important.

Where it is desired to detect the wafer mark by receiving light from between the projection lens system and the reticle, it may be possible to use, as the reference, the detector itself such as, for example, the picture plane of the CCD image sensor. Practically, however, a variety of optical elements must be disposed in front of the detector because of the size of the picture plane of the detector or on the ground of the necessity of a magnification adjusting optical system for enhanced accuracy, a pupil filter for an improved S/N ratio for the mark detection, and for other reasons. Therefore, the stability is more or less damaged, which can not be disregarded at the time of measurement of the relative position of the wafer and the reference.

Features of the present invention, which effectively solve these problems, will now be described with respect to an embodiment of the present invention.

Figure 17:
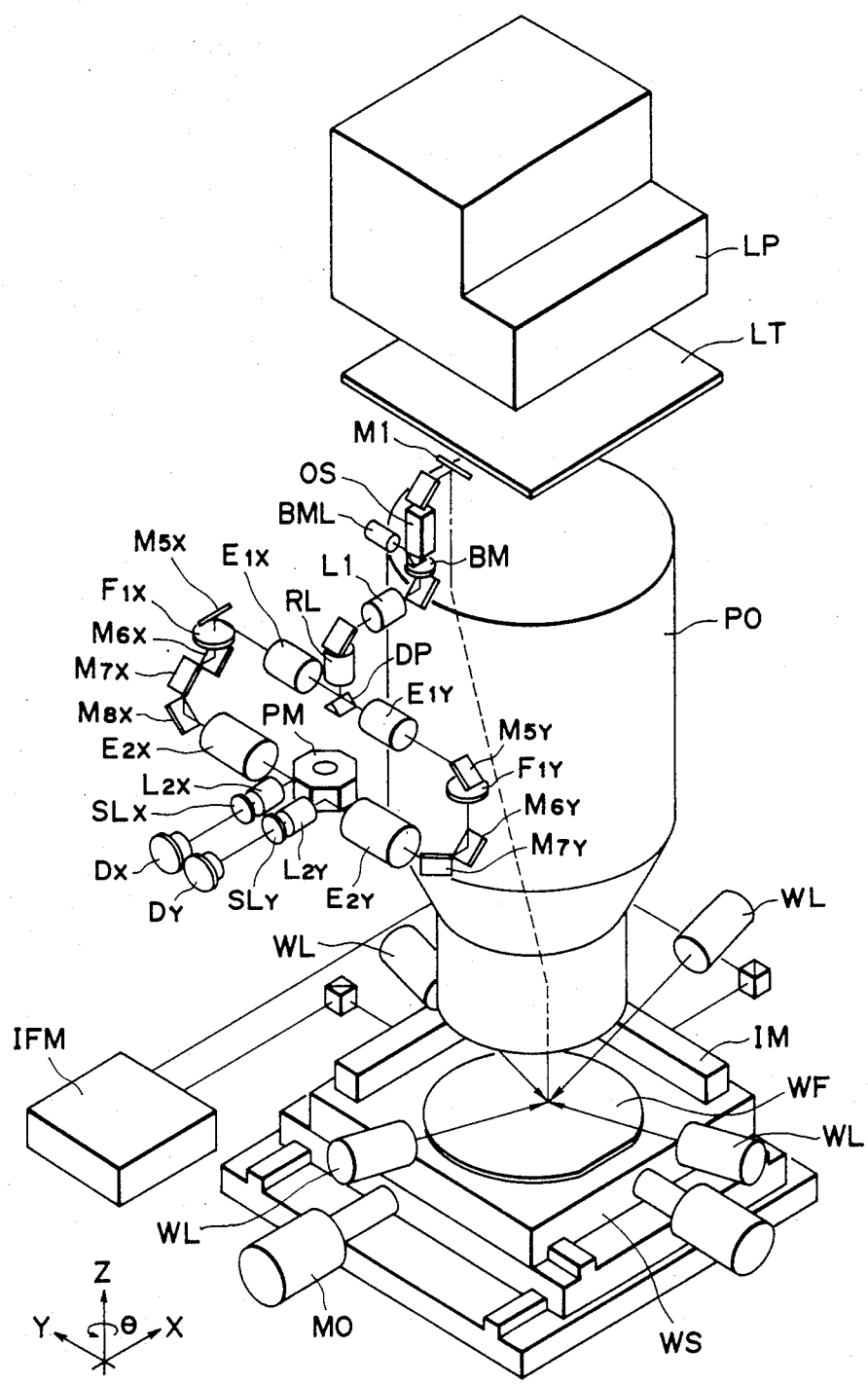
FIG. 17 is a perspective view schematically showing a major portion of a projection exposure apparatus having a position detecting system, according to another embodiment of the present invention.

FIG. 17 is a perspective view schematically showing a general arrangement of a step-and-repeat type semiconductor device manufacturing projection exposure apparatus, into which a position detecting device according to one embodiment of the present invention is incorporated.

In the FIG. 17 embodiment, images of a pattern formed on a reticle LT are projected, one by one, upon different shot areas of a wafer WF by way of a projection optical system and by use of an illuminating light supplied from an illumination system LP. The wafer is place on an X-Y stage WS which is movable. For each exposure (photoprinting), one corresponding shot area of the wafer should be aligned with the reticle LT pattern. For this purpose, the X-Y stage WS is moved to adjust the wafer position, whereby the corresponding one shot area is finally positioned at a predetermined location. Thus, the reticle-to-wafer alignment is accomplished. In this state, the exposure is initiated while holding the wafer at the alignment-completed position.

The automatic alignment system will now be described, particularly in relation to the advancement of light rays.

First, wafer illumination systems WL each produces a light of a wavelength different from that of the light used for the photoprinting, i.e. the exposure of the wafer WF. The light from each wafer illumination system WL is introduced from between the projection optical system PO and the wafer WF and is projected upon the wafer WF without passing through the projection optical system PO. The light reflected from the wafer WF as illuminated by the wafer illumination systems WL is received by the projection optical system PO and, therefrom, the light is directed to a detection optical system comprising a mirror M1 and other elements following it.

In this detection optical system, the light from the wafer WF passes through a correction optical system OS and is imaged upon a reference mask BM, having a reference mark, whose position relative to the reticle LT is predetected. The correction optical system OS is provided to substantially completely correct various chromatic aberrations caused by the passage, through the projection optical system PO, of the light having the wavelength different from the photoprinting wavelength. The optical arrangement following the reference mask BM is adapted to detect or observe, at the same time, the image of the wafer WF and a mark provided on the reference mask BM.

A roof prism DP is provided at a position which is optically conjugate with the reference mask BM with respect to optical elements inerposed therebetween. Thus, an image of the reference mark of the reference mask BM and an image of the wafer WF are formed on the prism DP. Each of the image of the reference mark of the reference mask BM and the image of the wafer WF, formed on the roof prism DP by the light transmitted through an objective lens L1 and a relay lens RL, is divided by the roof prism DP into two. From the prism DP, the light is directed by way of an erector $E1_X(E1_Y)$ and a mirror $M5_X(M5_Y)$ to a pupil filter $F1_X(F1_Y)$. Subsequently, the light from the filter $E1_X$ is directed to an image scanning mirror (a polygonal mirror in this example) PM by way of mirrors $M6_X$, $M7_X$ and $M8_X$ and an erector $E2_X$ which are provided so as to adjust, as desired, the orientation of the image for the sake of position detection with respect to the X direction. The light from the filter $F1_Y$ is treated similarly for the sake of position detection with respect to the Y direction. Only the difference exists in the mirror arrangement for adjusting the orientation of the image in the manner suitable for the position detection with respect to the Y direction.

By means of the polygonal mirror PM, the imaging light concerning the reference mark of the reference mask BM and the imaging light concerning the wafer WF are scanned or scanningly deflected toward f-$\theta$ lenses $L2_X$ and $L2_Y$, respectively, and then to slit members $SL_X$ and $SL_Y$, respectively. On these slit members, each light is imaged again. Each of the slit members $SL_X$ and $SL_Y$ is formed with one or more strip-shape apertures. The light passing through such apertures is detected by corresponding one of detectors $D_X$ and $D_Y$. Denoted at IFM is a laser interferometer system effective to detect the position of the X-Y stage. Also, denoted at IM is a mirror usable with the interferometer system, and at MO, an X-Y stage driving system.

A description will now be provided of the operation of automatic alignment.

Figure 18:
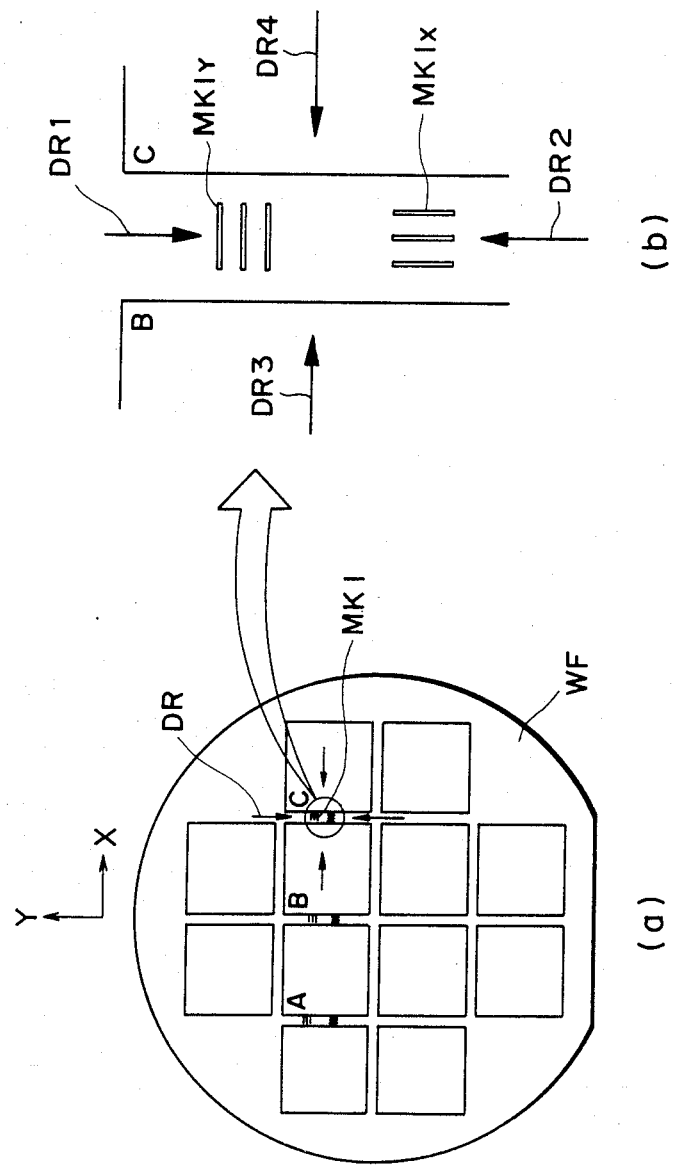
FIG. 18 is a schematic view for explicating the positions of marks provided on a wafer and the directions of illumination by wafer illuminating lights.

FIG. 18 shows the position of a mark MK1 formed on the wafer WF and the directions of projection of wafer illuminating lights. In the part (b) of FIG. 18, the wafer mark region including the mark MK1 is illustrated in an enlarged scale. In this embodiment, the mark MK1 is provided by three mark elements $MK1_X$ extending in the X direction and three mark elements $MK1_Y$ extending in the Y direction. As for the wafer illumination, four light beams are used. These light beams are projected upon the wafer mark in directions perpendicular to or parallel to the mark elements $MK1_X$ and $MK1_Y$, such as schematically illustrated in FIG. 18. As will be understood from the description having been made with respect to FIG. 11 or made in other portions, the illuminating lights advancing in the directions DR1 and DR2 are scarcely reflected by the mark elements $MK1_X$. On the other hand, the illuminating lights advancing in the directions DR3 and DR4 are scarcely reflected by the mark elements $MK1_Y$. In view of this, the optical arrangement of the present embodiment is so set that the illuminating lights advancing in the directions DR1 and DR2 are incident on and around the mark elements $MK1_Y$ while the illuminating lights advancing in the directions of DR3 and DR4 are incident on and around the mark elements $MK1_X$ It is to be noted that all the wafer illuminating lights are projected inclinedly upon the wafer WF, and each illuminating light has an angle of incidence that satisfies the equation (1) discussed in the foregoing.

The wafer alignment mark MK1 as illuminated in this manner is imaged upon the reference mask BM shown in FIG. 17.

Figure 19A:
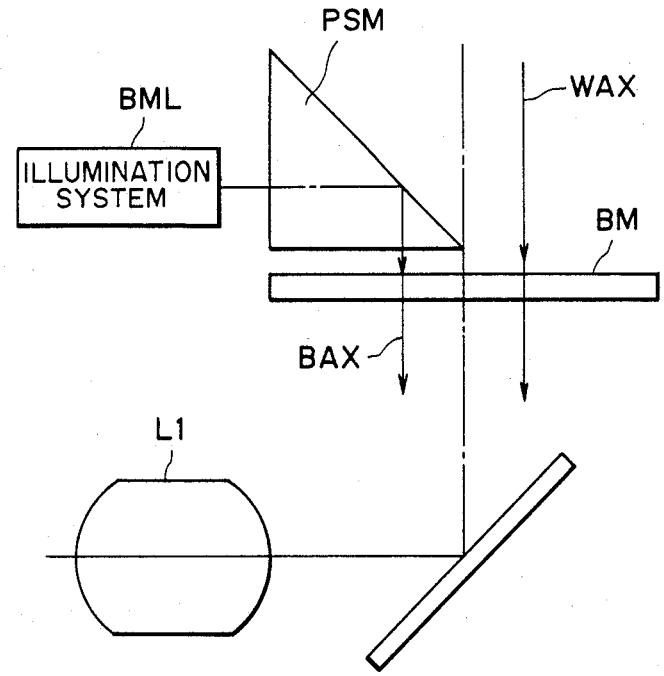
FIG. 19A is a schematic side view showing a reference mask illuminating system.
Figure 19B:
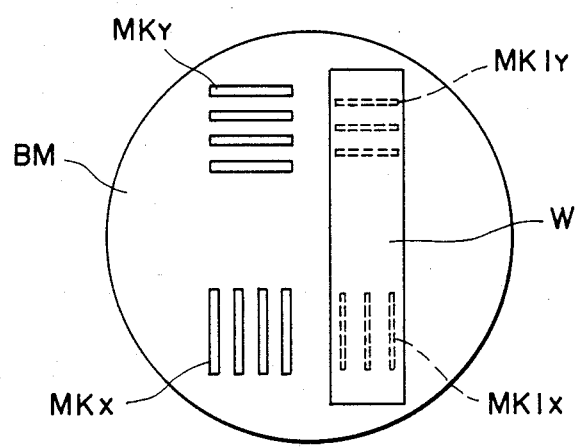
FIG. 19B is a plan view schematically showing the positional relation between the reference mark and the image of a wafer mark.

FIG. 19A shows an optical arrangement provided for illuminating the reference mask BM, while FIG. 19B shows, in a front view, the positional relation between the reference mark provided on the reference mask BM and the image of the wafer mark MK1. In FIG. 19A, the wafer mark imaging light advancing along an axis WAX passes through a window W formed in the reference mask MB (FIG. 19B) and enters into an objective lens L1. In this embodiment, the reference mark of the reference mask BM is provided by three mark element $MK_X$ and three mark elements $MK_Y$, corresponding to the wafer mark elements. Each mark element of the reference mark is formed by a light-transmitting region such as, for example, an aperture formed in the reference mask BM. Thus, the reference mask illuminating light passes through the reference mark so that the transmitted light forms an image of the reference mark. The reference mark imaging light also enters into the objective lens L1. Thus, a reference mark signal having a good S/N ratio is obtainable.

By means of the roof prism DP, the image of the reference mark and the image of the wafer are divided each into two, whereby there are produced an image of the reference mark portion $MK_Y$, an image of the wafer mark (portion) $MK1_Y$, an image of the reference mark (portion) $MK_X$ and an image of the wafer mark portion $MK1_X$. The lights forming the images of the mark $MK_Y$ and $MK1_Y$ and the lights forming the images of the mark $MK_X$ and $MK1_X$ are separated and directed leftwardly/rightwardly by the roof prism DP.

As seen from FIG. 17, the image which is to be used for the position detection with respect to the Y direction is rotated by 90 degrees by means of the mirrors $M5_Y$, $M6_Y$ and $M7_Y$, and the imaging light concerning such image is finally projected upon the polygonal mirror PM. On the other hand, the light concerning the image which is to be used for the position detection with respect to the X direction is transmitted to the polygonal mirror PM by way of the mirrors $M5_X$, $M6_X$, $M7_X$ and $M8_X$ but without being rotated. From the polygonal mirror PM, both are directed through respective f-$\theta$ lenses $L2_X$ and $L2_Y$ and are imaged upon the slit members $SL_X$ and $SL_Y$, respectively. In these two optical units provided for the position detection with respect to the X and Y directions, respectively, the lenses L1 and RL are used in common. Also, the erectors $E1_X$ and $E1_Y$ are of the same type, and the erectors $E2_X$ and $E2_Y$ are of the same type. These elements are provided so as to form an image of each mark at a predetermined magnification.

From the foregoing, it will be understood that in the present embodiment a mark having two components extending orthogonally to each other in the orthogonal X and Y directions are separated by means of the roof prism DP and, additionally, one of the mark components (more particularly, the image thereof) is rotated by 90 degrees about the corresponding optical axis by use of the image rotating optical system. By this, the images of the two mark components are made congruent with each other in the point of orientation. Namely, these images extend in the same orientation. This allows use of only one polygonal mirror such as at PM. Apparently, this is preferable as compared with a case where two polygonal mirrors are used.

Figure 20:
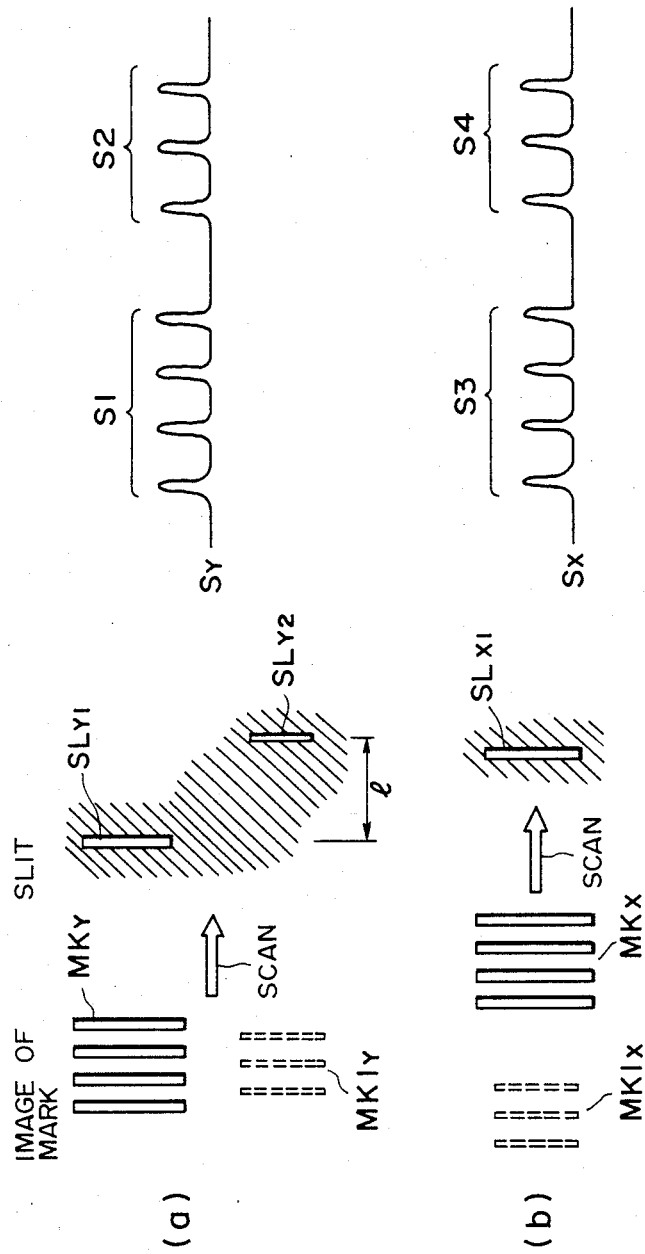
FIGS. 20 and 21 are principle views, respectively, for explicating the manner of light-reception through the slit means.

FIG. 20 is a schematic view showing the image of the reference mark, the image of the wafer mark, the direction of scan and the configuration of each slit aperrure as well as waveforms of electrical signals obtained on the basis of the detection of light passed through the slit apertures. The left-hand portion of FIG. 20 corresponds to a plan view of the slit member $SL_X$ ($SL_Y$) as viewed from the f-$\theta$ lens $L2_X$ ($L2_Y$) side shown in FIG. 17.

With the aid of rotation of the polygonal mirror PM, each image formed on the slit member is scanningly displaced relative to the slit member in the plane of the slit member surface in the direction of scan, denoted by an arrow in FIG. 20. The slit member $SL_Y$ is formed with slit apertures $SL_{Y1}$ and $SL_{Y2}$ each defined as a strip-shape light-transmitting portion. Similarly, the slit member $SL_X$ is formed with a slit aperture $SL_{X1}$. The light beams as transmitted through these slit apertures are detected by corresponding detectors $D_X$ and $D_Y$, whereby signal waveforms $S_Y$ and $S_X$ are obtained. From the thus obtained signal waveforms, the relative position of the reference mark and the wafer mark is measured or detected.

In the example of FIG. 20, one detector ($D_Y$) is disposed behind the slit members $SL_{Y1}$ and $SL_{Y2}$, while another detector ($D_X$) is disposed behind the slit member $SL_{X1}$. THe relative position of the reticle LT and the reference mask BM (reference mark) is predetected. For example, the reticle may be preparatorily aligned with respect to the reference mask BM. Therefore, by aligning the wafer so that it is exactly shifted from the reference mask by an amount corresponding to the shift of the reticle from the reference mask, the wafer can be aligned with the reticle as a consequence.

Next, a description will be provided of the reception of light at the slit member.

Referring to FIG. 20, the slit apertures $SL_{Y1}$ and $SL_{Y2}$ (hereinafter each simply "slit") are provided to scan the mark images $MK_Y$ and $MK1_Y$, respectively.

These slits $SL_{Y1}$ and $SL_{Y2}$ are formed in the same plate member with a predetermined offset of an amount l maintained therebetween. Disposed behind these slits $SL_{Y1}$ and $SL_{Y2}$ is the detector $D_Y$, which is single, adapted to receive the lights passing through these slits. The mark images $MK_Y$ and $MK1_Y$ are scanned in the direction of arrow, such that a signal S1 related to the reference mark image $MK_Y$ is first detected and, subsequently, a signal S2 related to the wafer mark image $MK1_Y$ is detected with a time interval corresponding to the offset l.

For the mark images $MK1_X$ and $MK_X$, on the other hand, the detector $D_X$ which is single is disposed behind the slit $SL_{X1}$. The mark images $MK_X$ and $MK1_X$ are scanned in the direction of arrow, such that first a signal S3 related to the reference mark image $MK_X$ is detected and, subsequently, a signal S4 related to the wafer mark image $MK1_X$ is detected.

From these signals, information concerning the relative position of the wafer mark and the reference mark is detectable. This will now be described in more detail.

In this example, the part (a) of FIG. 20 corresponds to detection of the positional information with respect to the Y-axis direction. From the signals S1 and S2, the relative position of the mark images $MK_Y$ and $MK1_Y$ is calculated while taking, as a reference, clock pulses supplied from a pulse generator, not shown. Any difference between the calculated relative position and the predetermined slit offset l corresponds to the amount of positional deviation between the wafer mark and the reference mark in the Y-axis direction. As for the manner of signal processing, any of known processes such as, for example, averaging or the like is usable.

On the other hand, the part (b) of FIG. 20 corresponds to detection of the positional information with respect to the X-axis direction. As for the positional relation between the mark images $MK1_X$ and $MK_X$, it is predetermined such that these mark images are spaced by a determined interval when the wafer mark and the reference mark are correctly aligned with each other with respect to the X-axis direction. From the signals S3 and S4, the relative position of these marks is calculated in a similar processing manner as described hereinbefore. Any difference between the calculated relative position and the above-described determined interval corresponds to the amount of positional deviation between the wafer mark and the reference mark with respect to the X-axis direction.

According to this embodiment, as described hereinbefore, the separately provided reference mark and the wafer mark are observed, with respect to each of the X-axis position and the Y-axis position, by use of a simple structure including only one detector and one or two slits for each of the X-axis position detection and the Y-axis position detection. With only such simple observation, the relative position can be detected very accurately.

Figure 21:
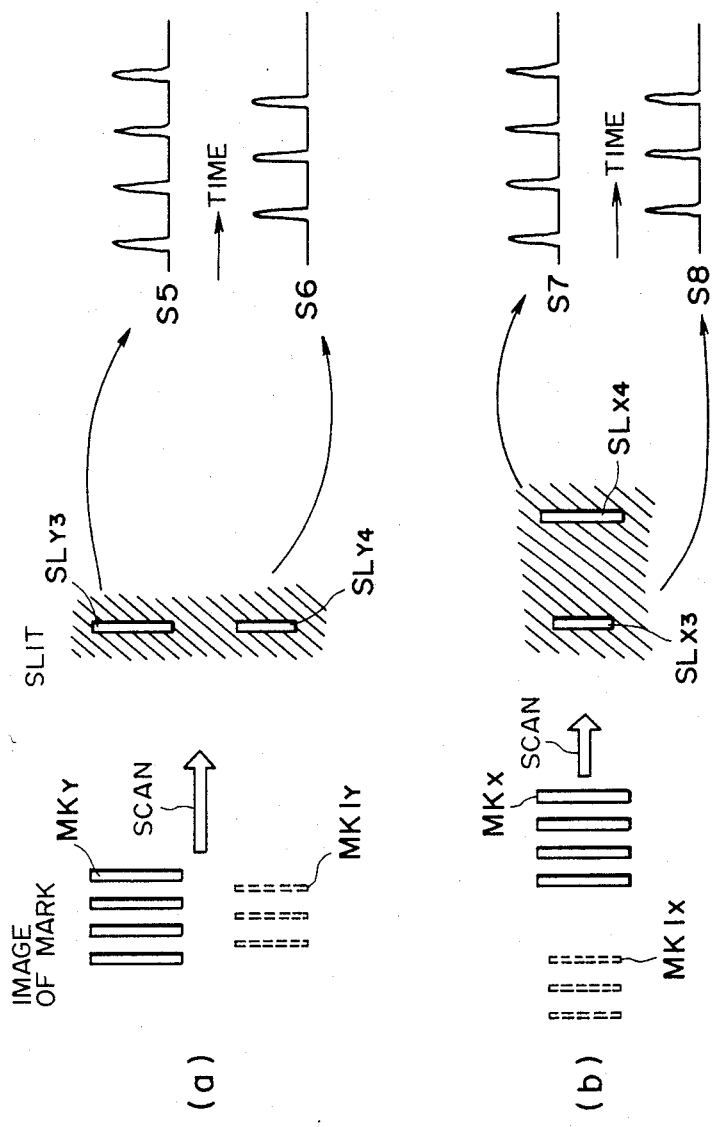

FIG. 21 shows another example of mark image scanning. In this example, four detectors are used which are disposed behind slits $SL_{X3}$, $SL_{X4}$, $SL_{Y3}$ and $SL_{Y4}$, respectively. In the part (a) of FIG. 21, the reference mark image $MK_Y$ to be used for the detection of Y-axis position as well as the wafer mark image $MK1_Y$ are scanned in the direction of arrow, such that signals S5 and S6 are detected by respective detectors disposed behind the slits $SL_{Y3}$ and $SL_{Y4}$, respectively. From these signals S5 and S6, positional information concerning the relative position of the reference mark $MK_Y$ and the wafer mark MK1$_Y$ with respect to the Y direction is detected by calculation.

This is also with the case of the X direction. In the part (b) of FIG. 21, the reference mark image MK$_X$ and the wafer mark image MK1$_X$ are scanned in the direction of arrow, such that signals S7 and S8 are detected by respective detectors disposed behind the slits SL$_{X3}$ and SL$_{X4}$, respectively. The slits SL$_{X3}$ and SL$_{X4}$ are spaced by a predetermined interval, and the slit SL$_{X3}$ is used to scan and detect the mark image MK1$_X$ while the slit SL$_{X4}$ is used to scan and detect the mark image MK$_X$. The slit SL$_{X3}$ does not detect the mark image MK$_X$, and the slit SL$_{X4}$ does not detect the mark image MK1$_X$. From the signals S7 and S8, the information concerning the relative position of the reference mark MK$_X$ and the wafer mark MK1$_X$ is detected by calculation.

As compared with the FIG. 20 example, the FIG. 21 example is arranged to detect the signals at the same time. These signals are detected separately by respective detectors provided in association with the marks, respectively. This is effective to minimize any error due to uneven rotation of the polygonal mirror. Also, it is possible to use appropriate detectors which are suitable, in the points of precision and cost, for the detection of optical signals having different intensities.

Next, a description will be provided of the wafer illumination optical system WL (FIG. 17).

For the introduction of the laser beam to the wafer, it may be possible to use mirrors to directly introduce the laser beam to the wafer. Alternatively, an optical fiber bundle such as schematically shown at OPF in the part (c) of FIG. 22 may be used to guide the laser beam to the wafer. However, use of an optical system such as mirrors leads to the bulkiness of the system and, therefore, to the restriction of the freedom in the geometrical design of the guiding optical system. Also, the manufacturing cost increases. Use of the optical fiber bundle easily causes interference due to the superposition of lights from the fibers. This results in the disadvantage of uneven illumination.

Figure 22:
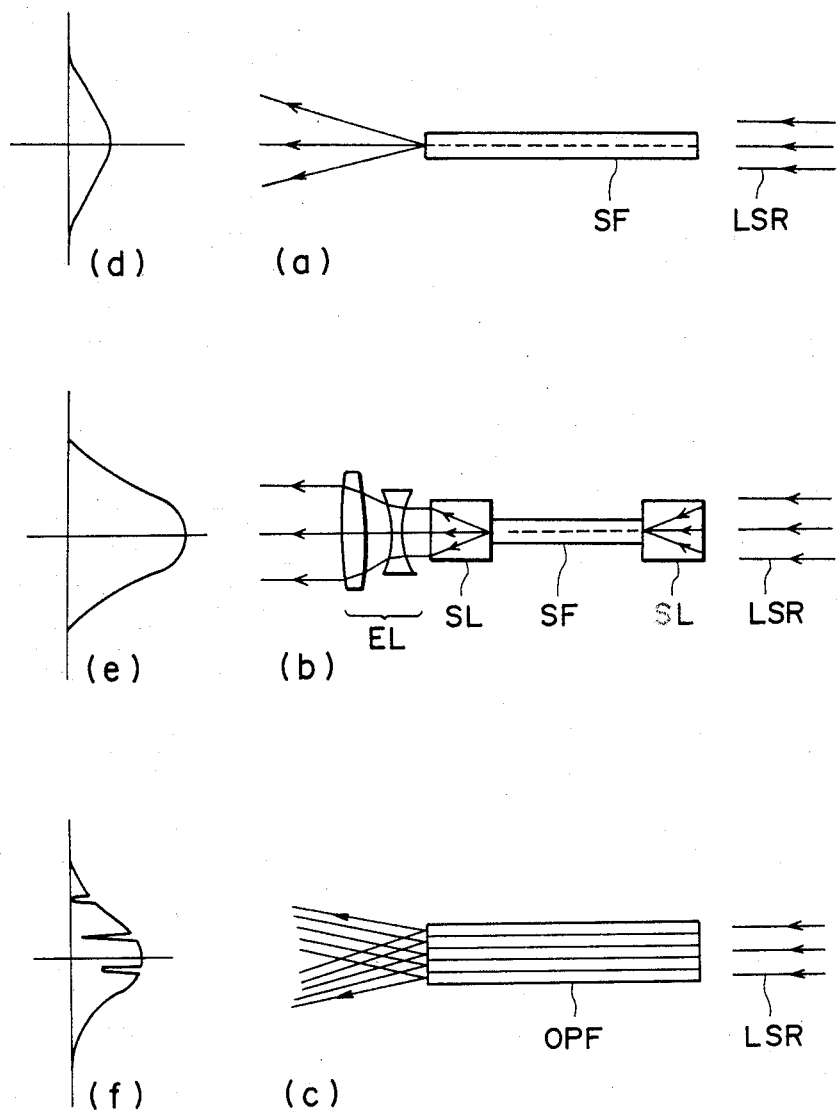
FIG. 22 is a principle view for explicating the manner of introducing the wafer illuminating light and the illuminance distribution.

In the present embodiment, as illustrated in the part (a) of FIG. 22, a single mode fiber SF is used to guide the laser beam LSR to the surface of the wafer WF. The single mode fiber SF does not cause any phase change and interference within it. Therefore, the light emitted from the fiber has an idealistic Gaussian distribution, such that uniform illumination with even illuminance is attainable.

The part (b) of FIG. 22 shows an example wherein gradient index type lens systems SL are provided at the opposite ends of the single mode fiber and, further, an expander lens system EL is added. The gradient index type lens systems SL are arranged so that the laser beam is efficiently collected and introduced into the fiber SF and also that the introduced laser beam is collimated when it emerges from the fiber. By the subsequent passage through the expander lens system EL, the collimated laser beam is expanded as desired. The addition of the gradient index type lens systems SL and the expander EL assures an illumination optical system providing high-intensity and high-uniformity illuminance distribution. The parts (d)-(f) of FIG. 22 show illuminance distributions as obtainable by respective light introduction systems shown in the part (a)-(c).

By use of single-mode fibers SF described hereinbefore, the wafer is illuminated by the lights projected in the directions DR1-DR4, respectively, shown in the part (b) of FIG. 18. In this embodiment, at this time, the optical path lengths are so determined that the lights projected in the opposed directions do not interfere with each other. Namely, with regard to the lights advancing in the directions DR1 and DR2, they are directed along respective paths having mutually different lengths, the difference being provided by, for example, changing the relative lengths of the fibers SF for these lights. By this, these lights do not interfere with each other. This is also with the case of the lights advancing in the directions DR3 and DR4. While it is sufficient to provide "incoherency" between the lights advancing in the opposed directions (as viewed in FIG. 18), it is of course possible to provide the incoherency between the four illuminating lights by defining mutual differences in the four optical path lengths. A remarkable effect is attainable in such case.

Next, a description will be provided of an aberration correcting optical system.

In a case where light of a wavelength different from the resist-sensitizing wavelength is used for the TTL alignment, as in the present embodiment, it is necessary to correct various aberrations caused by the projection optical system in relation to the "chromaticity". While the FIG. 17 embodiment includes the correction optical system OS which is of the transmission type as will be described later, such transmission type correction optical system may be slightly bulky. If this is not desired, a reflection type correction optical system including a plurality of rear-surface reflection type mirrors, disposed so as to incline with respect to each other and with respect to an optical axis of the correction optical system, may preferably be used.

FIG. 23 shows details of the transmission type aberration correcting optical system OS of the FIG. 17 embodiment. In this example, the correction optical system OS comprises three paralle/-surface glass plates GP1-GP3 which are disposed so as to be inclined with respect to the optical axis. Also, they are inclined in different directions with respect to each other.

FIG. 24 shows details of the reflection type correction optical system. In this example, the light reflected from the wafer mark (e.g. MK1$_Y$) is projected by way of the projection optical system PO upon a mirror M11. The mirror M11 is of the rear-surface surface reflection type having parallel surfaces, and is disposed so as to be inclined relative to the meridional light (meridional plane) of the projection optical system PO. Rear-surface reflection type mirror M11 is a glass plate having a mirror or reflection surface formed on its inside or rear face. From the mirror M11, the light is reflected toward mirrors M12 and M13. Each of the mirrors M12 and M13 is of the rear-surface reflection type as the mirror M11. However, the direction of inclination of each mirror M12 or M13 is orthogonal to the mirror M11. The light reflected by the mirror M13 is directed to a front-surface reflection type mirror M14, whereby it is reflected to and imaged upon the reference mask BM.

The significance and function of such aberration correcting optical system will now be described in detail.

Observation systems are used in many optical instruments to observe the surface of an object upon which a pattern is to be or being projected by means of a projection optical system. For example, in the field of projection exposure apparatus for use in the manufacture of semiconductor devices, a projection optical system is provided to optically project an image of a reticle, which is a first object, upon the surface of a wafer which is a second object. Also, an observation optical system is provided to observe the surface of the wafer. By use of such observation system, positional adjustment of the reticle and the wafer, called "alignment", is carried out. The accuracy of such alignment depends, to a greater extent, upon the optical performance of the observation system. For this reason, the performance of the observation system is one of most important factors in the projection exposure apparatus.

As for the reticle-to-wafer alignment using such observation systems, many proposals have been made. An example is disclosed in U.S. Pat. No. 4,528,082 ; assigned to the same assignee of the subject application. In an alignment and exposure apparatus according to this U.S. Patent, a projection optical system for projecting or photoprinting a circuit pattern of a reticle upon a wafer uses, for the pattern projection, light of g-line (436 nm in wavelength). On the other hand, an alignment system of the type usually called "TTL" (through-the-lens) system uses, for the reticle-to-wafer alignment, a laser beam emitted from He-Cd laesr and having a wavelength of 442 nm. Since these two wavelengths used are substantially equal to each other, the projection optical system shows substantially the same optical performance with respect to both of the two wavelengths.

For the better alignment accuracy in an lignment system of the TTL type which is arranged to detect the positional relation between the reticle and the wafer by use of the light passed through the projection optical system, it will be most desirable to use in the alignment system a wavelength which is exactly the same or substantially the same as the wavelength used for the projection exposure or "photoprinting". Use of the same or substantially the same wavelength for the projection exposure and for the alignment however involves inconveniences. Namely, in a case where a multilayer resist coating is provided on the wafer, the multilayer resist coating material which is absorbent to the photoprinting wavelength is liable to absorb the light irradiating the wafer for the alignment purpose. As a result, the quantity of light reflected from alignment marks formed on the wafer is reduced. Consequently, the signal-to-noise ratio of mark detecting signals is decreased with the result that the alignment accuracy is degraded. In consideration of this, it will be necessary to use a non-photoprinting wavelength for the alignment purpose in order to improve the signal-to-noise ratio to thereby improve the alignment accuracy.

However, use of the non-hotoprinting wavelength in a TTL alignment system encounters another problem. Namely, the projection optical system used in projection exposure apparatuses is usually designed so that various aberrations are satisfactorily corrected only with respect to the photoprinting wavelength to be used. Therefore, for the light other than the photoprinting wavelength, there occurs in the projection optical system chromatic aberration which hinders observation of the wafer alignment mark.

As for such chromatic aberration, practically there are "longitudinal or axial chromatic aberration" and "chromatic aberration of magnification". Additionally, there occur "coma", "astigmatism", "spherical aberration" and so on all of which are caused in relation to the use of a wavelength different from the photoprinting wavelength, that is in relation to the "chromaticity".

Some proposals have been made in connection with the chromatic aberration. According to one proposal, for allowing the observation of the surface of a wafer from the above of a reticle, the position of the wafer surface is shifted in the direction of an optical axis of the projection optical system by an amount corresponding to the amount of shift of focus of the projection optical system, caused by the axial chromatic aberration with respect to the wavelength used for the observation. This is done to retain an exact optically conjugate relation between the wafer surface and the reticle surface. According to another proposal, an auxiliary optical means is provided between the reticle and the projection optical system to correct the axial chromatic aberration to thereby avoid the shift of focus. However, the correction of chromatic aberration according to the traditional technique is insufficient. Because of this insufficiency, the conventional alignment systems each conducts the observation by utilizing image formation only with respect to the sagittal direction, with the use of an alignment mark formed by a rectilinear pattern or patterns extending substantially radially outwardly from the optical axis of the projection optical system. This is because substantially no asymmetrical aberration occurs in the image formation with respect to the sagittal direction.

The observation of the alignment mark by use of image formtion only with respect to the sagittal direction, however, will be difficult to assure much higher alignment accuracy that meets the requirements of much higher resolution of the order of a submicron linewidth. As an example, any error in the imaging characteristics of the projection optical system itself such as, e.g., an error in the projection magnification resulting from a change in an ambient pressure, can be considered as an equivalent of a magnification change. Also, any local deformation or warp of a wafer can be considered as such equivalent of the magnification change. With the mark observation by use of the image formation only with respect to the sagittal direction and by use of the radially outwardly extending alignment mark pattern, however, it is quite difficult to detect such errors that can be regarded as an equivalent of the magnification change.

Further, with the image formation only in the sagittal direction, basically the observation with repect to a single point on the wafer merely allows detection of one-dimensional positional-information. This is insufficient to achieve two-dimensional alignment.

In consideration of the above, the aberration correcting optical system such as described hereinbefore is provided. By this correction optical system, various chromatic aberrations caused by the projection optical system in relation to use of the non-photoprinting wavelength for the alignment purpose can be substantially completely corrected, whereby high-accuracy alignment is made attainable.

Referring back to FIG. 24, the reflection type correction optical system comprises three rear-surface reflection type mirrors as described hereinbefore. More specifically, of these three mirrors, the first mirror M11 is disposed to be inclined relative to the meridional section of the projection optical system, i.e., disposed to be inclined relative to the image-forming light flux in the meridional section, so as to correct the "coma" caused by the projection optical system with respect to the observation wavelength. At this time, the angle of inclination of the mirror M11 is determined in accordance with the magnitude of aberration and the thickness of the mirror M11.

While the use of a single rear-surface reflection mirror such as the mirror M11 is effective in respect to the correction of "coma", it disadvantageously leads to generation of "astigmatism". The sum of such astigmatism and the astigmatism of the projection optical system with respect to the observation wavelength is the total astigmatism which appears upon observation. To avoid such inconvenience, the present embodiment uses two additional rear-surface reflection mirrors such as the mirrors M12 and M13. These mirrors M12 and M13 are disposed to be inclined with respect to the optical axis of the observation optical system in the manner that they are included in planes parallel to planes in which the mirror M11 is placed when it is rotated by 90 degrees about the optical axis in opposite directions, respectively.

Where the mirrors M12 and M13 have the same thickness, they may be disposed or inclined symmetrically. If they have different thickness, they may be inclined at different angles. It is to be noted that these two mirrors M12 and M13 are disposed so as not to produce, in the combination, the aberration of "coma". However, the are disposed so as specifically to produce such "astigmatism" that is effectiv to cancel the astigmatism caused by the projection optical system and the mirror M11. By this, the "total astigmatism" described above is corrected sufficiently.

In a case where the projection optical system used does not show "astigmatism", while it shows "coma", each of the two mirrors M12 and M13 may have a thickness which is substantially a half of the thickness of the mirror M11. Also, in such case, all the three mirrors M11–M13 may preferably be disposed so that they have substantially the same angle (inclination angle) with respect to the optical axis of the observation optical system (although the mirrors M12 and M13 may be "twisted" relative to the mirror M11). This arrangement is effective to correct the coma of the projection optical system as well as the astigmatism caused by the mirror M11.

In the present embodiment, the angle of inclination of each of the mirrors M11–M13 is made adjustable. This is very effective because, where the projection optical system used shows astigmatism with respect to the observation wavelength, precise and exact correction of the aberration is attainable by adjusting the angle defined between the first mirror M11 and the remaining mirrors M12 and M13 in accordance with the magnitude of the astigmatism of the projection optical system. Namely, in the present embodiment, the amount of aberration-correction can be controlled as desired, by adjusting the inclination of one or more parallel-surface mirrors.

With the structure of the correction optical system of the present embodiment as has been described in the foregoing, the "coma" (which appears as the asymmetry in the meridional direction) and the "astigmatism" (which appears as the difference in the imaging position in the sagittal and meridional surfaces) can be corrected satisfactorily. Thus, not only in the sagittal direction but also in the meridional direction, sufficient and satisfactory aberration-correction is attained. As a consequence, exact and simultaneous observation of the alignment marks of the reticle and the wafer is allowed, with the result that much higher alignment accuracy is attained.

The reflection type correction optical system as shown in FIG. 24 is preferable because, due to the rear-surface reflection feature, each mirror may have a thickness which is approximately a half of the thickness of the transmission type parallel-surface glass plate. Also, the components of the correction optical system function to guide the light as desired. Accordingly, the optical arrangement can be made compact and at a lower cost.

FIG. 25 shows an example wherein a portion of the reflection type embodiment shown in FIG. 24 is replaced by transmission type optical elements.

The objective lens may be made movable and, also, the aberration correcting optical system may be made movable so as to follow the movement of the objective lens. By doing so, it becomes possible to change the position of the objective lens in accordance with the size of the shot area on the wafer as well as to correct the chromatic aberrations accordingly. Therefore, it becomes possible to execute the exposure promptly in response to the completion of the alignment. Thus, the throughput can be improved significantly.

Next, a description will be provided of the correction of or compensation for the sensitivity of the detector.

Where the sensitivity of the photoreceptor such as a photoelectrically converting detector changes with time, there occurs a possibility of deterioration of precision due to the change in the intensity of the signal obtainable from the photoreceptor. In a worst case, the detection itself is not attainable. To avoid this, it may be possible to widen the dynamic range of the gain of the detection system. However, this leads to the disadvantage of increased cost.

In consideration thereof, the present embodiment uses a standard light source for producing a standard light which is directed to be incident upon the detector, thereby to allow monitoring of any sensitivity change. By this, it becomes possible to reference the sensitivity change, in software, and to control the gain. Also, the sensitivity change can be compensated for by adjusting the intensity of light to be or being emitted from a light source used for the detection. The monito of the sensitivity may be made at a suitable time such as, for example, for each carrier or for each replacement of the reticle. Alternatively, the monitoring may be made periodically such as, for example, once per a day.

The correction of or compensation for the detector sensitivity provides various advantageous effects such as follows:

(1) It is possible to arrange the detection system most suitably for the detection purpose with a minimum cost.
(2) The detection accuracy can be improved.
(3) The failure of detection can be avoided.
(4) The reliability can be improved, because the error can be detected within the detection system (i.e. selfdetection).

Figure 26:
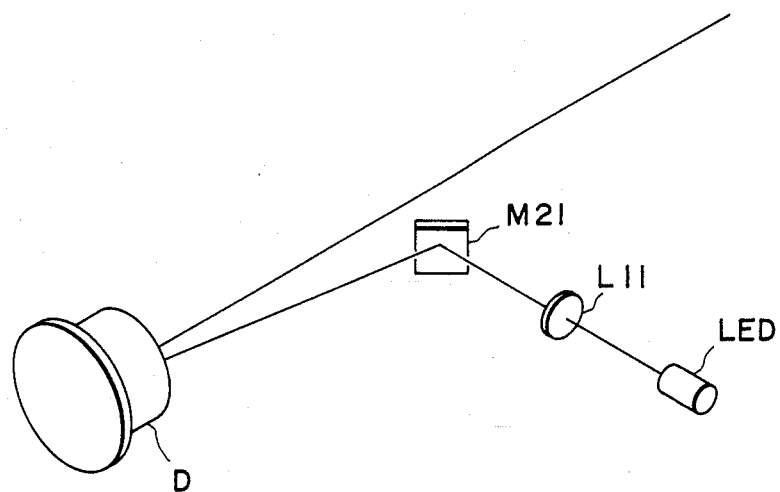
FIG. 26 is a schematic view of a detector-sensitivity monitoring system.

FIG. 26 shows details of the structure around the detector D ($D_X$ or $D_Y$) of the FIG. 17 embodiment. Denoted at LED is a light emitting diode adapted to produce a light of a wavelength substantially the same as the wavelength used for the alignment purpose. Use of such light emitting diode is not indispensable, and any other light source may be used provided that it produces light of the wavelength the same as or substantially the same as the wavelength used for the alignment purpose. In this example, a red light emitting diode "FH1011", manufactured by Stanley Co., Japan, producing light of a wavelength 660 nm, is used. Denoted at L11 is a condensing lens, and at M21, a path bending or deflecting mirror. The mirror M21 is disposed out of the effective optical path of the alignment detecting optical system. However, it is so disposed that the light emitted from the diode LED and passed through the lens L11 is incident on the detector D.

Figure 27:
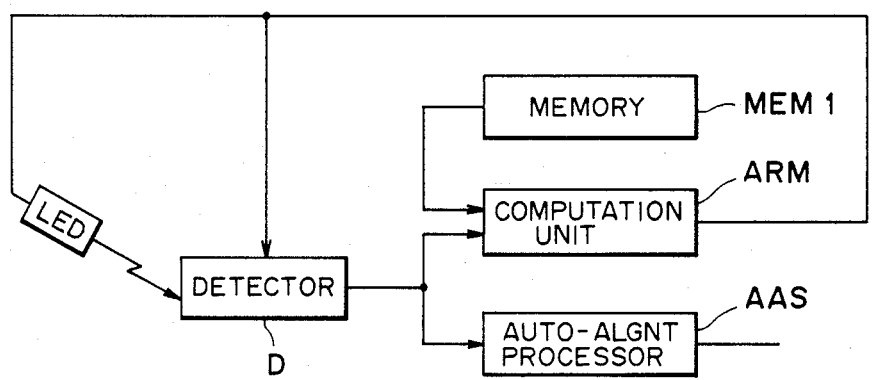
FIG. 27 is a schematic block diagram of the monitoring system shown in FIG. 26.

FIG. 27 is a schematic block diagram of the detector sensitivity monitoring system. The light emitting diode LED is energized at suitable time under the influence of a computation control system ARM, and the detector D detects the light emitted from the diode LED. The output of the detector D is supplied to the computation control system ARM and, in this system, it is compared with a reference output having been stored in suitable memory means such as a memory MEM1. If, at this time, the change in the sensitivity of the detector D is detected, the computation control system ARM operates to control a detector controlling circuit, not shown, to correct the sensitivity change. As an example, an electric voltage to be applied to the detector D is controlled.

In the following, a description will be provided of the "chopping" and the waveform processing.

Figure 28:
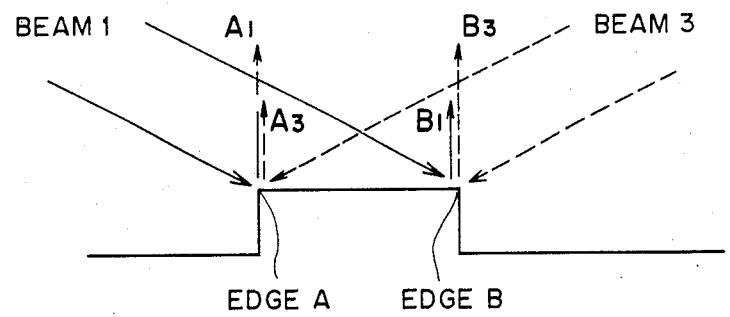
FIGS. 28–32 are principle views, respectively, for explicating the manner of chopping and the waveform processing.
Figure 28:
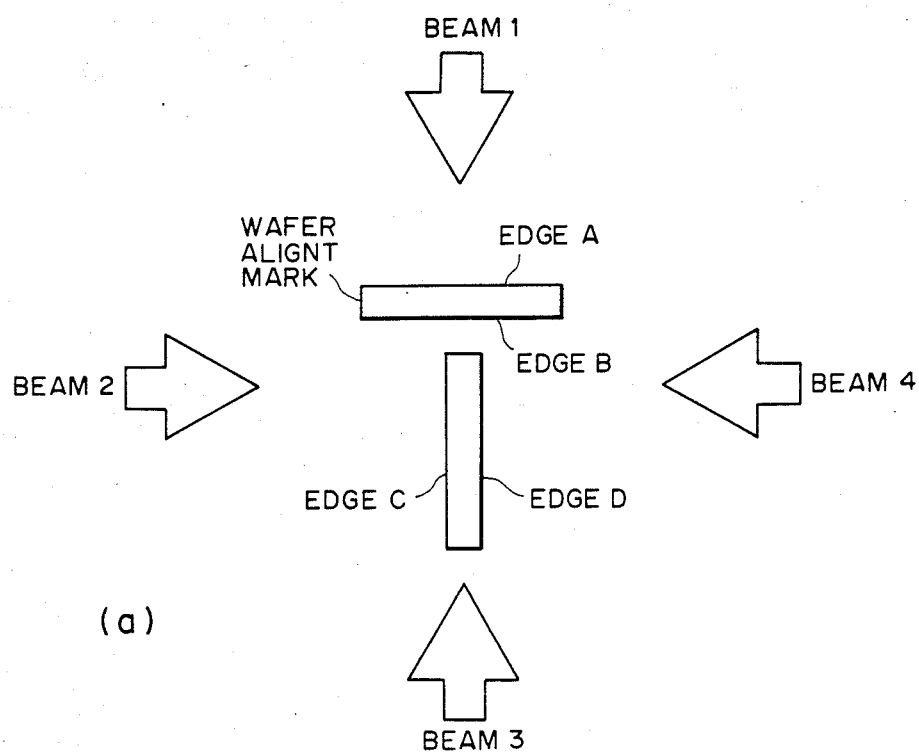

In order to avoid the adverse effects of interference between the light reflected from the edge of the wafer mark and the light reflected from the surface of the resist layer, the present embodiment is arranged so that the mark illuminating lights are projected upon the mark in the directions inclined with respect to the wafer, such as shown in FIG. 17. In this case, in order to obtain reflection lights from all the edges of the wafer mark, it is necessary to project the light beams along four directions. Referring to FIG. 28, the part (a) of this FIG. schematically shows the relation between the mark and the light beams directed thereto. The part (b) of FIG. 28 schematically shows the reflection of light at the edges of the mark. In the illustration of FIG. 28, the light which is caused by the reflection (diffraction or scattering) at an edge A as a result of the projection of a light beam 1 is denoted by A1; the light which is caused by the reflection at an edge B as a result of the projection of the light beam 1 is denoted by B1; the light which is caused by the reflection at the edge A as a result of the projection of a light beam 3 is denoted by A3; and the light which is caused by the reflection at the edge B as a result of the projection of the light beam 3 is denoted by B3. When the beams 1 and 3 are projected upon the mark simultaneously, there occurs, at the edge A, interference between the reflected lights A1 and A3. Also, there occurs, at the edge B, interference between the reflected lights B1 and B3. The occurrence of such interference can be avoided by projecting the beams at different times so as to obtain the edge reflection lights separately. This is called "chopping".

Figure 29:
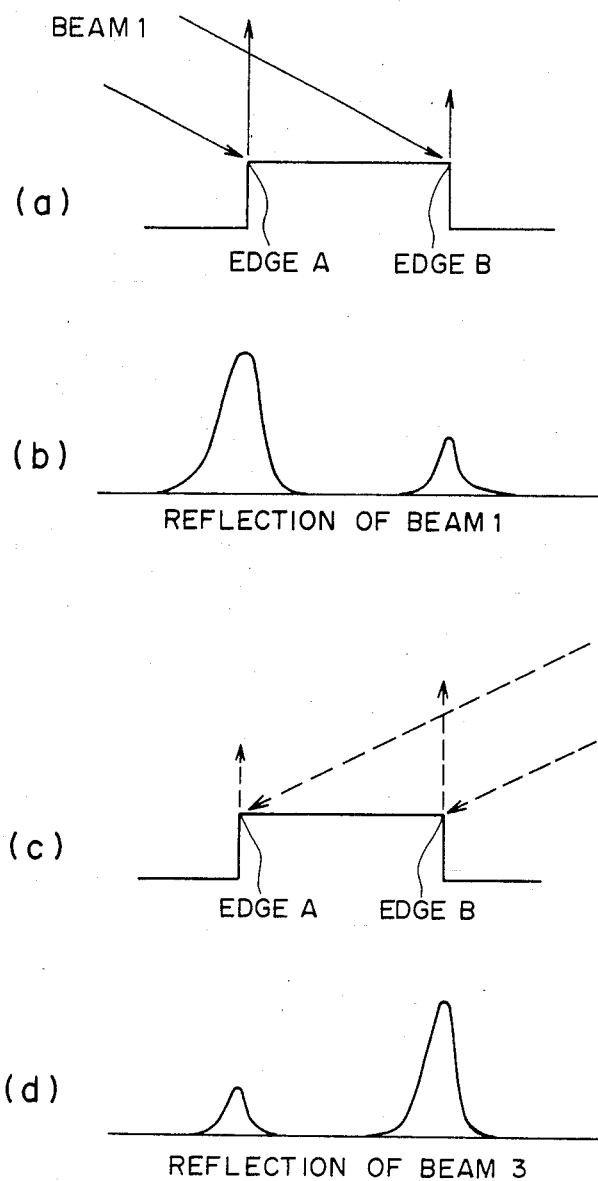

Description will now be made to the manner of detecting a "real position" on the basis of the reflected lights obtained by the chopping without being adversely affected by the interference.

Where the mark is illuminated by the chopping and by use of the beams 1 and 3, such as schematically illustrated in the parts (a) and (c) of FIG. 29, there are produced in a time sharing fashion the reflected lights such as schematically illustrated in the parts (b) and (d) of FIG. 29. The waveform as illustrated in the part (b) or (d) of FIG. 29 is a waveform that can be obtained when the image of each edge is scanned with an idealistic slit, i.e. a slit having an infinitely narrow slit width.

Figure 30:
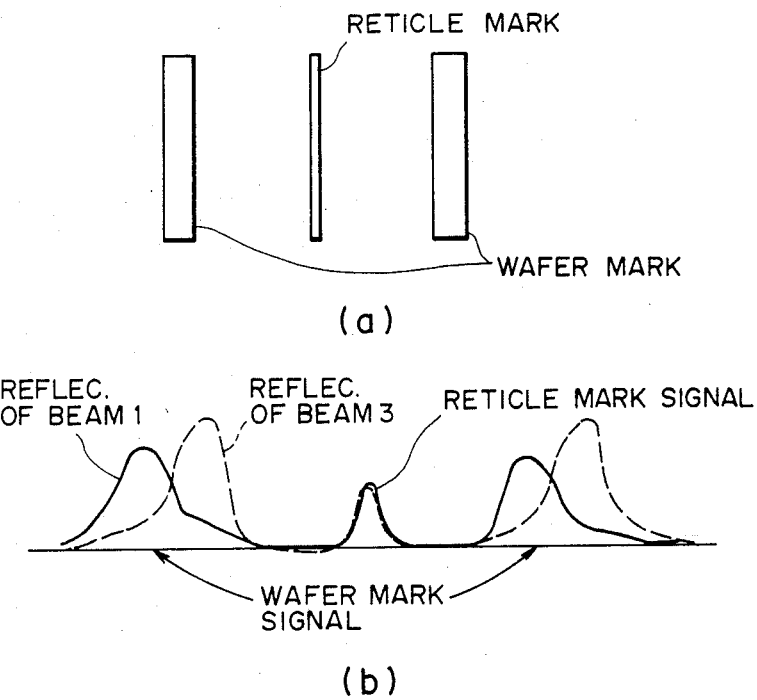
Figure 30:
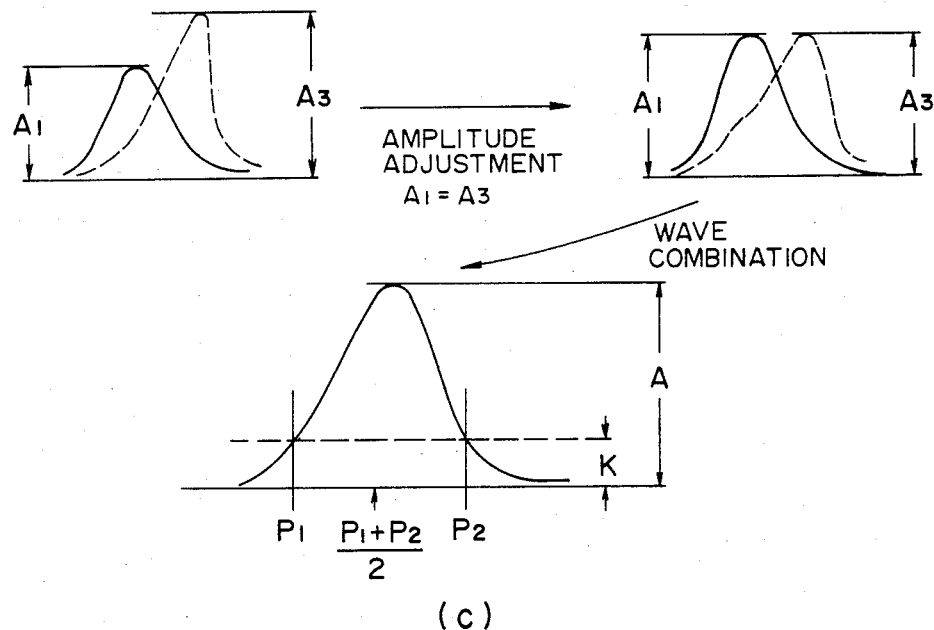

For ease in understanding of the chopping, it is now assumed that the wafer mark is to be directly aligned with the reticle mark. In a case where such marks as shown in the part (a) of FIG. 30 are provided on the wafer and the reticle, respectively, there will be produced, as a result of the chopping and from the mark edges, such signals as schematically illustrated in the part (b) of FIG. 30. In the illustration of the part (b) of FIG. 30, each of the waveform corresponding to the reflected components of the beam 1 and the waveform corresponding to the reflected components of the beam 3, contains peaks corresponding to the two wafer mark and one reticle mark, respectively. However, each waveform does not contain peaks exactly corresponding to the edges of the marks, as compared with the waveform shown in FIG. 29. This is because of the fact that, in the mark image scanning conducted in the present invention, the slit has a certain definite slit width which results in the light passing through the slit and detected by the detector being actually the sum of the reflected lights from the edges on the opposite sides. Therefore, each waveform illustrated in FIG. 30 is actually slightly distorted.

Subsequently, as schematically illustrated in the part (c) of FIG. 30, amplitude adjustment is executed with respect to the signals obtained from the edges. More particularly, where the amplitudes of these signals obtained by the image scanning is denoted by A1 and A3, the amplitude adjustment is executed so that A1=A3. For such amplitude adjustment, for example, the gain of an amplifier provided to amplify the output of the detector may be controlled. After the amplitude adjustment, the signals are combined so that a combined waveform is obtained. For an amplitude A of such combined waveform, a certain slice level K is set. This can be made according to the following equation:

$$K = A \times 30/100$$

By use of such slice level K, slice positions P1 and P2 are determined and, subsequently, the midpoint between the slice positions P1 and P2, i.e. (P1+P2)/2 is determined as the wafer mark position. The position of the reticle mark is determined similarly. In this manner, the positions of the marks are determined, whereby the amount of positional deviation of the wafer from the real position and with respect to the reticle can be detected.

Next, a description will be provided of a second method of detecting the real position of the basis of the reflected lights obtained as a result of the chopping, without being affected by the interference.

If the lights from the edges are received by use of an idealistic slit having an infinitely narrow slit width, as described hereinbefore, there will be produced, as a result of the chopping, such waveforms of the reflected lights as illustrated in FIG. 29. If, on the other hand, a slit having a definit slit width is used with the wafer marks and the reticle mark, such as shown in the part (a) of FIG. 31, so as to receive the lights reflected from the edges of the marks, then such signals as illustrated in the part (b) of FIG. 31 are obtainable from the edges of the marks and as a result of the chopping.

Figure 31:
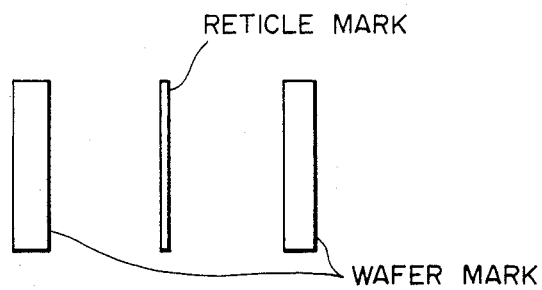
Figure 31:
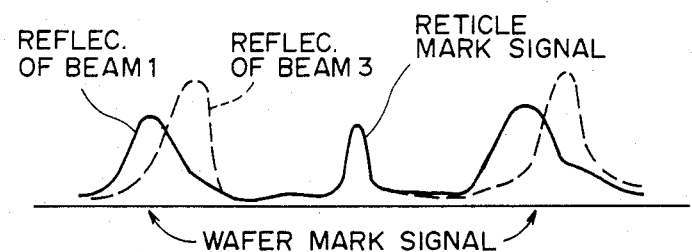
Figure 31:
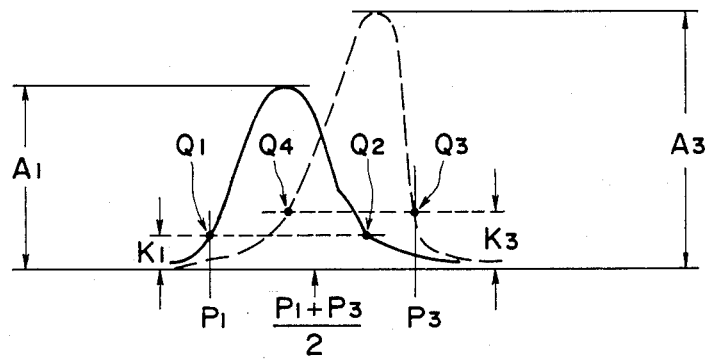

The amplitudes of the thus obtained signals are denoted by A1 and A3, as depicted in the part (c) of FIG. 31. For these signals, in accordance with the second method, respective slice levels K1 and K3 are determined. This can be made in accordance with the following equations:

$$K1 = A1 \times 30/100$$

$$K3 = A3 \times 30/100$$

Each signal is sliced by use of corresponding one of the slice levels so determined. As for the determination of the slice position for each signal, such one of the point of rising and the point of falling, which is on a steeper slope, is selected as the slice position. Namely, as regards the signal having an amplitude A1, for example, discrimination is made to detect steeper one of the two slopes on which the points Q1 and Q2 rest, respectively, and such one of the two points Q1 and Q2 which rests on the steeper slope is selected as the slice position. Similar discrimination is made to the points Q3 and Q4 of the signal having an amplitude A3, and such one of them that rests on the steeper slope is used.

If the points Q1 and Q3 are selected, then the midpoint between the slice positions P1 and P3, i.e. (P1+P3)/2, is determined as the mark position. If, on the other hand, the points Q2 and Q4 are selected, the mid point between the slice positions corresponding to these points is determined as the mark position. In this example, only for the simplicity, the points Q1 and Q3 are used in a pair, while the poins Q2 and Q4 are used in a pair.

By determining the positions of the marks in the manner described above, the amount of positional deviation from the real position can be detected.

Subsequently, a description will provided to a third method of detecting the real position on the basis of the reflected lights obtained as a result of the chopping, without being affected by the interference.

Figure 32:
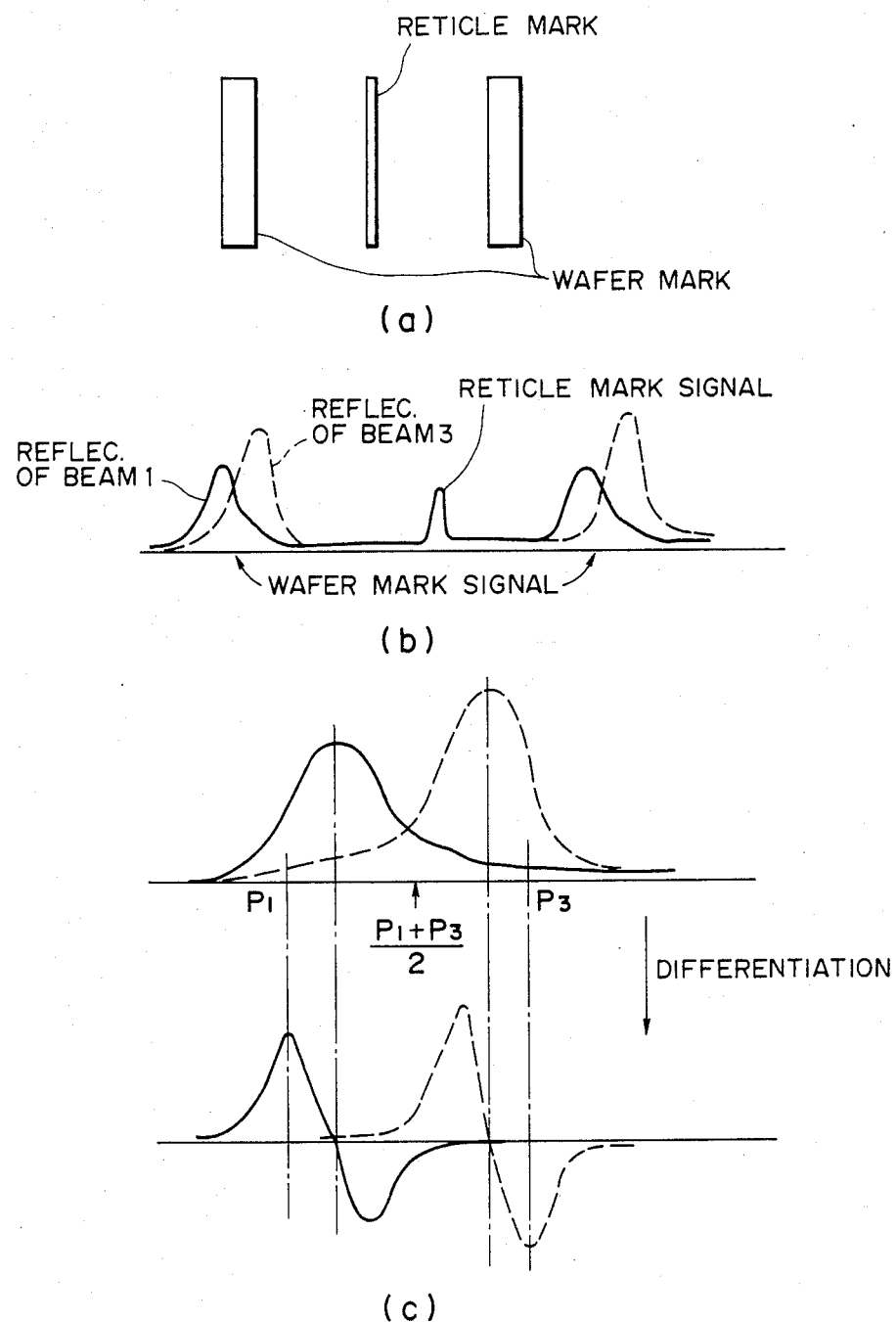

If, as described, an idealistic slit having an infinitely narrow slit width is used to receive the lights from the edges of the marks, there will be produced, as a result of the chopping, the waveforms of reflected lights as illustrated in FIG. 29 and corresponding to the edges of the marks. If, on the other hand, a slit having a definite slit width is used with the marks as illustrated in the part (a) of FIG. 32 so as to receive the lights reflected from the edges of the marks, then signals such as illustrated in the part (b) of FIG. 32 are obtainable from the marks as a result of the chopping. Subsequently, in accordance with the third method and as schematically illustrated in the part (c) of FIG. 32, the thus obtained signals are differentiated. As for the signal obtained in response to the irradiation with the beam 1, the maximum peak position P1 is detected. On the other hand, with regard to the signal obtained in response to the irradiation with the beam 3, the minimum peak position P3 is detected. Then, the midpoint between the positions P1 and P3, i.e. (P1+P3)/2, is determined as the mark position.

By determining the positions of the marks in the manner described, the amount of positional deviation from the real mark position can be detected.

While three types of position detection, based on the chopping, have been described, desired one may be adopted in accordance with the waveforms obtainable from the wafer mark.

Next, a description will be provided of the correction of the intensity of laser beam supplied from the wafer illumination system WL.

The light intensity correction is made, in this embodiment, so as to ensure a sufficient signal output level, not lower than a certain level, as well as a good S/N ratio whereby to assure high-accuracy alignment. In this regard, any change or degradation of the characteristics of the light source, of the optical arrangement and of the detector means, is an important problem. Particularly, in a case where plural light sources, plural optical systems and plural detectors are used to obtain alignment signals, such as in the present embodiment, the change or deterioration of the characteristics should be fully considered. Thus, to detect and correct suchchange or deterioration has a very important significance.

Figure 33:
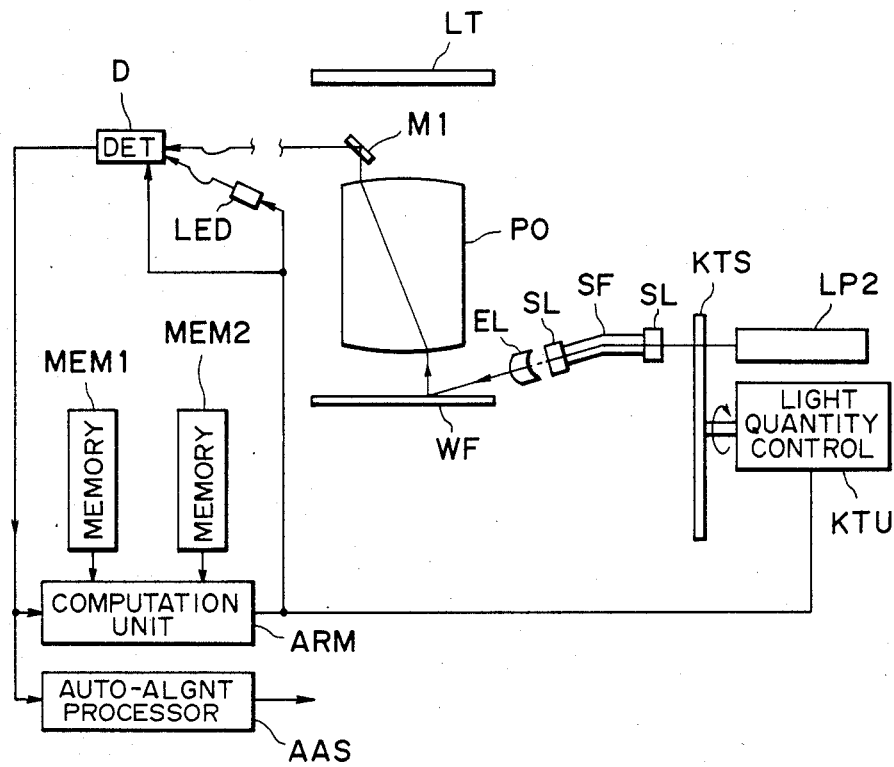
FIG. 33 is a schematic and diagrammatic view, for explicating correction of the quantity of a laser beam.

FIG. 33 is a schematic view of a light intensity correcting system included in the FIG. 17 embodiment.

In FIG. 33, denoted at LP2 is a light source which comprises, in this example, a laser. Denoted at KTS is a light intensity adjusting element. The adjusting element KTS may comprise an aperture stop or a turret having several neutral density filters of different transmission factors disposed circumferentially on a disk, provided that the light source LP2 is of the type producing non-polarized light. If, on the other hand, the light source LP2 is of the type producing polarized light, a polarization filter is also usable. Denoted at KTU is a control and drive unit for controllably driving the adjusting element KTS. In this example, the drive unit KTU is arranged to controllably drive the adjusting element KTS in a rotational direction. Denoted at MEM1 and MEM2 are memories which are preferably of the non-volatile type.

In the FIG. 33 example, the light intensity correction is executed in the following manner. First, the correction of the sensitivity of the detector is carried out in the manner described hereinbefore. Namely, the light emitting diode LED is activated under the influence of the computation unit ARM, and the light emitted from the diode LED is detected by the detector D. The output of the detector D is compared in the computation unit ARM with the value of the reference output having been stored in the memory MEM1. If the result of comparison shows the change of the sensitivity of the detector D, the computation system ARM operates to control the detector controlling circuit, not shown, to correct the sensitivity.

After completion of the sensitivity correction, a wafer WF which is a reference is placed at a predetermined position. Then, shutter means (not shown) which is provided within the illumination system comprising elements from the light source LP2 to the lens EL by way of the fiber SF, is opened so that the illuminating light is projected upon the wafer WF. The light incident on the wafer WF is reflected or diffracted by the wafer surface and the reflected/diffracted light is directed by the projection optical system PO to the detector D, whereby it is detected. The data obtained at the detector D is supplied to the computation system ARM and, in this system ARM, the data obtained by the measurement is compared with a reference data having been stored in the memory MEM2. On the basis of the comparison, the amount of correction of the luminacce at the light source side is calculated, and a corresponding instruction signal is applied to the control and drive unit KTU. In accordance with the supplied instruction signal, the control and drive unit KTU drives the adjusting element KTS so that it is rotated, in this example, to correct the luminance at the light source side. If necessary, the above-described correcting operation is repeated.

For the method of correction, in this example, both the sensitivity of the detector and the intensity of light from the light source side are corrected so that they are maintained at respective constant values. However, one of them may be adjusted relative to the other. While use of a laser as the light source is preferable, any other types of light sources are of course usable. Also, the light intensity adjusting element may be replaced by any one of suitable elements, and manner of driving the adjusting element may be modified in appropriate ways, if desired.

The concept of the light intensity correction in the present embodiment is significantly contradistinctive to the mere detection and correction of the luminance change on the light source side. According to the light intensity correction of the present embodiment, the correction is attainable much highly precisely. Further, the structure of the signal processing circuit can be made simple and compact. Moreover, the software can be made simple and the processing time can be reduced significantly.

In the following, a description will be provided of modified forms of the wafer mark detection according to the present invention.

First, with regard to the observing point on the wafer, it is not limited to "one". Namely, use of "single" objective lens is not an indispensable condition. Accordingly, two or more objective lenses are usable and, if they are used, the position of the wafer in the $\theta$ (rotational) direction as well as any magnification error can be measured at the same time as the detection of the position in the X and Y directions.

Further, as for the subject of observation, it is not limited to the wafer mark or marks associated with one shot area on the wafer. The wafer mark or marks associated with the next shot area can be observed simultaneously with the observation of the current shot area. Accordingly, even if only one objective lens is used, the rotational position of the wafer as well as the magnification can be measured without decreasing the throughput.

Figure 34:
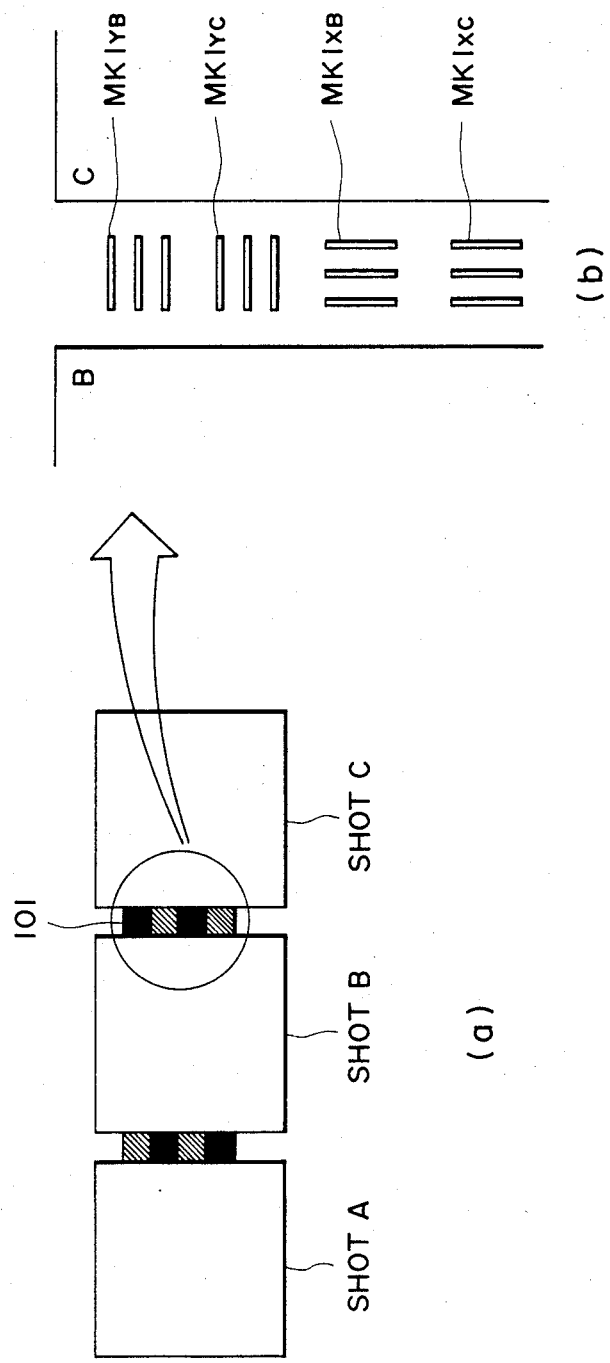
FIG. 34 shows an example in which wafer alignment marks associated with the next shot area are observed, at the same time.

FIG. 34 shows an example wherein wafer marks of a current shot area as well as wafer marks of the next shot area are observed at the same time. In the FIG. 34 example, a shot B is the current shot area while a shot C is the next shot area. Mark regions 101 are associated with the shot B, while mark regions 102 are associated with the shot C. These mark regions 101 and 102 are defined in an alternate fashion so that all marks in these regions are observed simultaneously. The alignment marks provided in these regions are illustrated in an enlarged scale in the part (b) of FIG. 34. As illustrated, mark $MK1_{YB}$ and mark $MK1_{XB}$ are formed in association with the shot B, while mark $MK1_{YC}$ and mark $MK1_{XC}$ are formed in association with the shot C.

Figure 35:
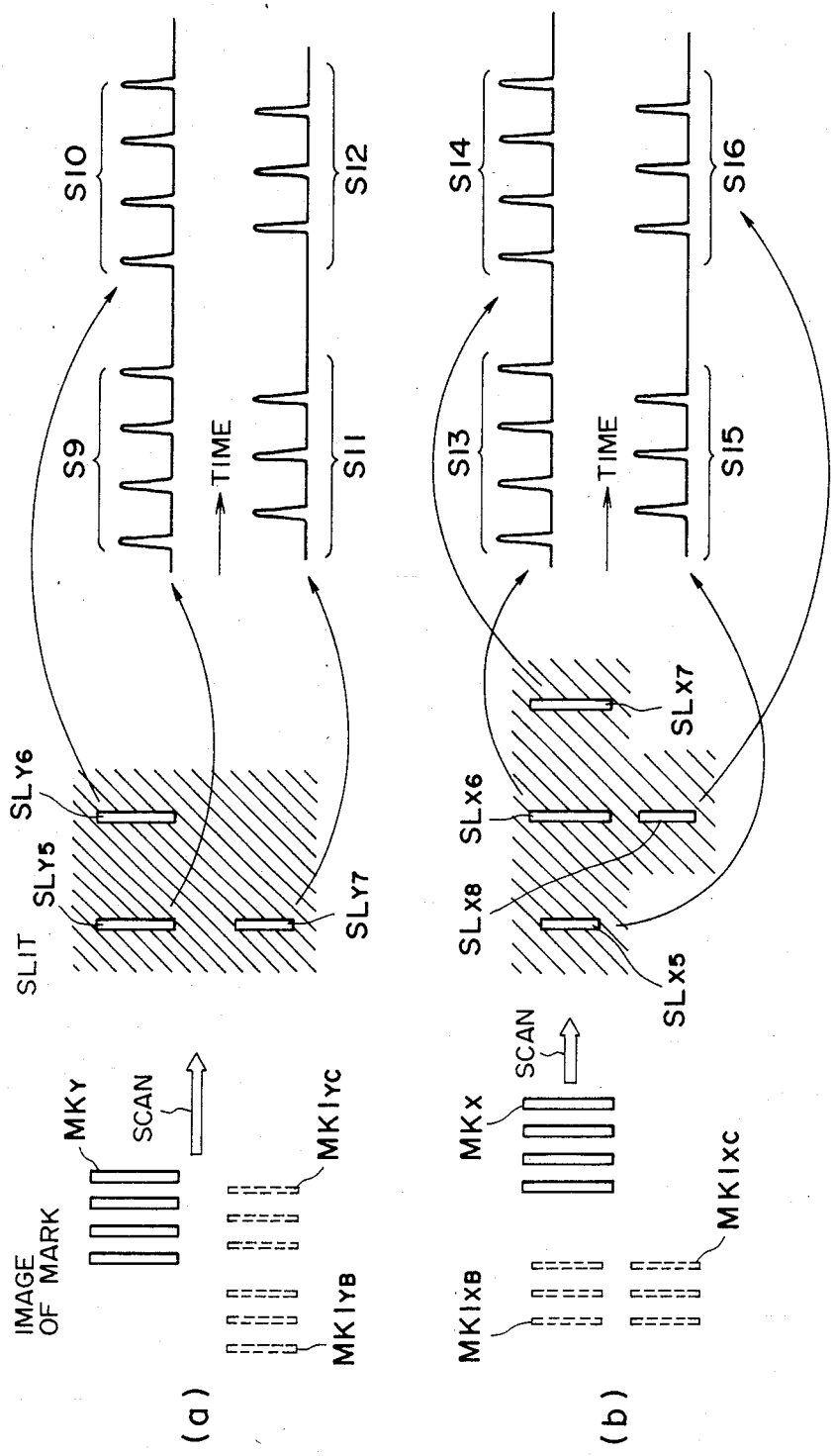
FIG. 35 is a principle view, for explicating the manner of light-reception through the slit means, for the alignment marks shown in FIG. 34.

When these marks are used and if images of these marks are scanned with slits provided at predetermined positions, then signals such as illustrated in FIG. 35 are obtainable. In the illustration of FIG. 35, the signals, the marks and the slits are in an interrelation such as follows:

(1) Signal S9: Detection signal obtainable by scanning the image of the reference mark $MK_Y$ with the slit $SL_{Y5}$.

(2) Signal S11: Detection signal obtainable by scanning the image of the wafer mark $MK1_{YC}$ with the slit $SL_{Y7}$.

(3) Signal S10: Detection signal obtainable by scanning the image of the reference mark $MK_Y$ with the slit $SL_{Y6}$.

(4) Signal S12: Detection signal obtainable by scanning the image of the wafer mark $MK1_{YB}$ with the slit $SL_{Y7}$.

(5) Signal S13: Detection signal obtainable by scanning the image of the reference mark $MK_X$ with the slit $SL_{X6}$.

(6) Signal S15: Detection signal obtainable by scanning the image of the wafer mark $MK1_{XB}$ with the slit $SL_{X5}$.

(7) Signal S14: Detection signal obtainable by scanning the image of the reference mark $MK_X$ with the slit $SL_{X7}$.

(8) Signal S16: Detection signal obtainable by scanning the image of the wafer mark $MK1_{XC}$ with the slit $SL_{X8}$.

These signals are used in the following manner:

On the basis of the signals S9 and S11, the positional deviation of the shot C in the Y direction is detectable.

On the basis of the signals S10 and S12, the positional deviation of the shot B in the Y direction is detctable.

On the basis of the signals S13 and S15, the positional deviation of the shot B in the X direction is detectable.

On the basis of the signals S14 and S16, the positional deviation of the shot C in the X direction is detectable.

Thus, the relative position of each of the shot B and the shot C with respect to the reference mark can be measured or detected.

It will be readily understood that any $\theta$-error and magnification error with respect to a particular shot (e.g. the shot B in FIG. 34) can be measured simply by (i) measuring the left-hand marks of the shot B at the same time as the measurement of the right-hand marks of the shot A and (ii) measuring the left-hand marks of the shot C at the same time as the measurement of the right-hand marks of the shot B. Accordingly, the measurement can be accomplished without decreasing the throughput.

Figure 36:
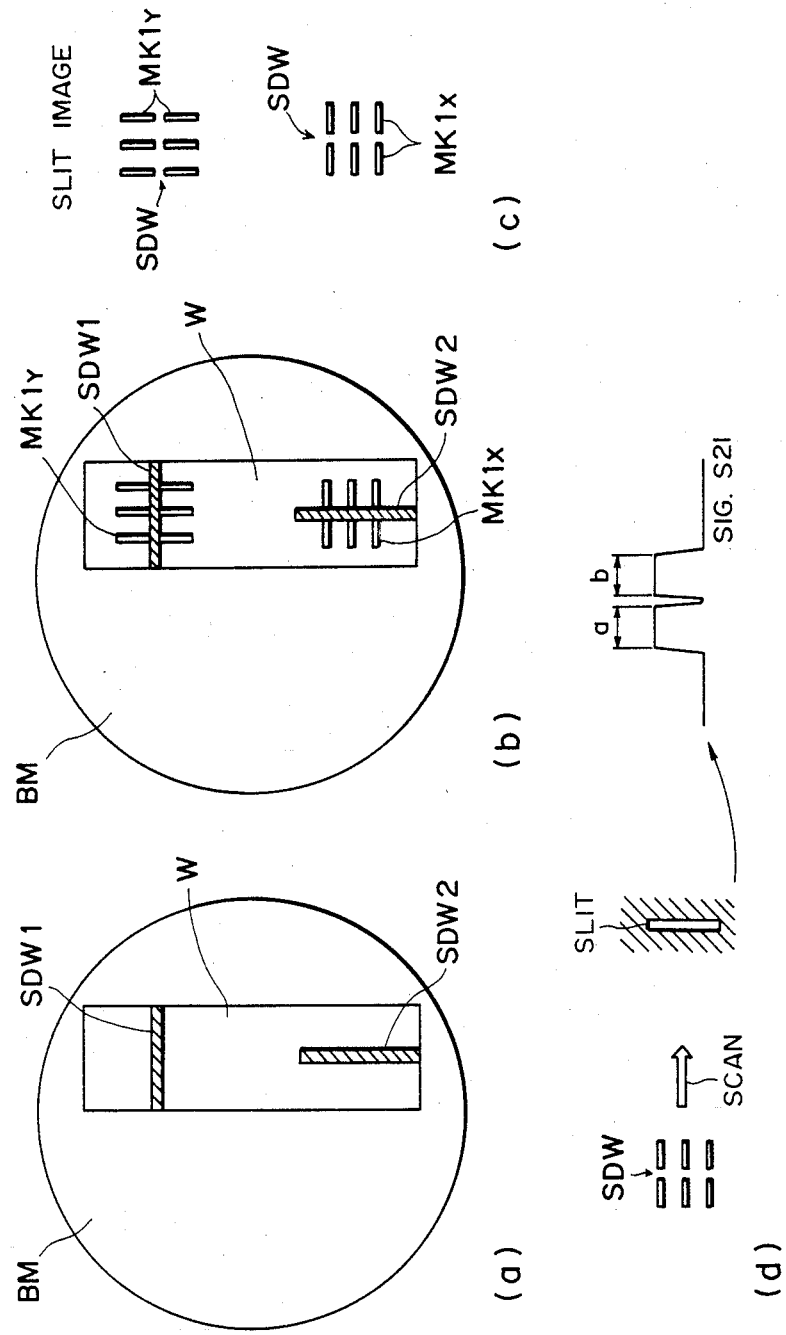
FIG. 36 is a principle view, explicating a case wherein a reference mask has a reference mark which is used in the form of a shadow mark.
Figure 38:
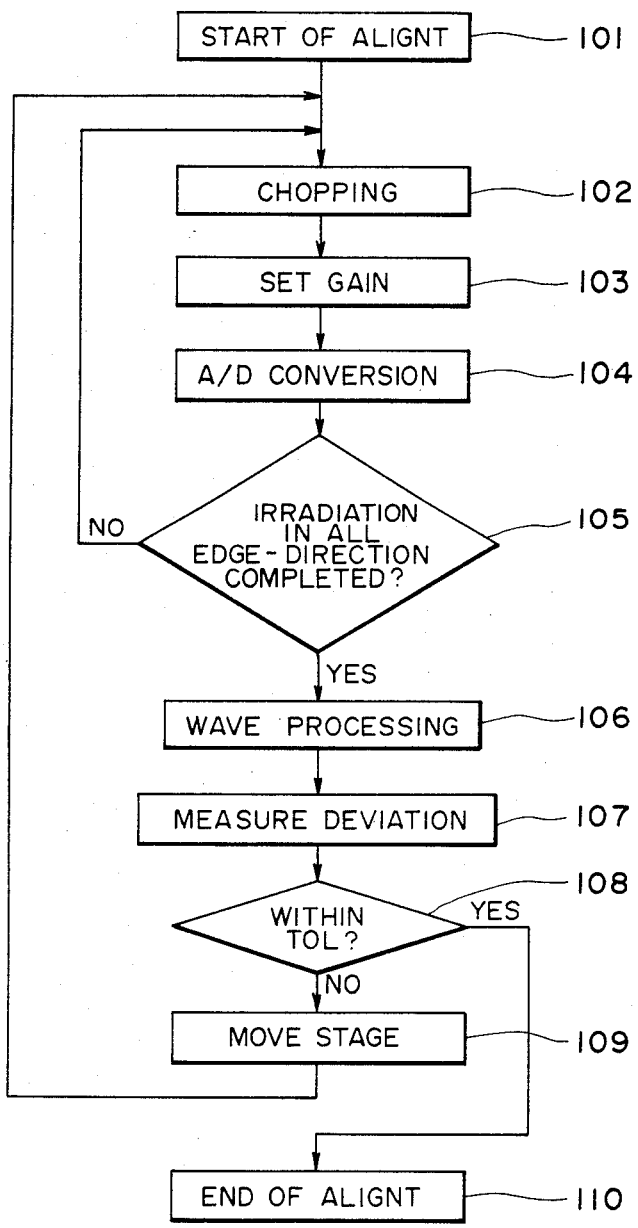
FIG. 38 is a flow chart, showing the alignment operation of the alignment system according to the FIG. 17 embodiment.

Referring now to FIG. 36, a description will be provided of a modified form of the reference mask having been described with reference to FIGS. 17 and 19. Briefly, the reference mask of the FIG. 36 example is usable to accomplish the relative alignment of the reference mask and the wafer without use of the illumination optical system BML (FIG. 19A).

The part (a) of FIG. 36 shows an appearance of the reference mask BM of this example. The reference mask BM has, formed therein, a light-transmitting window W adapted to allow passage of the image of the wafer mark. On the plane of the window W, there are provided shading members SDW1 and SDW2 which are made of a light-intercepting material and which are formed at positions effective to partially shade or block the image of the wafer mark when it passes through the window W. The partial shading of the wafer mark image by the shading member SDW1 and SDW2 is best seen in the part (b) of FIG. 36. As illustrated in this part, the shading member SDW1 is effective to partially shade or block the wafer mark image $MK1_Y$, while the shading member SDW2 is effective to partially shade or block the wafer mark image $MK1_X$. By these shading members "shadows" are defined in the wafer mark images. The wafer mark images obtained as a result of such shading and being observable on the surfaces of the slit members $SL_X$ and $SL_Y$ (FIG. 17) are illustrated in the part (c) of FIG. 36. In the illustration of the part (c), the reference characterers SDW denote the shaded portions of the wafer mark images $MK1_Y$ and $MK1_X$, defined by the shading members SDW1 and SDW2, respectively.

When the mark images shown in the part (c) of FIG. 36 are scanned, in the direction of arrow shown in the part (d) of FIG. 36, with the slits $SL_X$ and $SL_Y$ (FIG. 17) under the influence of rotation of the polygonal mirror PM, there are produced at the detectors $D_X$ and $D_Y$ signals corresponding to the wafer mark images $MK1_X$ and $MK2_Y$ being partially shaded. One of such signals is schematically illustrated at S21 in the part (d) of FIG. 36. It is seen that in the waveform of the signal S21, there is a decreased level portion corresponding to the shaded portion SDW. Therefore, by use of the signal S21, the relative position of the wafer mark $MK1_X$ ($MK1_Y$) and the reference mask BM (more particularly its shading member SDW1 or SDW2) is detectable. Namely, from the difference between the widths of the high-level portions a and b of the signal S21, the positional error of the wafer mark with respect to the reference mask can be detected. In this respect, the shaded portion SDW can be considered as a "reference mark" which is defined on the plane of the slit member with respect to the wafer mark image $MK1_Y$ ($MK1_X$) Also, in this sense, each shaded portion can be called "shadow mark". It will be understood that, for the marks to be provided on the wafer, the mark $MK1_X$ which is to be used for the position detetion in the X direction may comprise one or more mark elements extending in the X direction, while the mark MK1Y which is to be used for the position detection in the Y direction may comprise one or more mark elements extend in the Y direction.

Referring now to FIG. 37, the chopping operation will be described in detail.

FIG. 37 shows the general arrangement of the FIG. 17 embodiment in a diagrammatic view. Prior to the detection of wafer position, the alignment mark provided on the reticle LT is photoelectrically detected by the photoelectric detection system DM, whereby an electric signal corresponding to the reticle mark is produced. On the other hand, the alignment mark of the wafer WF is illuminated by the laser beams from the wafer illumination systems WL in the manner of chopping controlled under the influence of a chopping circuit CHP. The illuminated wafer mark is photoelectrically detected by a photoelectric detection system DW with the aid of the projection lens system PO, whereby an electrical signal corresponding to the wafer mark is produced. This signal corresponding to the reflected light from the wafer mark and photoelectrically obtained at the photodetector DW is supplied to a term detecting circuit SC which is operationally synchronized with chopping circuit CHP. By this term detecting circuit SC, the term for detecting the signal from the photodetector DW is determined. Subsequently, the signal corresponding to the wafer mark is supplied to analog-to-digital converter (hereinafter "A/D converter") ADC whereby it is converted into a digital signal which, in turn, is applied to a wave memory WBM, and therein. In this manner, electrical signals corresponding to all the edges of the mark are obtainable. When they are obtained, a digital signal processor DSP operates to execute high-speed signal proccessing to determine the mark position. Then, in a central processing unit CPU, the amount of positional deviation is calculated. In accordance with the result of calculation, a motor MO is controlled and the X-Y stage WS is moved to accomplish the alignment.

The flow chart of 38 shows the flow of the alignment operation using the chopping, to be executed in the present embodiment. The alignment operation starts at Step 101. Then, at Step 102, the chopping operation is effected. Step 103, the gain setting is executed with respect the signals corresponding to the mark edges, as to prevent overflow of the A/D converter. At step 104, the mark signal is converted into a digital signal, which is, in turn, stored into the memory. At Step 105, discrimination is made as to whether or not the signals corresponding to all the edges of the mark have been obtained. If not, a further chopping operation is effected and the other operations described above are repeated. If all the edges of the mark have been detected, the sequence goes to Step 106 whereat the signal waveforms stored in the memory are subjected to the waveform processing as described in the foregoing, whereby the mark position is determined. Then, at Step 107, the amount of positional deviation is calculated. On the basis of the result of calculation, discrimination is made at Step 108 as to whether or not the deviation is less than the tolerance. If not so, the sequence goes to Step 109 whereat the stage is moved to adjust the wafer position. If, on the other hand, the tolerance is satisfied, the sequence goes to Step 110, such that the alignment operation is accomplished.

Next, a description will be provided of the automatic alignment using a He-Ne laser and on the basis of image processing.

Figure 39:
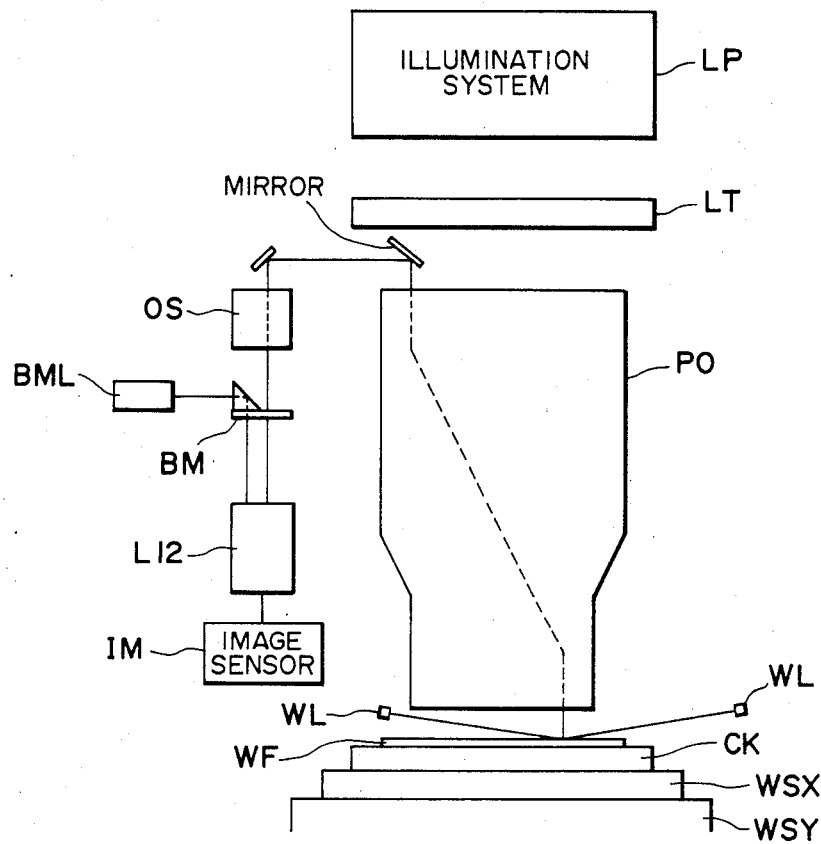
FIG. 39 is a schematic illustration showing an automatic alignment system for executing the alignment on the basis of image processing.
Figure 40:
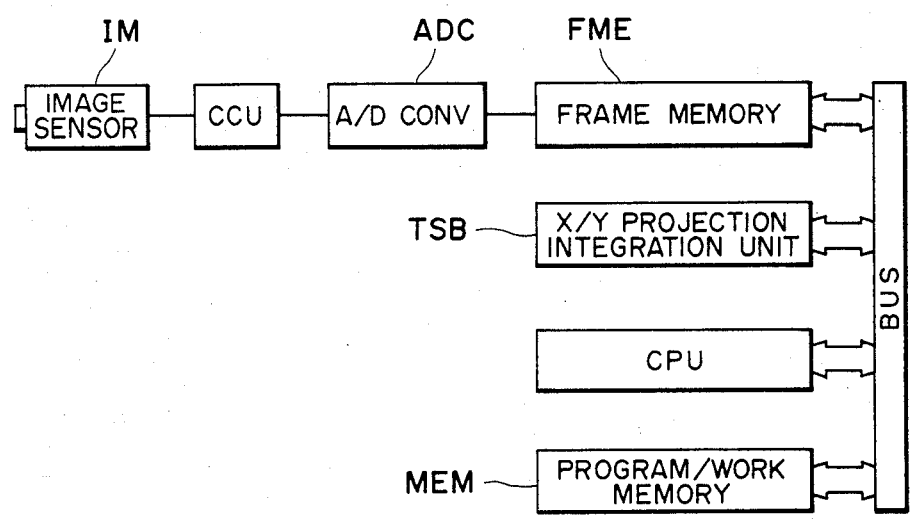
FIG. 40 is a block diagram of the alignment system shown in FIG. 39.
Figure 41:
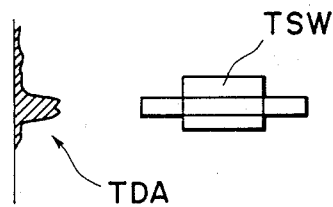
FIG. 41 is a principle view, explicating a projection-/integration window and the data obtained thereby.

Schematically and diagrammatically illustrated in FIG. 39 is an example of an automatic alignment system based upon the image processing. In this example, marks each comprising rectilinear pattern elements such as illustrated in FIGS. 18 and 19B are used. Details of the image processing portion is illustrated in a block diagram of FIG. 40. An image of the wafer as illuminated by the wafer illumination systems WL each including a He-Ne laser is converted into electrical signals by means of an image sensor IM such as, for example, an ITV camera, a solid image pickup device, etc. In this example, the image sensor IM comprises an image pickup device having charge coupled devices (CCD). These electrical signals are supplied to an A/D converter ADC into digital signals which are, in turn, stored into a frame memory FME in the form of digital image data. For the image processing, the present embodiment makes use of the directionality of the linearly extending mark elements of the mark used. For this purpose, an X/Y projection integration unit TSB is provided. In this projection integration unit TSB, as schematically illustrated in FIG. 41, the digital image data is subjected to projection integration in the X or Y direction by use of a projection integration window TSW. That is, only a desired lengthwise portion of the image data is projected and integrated in the X or Y direction, with the result that a projected data TDA is obtained. By calculating the center of gravity of the thus obtained projected data TDA, the amount of relative deviation between the mark of the reference mask and the mark of the wafer is determined. Since, in this embodiment, the illuminating lights for the wafer position detecting purpose is projected upon the wafer from between the projection optical system and the wafer, as described in the foregoing, the adverse effect of the interference due to the existence of the resist coating is substantially fully avoided. Accordingly, substantially no interference fringe is included in the image obtained as a result of observation. For this reason, according to the present embodiment, only the calculation of the center of gravity of the projected and integrated data can determine the positional deviation sufficiently precisely. Accordingly, except for the portion effecting the X/Y projection integration, such as shown in FIG. 40, it is not necessary to use a specific and complicated hardware. Therefore, the deviation can be measured quickly and accurately.

Referring back to FIG. 28, when the beam 1 and the beam 3 are projected at the same time, the reflected light from the linear mark comprises a component corresponding to the sum of the reflected lights A1 and A3 and a component corresponding to the sum of the reflected lights B1 and B3. For this reason, in the image processing described above, it is possible that the magnitude "A1+A3" and the magnitude "B1+B3" do not balance, depending on the intensity of the beam 1, the intensity of the beam 3 and the diffraction efficiency of each of the lights A1, A3, B1 and B3.

Figure 42:
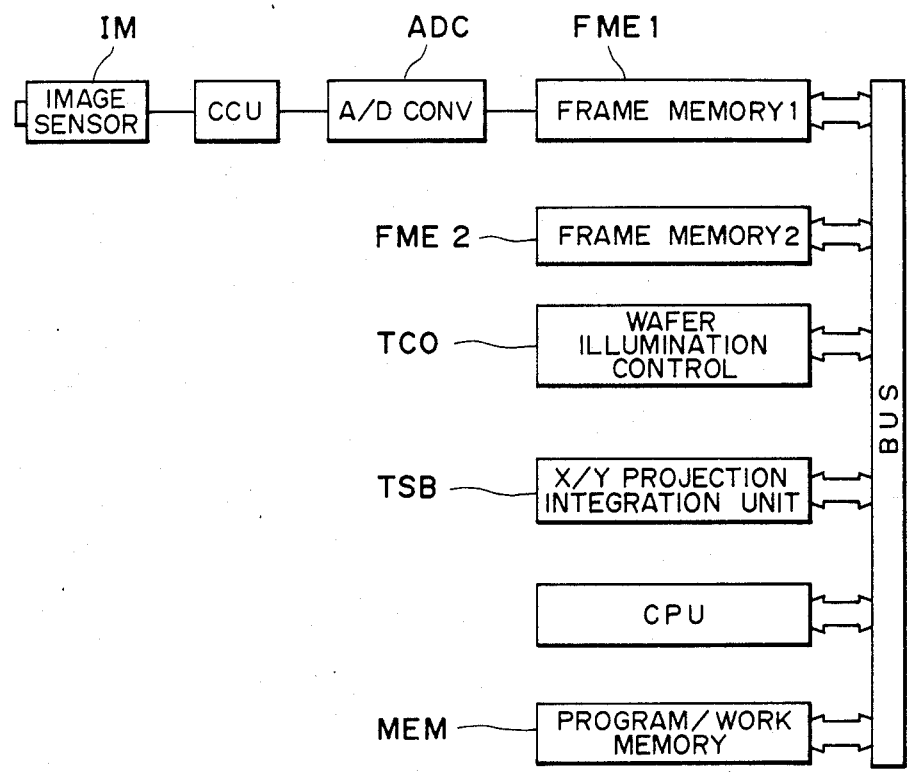
FIG. 42 is a block diagram showing another example of automatic alignment system adapted to execute the alignment on the basis of image procesing.

To avoid such inconvenience, the arrangement such as illustrated in FIG. 42 is preferable. In this example, the frame memory FME of the FIG. 40 example is replaced by two frame memories FME1 and FME2, and an illumination control block TCO for controlling the four wafer illumination systems WL is added.

In operation, first the beam 1 (FIG. 28) is projected while the beam 3 is blocked, and the image data is stored into the frame memory FME1. Subsequently, the beam 3 is projected while blocking the beam 1, and the image data is stored into the other frame memory FME2. For each frame memory, the calculation of the center of gravity is carried out in the manner described with reference to FIGS. 39-41, so that the deviation is determined. Further, calculation is made to detect an average of the data as obtained by the projection of the beam 1 and the data as obtained by the projection of the beam 3. By this, the abovedescribed inconvenience can be avoided. It is a possible alternative to (i) change the data as obtained by the projection of the beam 1 and the data obtained by the projection of the beam 3 so that the peak values in these data become substantially equal to each other, and then to (ii) apply the above-described method to such data as obtained by adding the data produced by the projection of the beam 1 to the data produced by the projection of the beam 3. Substantially the same effect is attainable in this case.

Next, a description will be provided of the reticle alignment.

As for the method of aligning the pattern of the reticle and the pattern of the wafer, it can be classified into two types. One is a method wherein the reticle pattern and the wafer pattern are directly and simultaneously detected and, on the basis of the detection, they are aligned with each other. This is called in this Specification "direct alignment method". In this case, whatever position the reticle is resting on, although the reticle position should be within a certain limited range, what is required is to align the wafer pattern with the reticle pattern. Therefore, it is not necessary to align the reticle itself with high accuracy.

The second aligning method is that, first, the reticle position is accurately adjusted with respect to a certain alignment reference provided on the apparatus side and, subsequently, the wafer pattern is aligned with respect to another alignment reference which is provided on the apparatus side and which is exactly in a predetermined positional relation with the alignment reference for the reticle. By aligning the reticle pattern and the wafer pattern indirectly as described, the reticle-to-wafer alignment is accomplished This is called "indirect alignment method".

In the latter case, any alignment error of the reticle with respect to its reference provided on the apparatus side, directly leads to the alignment error between the reticle and the wafer. It is therefore necessary to align the reticle with the reference with high accuracy.

For such reticle alignment as required at the time of setting the reticle upon the apparatus, a laser beam scan process has been used. The laser beam scan process is a method wherein an alignment mark is scanned by a laser beam at a constant speed and reflectively diffracted light from an edge of the mark is received on the plane of Fourier transform and, on the basis of which, the relative positional deviation is detected with high accuracy.

In order to execute the direct alignment method, the reticle alignment as described is effected and, thereafter, the reticle and the wafer are observed by use of a common optical system, the two members being aligned in accordance with the result of such observation.

Figure 43:
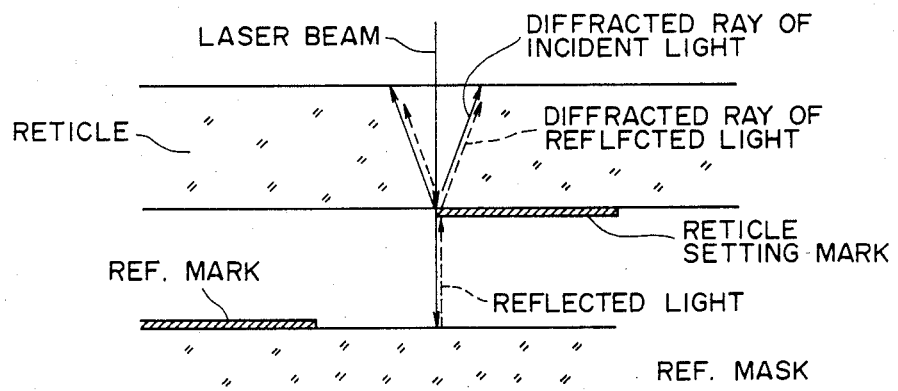
FIG. 43 is a schematic view showing the manner of reticle alignment according to the prior art.

On the other hand, in order to indirectly align the two members while using any alignment reference intervening therebetween, in other words, in order to accomplish the indirect alignment method by use of the laser beam scan process for the reticle alignment, the following problems should be considered (in this connection, see FIG. 43).

(1) There occurs a noise due to the speckle of the laser beam (coherent light).

(2) Since the reflectively diffracted light from the reticle pattern is used as a signal, only a decreased signal output is attainable where the reticle pattern is formed of a material having a low reflection factor. If this occurs, it is not easy to detect the signal.

(3) Usually, at the time of reticle alignment, a reticle setting mark provided on the reticle and a reference mark provided on the apparatus side are spaced from each other by a predetermined gap. If, however, the magnitude of such gap changes for any reason, the optical path length for the signal light changes, which results in optical interference causing waveform distortion. As a result, the signal output changes.

Of these problems, the effect of interference is inevitable because of the use of the laser beam. This is a bar to the accomplishment of the reticle alignment of much higher accuracy.

Examples of the reticle alignment having considered the above-described problems, will now be described taken in conjunction with the drawings.

Figure 44:
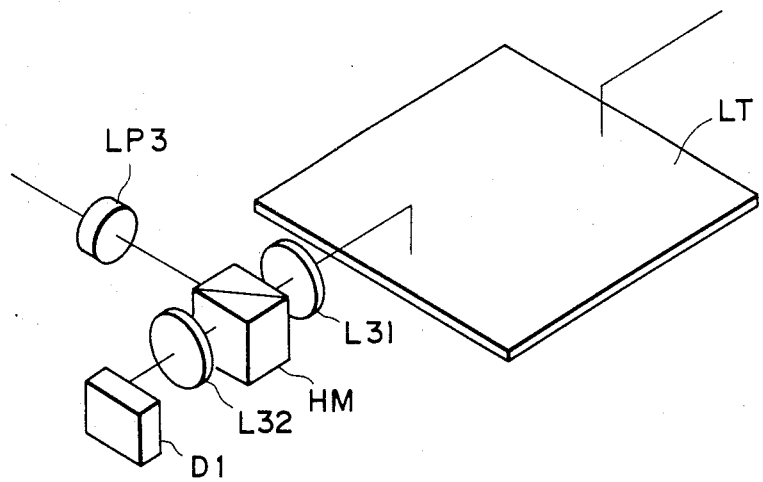
FIG. 44 shows a reticle alignment detecting system to which an direct method is applied.

FIG. 44 shows an example of a reticle alignment detecting system using the indirect alignment method. The detection system of this example is definitely placed in a predetermined positional relation with the reference mark BM (FIG. 17). The illumination system LP3 is effective to illuminate, by way of a half mirror HM, one of alignment marks (not shown) provided on the reticle LT. An objective lens L31 cooperates with an imaging lens L32 to form an image of the reticle alignment mark upon a detector D1. The detector D1 comprises an image sensor such as aXn image pickup tube or a CCD sensor. The detector D1 is operable as a positional reference for the reticle alignment purpose. Since the predetermined relative positional relation is assured between the referece mark BM and the detector D1, it is sufficient for the alignment operation to align the reticle LT with the detector D1 and, on the other hand, to align the wafer WF with the reference mark BM. With such structure, however, there still remains a problem of poor contrast.

Figure 45:
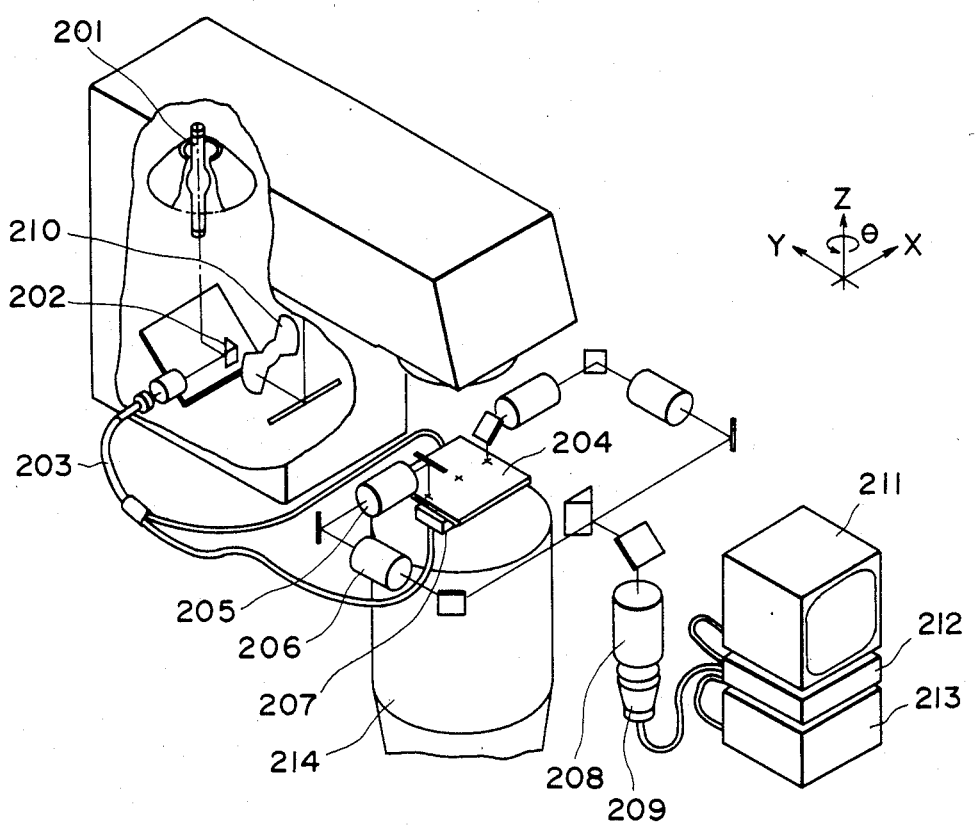
FIG. 45 is a perspective view schematically showing a reticle alignment detecting system according to the present embodiment.
Figure 46:
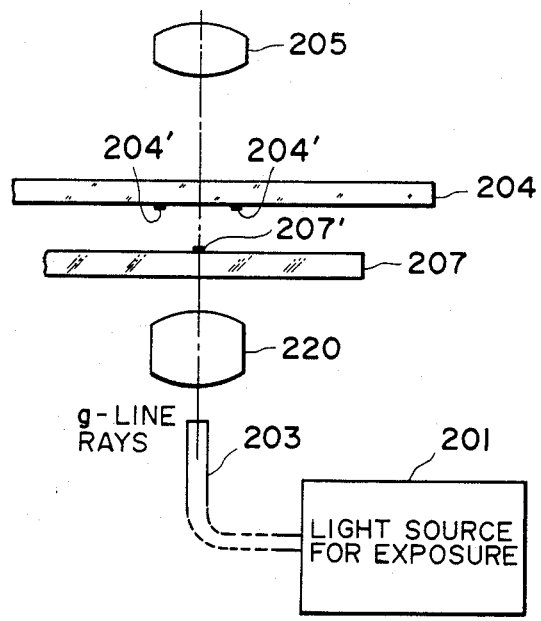
FIG. 46 is a schematic view, illustrating the manner of transmitted illumination of a mark portion.
Figure 47:
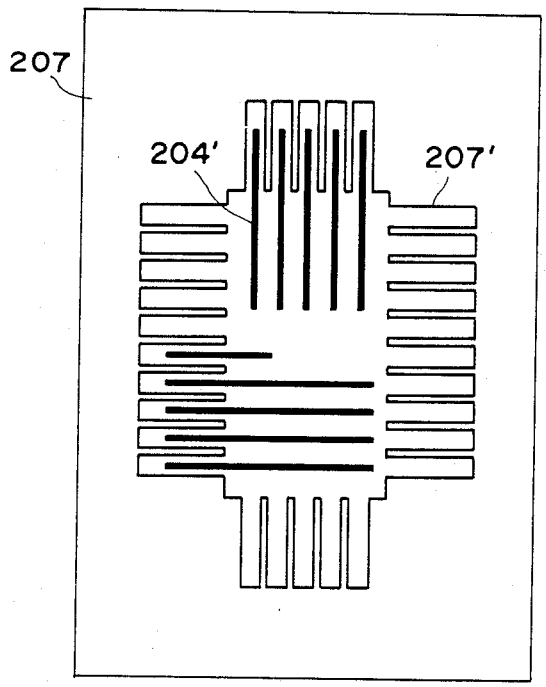
FIG. 47 is an enlarged top plan view showing an example of alignment mark.

Referring now to FIGS. 45–47, the reticle alignment process adopted in the present embodiment will be described.

In FIG. 45, a Hg lamp 201 is used as a light source. Of the light produced by the Hg lamp 201, g-line rays are selected or extracted by use of a pickup mirror 202. The thus extracted light is guided by an optical fiber assembly 203 to the major portion of the apparatus. The fiber assembly 203 is mounted so as to direct the light to an illumination optical system 220, such that the same illuminates the reticle reference mark 207' from the below. The reticle reference mark is provided on a glass plate 207. By the light from the illumination optical system 220, the reticle reference mark 207' and a reticle alignment mark 204', provided on the reticle 204 spaced by a predetermined gap from the glass plate 207', are illuminated from the plate 207 side in the transmitted ilumination manner. The reticle reference mark and the reticle alignment mark are imaged upon an image sensor 209 such as a CCD camera or an image pickup tube, with the aid of an objective lens 205, a relay lens 206 and an erector lens 208. Actually, in the present embodiment, the reticle 204 is provided with two alignment marks, while the glass plate 207' is provided with two reference marks. On the image pickup surface of the image sensor 209, a combined image of these marks are formed, as will be readily understood from FIG. 45. The thus obtained image is processed in a computer 213, whereby relative positional deviation between these marks is detected. The data obtained as a result of the deviation detection is supplied to a reticle stage driving system (not shown) to correct the positional error of the reticle in the X, Y and θ directions. By this, the reticle 204 is accurately aligned with the apparatus. In FIG. 45, denoted at 214 is the projection lens system and, at 210, is a rotary shutter for controlling the exposure.

FIG. 46 is a sectional view schematically showing the manner of transmitted illumination of the mark region, and FIG. 47 is a view showing details of the reticle reference mark and the reticle alignment mark used as an example.

The reticle alignment process of this example has advantages and practically enables the reticle alignment with very high accuracy.

(1) Even if the gap between the reticle reference mark 207' and the reticle alignment mark 204' changes, no interference occurs because the light from the light source 201 is incoherent. This assures a constant signal output.

(2) Because of the transmitted illumination, a mark image of good contrast is obtainable. Also, the contrast is not affected provided that the material used for the patterning of the reticle has a light-intercepting property. Therefore, the replacement of the reticle hardly causes the change in the signal output.

(3) Because of the detection of the positional deviation on the basis of the image processing, there is a high flexibility with regard to the configuration of the mark. For example, it is possible to shape the mark so that it bears a greater amount of information as compared with the traditionally used mark.

As described in the foregoing, much higher accuracy as ompared with the accuracy attainable with the conventional reticle alignment process, can be attained. Thus, the reticle can be aligned with its reference with much higher accuracy, which means that the reticle and the wafer can be aligned with much higher accuracy.

The reticle alignment process using the transmission type illumination will now be described in more detail.

Figure 48:
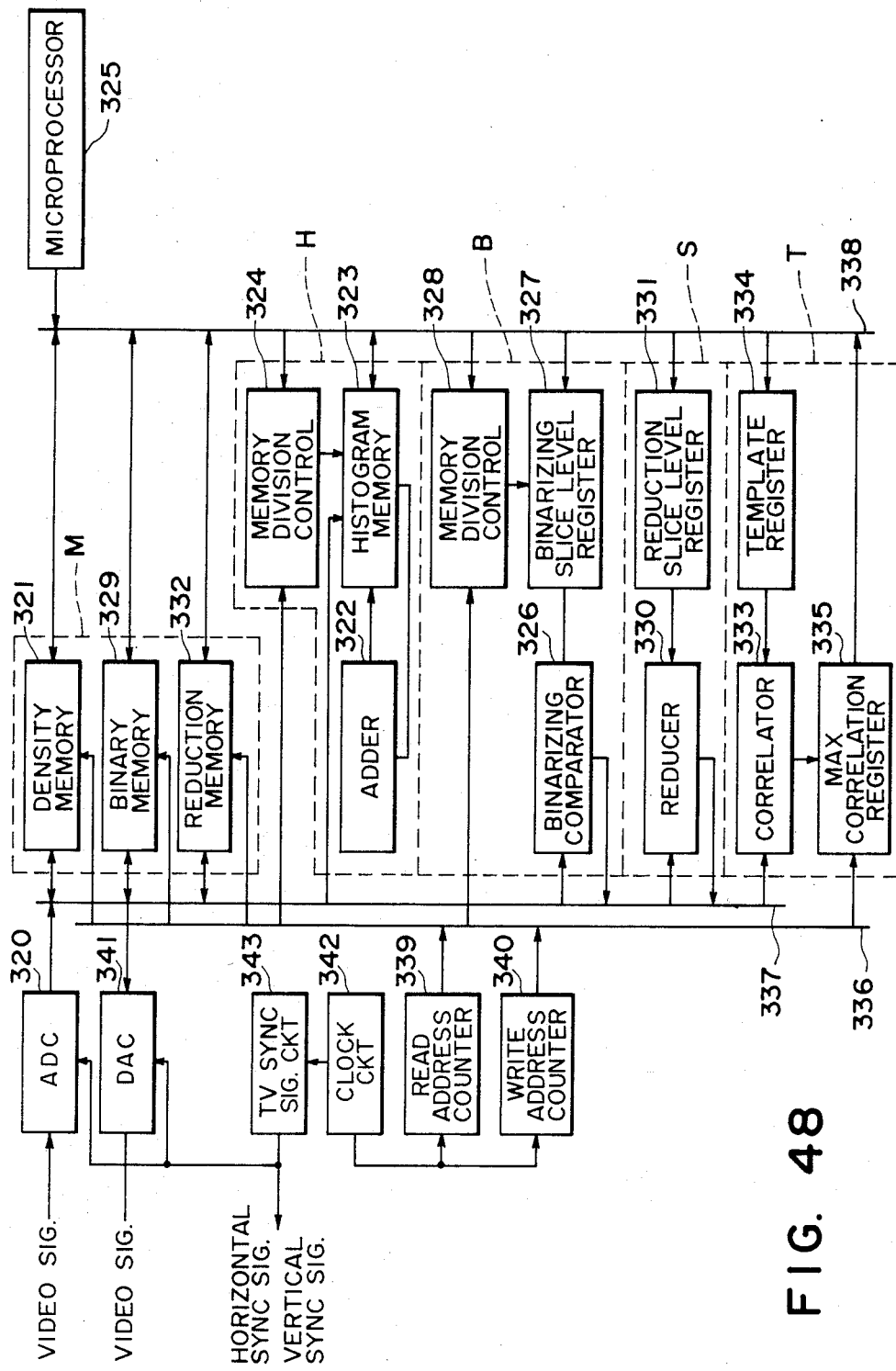
FIG. 48 is a block diagram of a hardware portion of the position detecting device.

FIG. 48 shows the hardware of the position detecting device arranged so as to execute the reticle alignment process described with reference to FIG. 45.

The position detecting system includes an analog-to-digital converter 320 (hereinafter "A/D converter") which is adapted to convert a video signal, in the form of an analog signal, supplied from a video signal control 212 (FIG. 45) connected to the image sensor 209, into a digital signal of 256-gradation. The system further includes an area image-density memory 321 (hereinafter "density memory") for storing therein the digital signal. The input image as obtained by the image pickup device (image sensor) for the position detection purpose, is subjected to the analog-to-digital conversion and, thereafter, is stored into the density memory 321.

First, the portion for coarse detection will be described.

Figure 49:
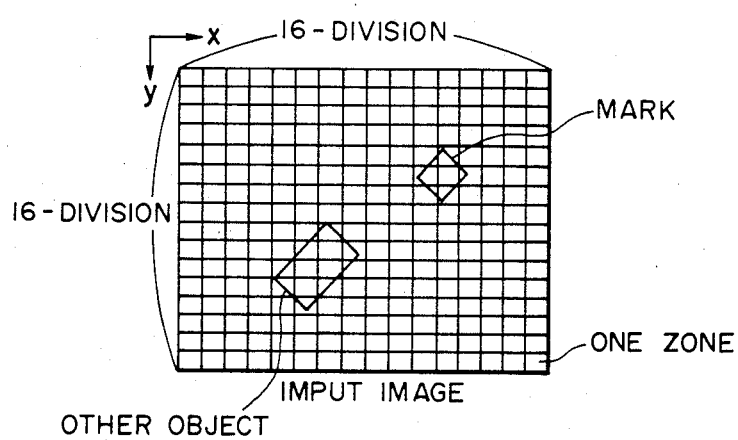
FIG. 49 is a schematic view showing an example of division of a memory, for vinarization.

The block H shown in FIG. 48 denotes a histogram processor. The block H includes an adder 322 for adding the data from the density memory 321; a density histogram memory 323 (hereinafter "histogram memory") for storing therein the added output; and a memory division control circuit 324 operable to control the address of the histogram memory 323 so as to divide the density memory 321 into plural zones and to extract the density histogram with respect to each of the zones. The density memory 321 is divided in the manner such as, for example, shown in FIG. 49. In this example, the density memory 321 is divided into sixteen (16) zones with respect to the X direction, and also is divided into sixteen (16) zones with respect to the Y direction. Hereinafter, such division as illustrated is referred to as "16×16 division". In the histogram processor H, the density memory 321 is divided under the influence of the memory division control circuit 324 in response to an instruction signal, instructing "m×n division", supplied from a microprocessor 325 and in accordance with the number of zones to be defined by the division. Also, for each of the zones, the density histogram is extracted and the thus extracted density hitogram is stored in the histogram memory 323.

The microprocessor 325 is operable as a binarization threshold calculating unit. In this calculating unit 325, a binarization threshold is calculated with respect to each of the density histogram data extracted by the histogram processor H in relation to the plural (e.g. 16×16) zones, respectively. For this calculation, the discriminating threshold selection method (a method of bisecting bimodal histogram at the maximum of dispersion), a P-tile method or the like may be used. For the discriminating threshold selection method and the P-tile method, details are discussed by M. Nagao "4-1 Binarization and Threshold Processing", Image Recognition, published by Corona-sha, Japan.

The block B in FIG. 48 denotes a binarization processor. The block B includes a binarization comparator 326 for binarizing the data supplied from the density memory 321; and a binarization slice level register 327 for storing therein a slice level (binarization threshold) for the binarizing comparator 326. The binarization threshold for each zone of the density memory 326 as calculated by the binarization threshold calculating unit is stored into the resistor 327. Also, there is provided a memory division control circuit 328 adapted to control the binarization slice level register 327 so as to divide the density memory 321 and also to execute the binarization for each of the zones of the density memory. The memory division control circuit 328 may be used also as the division control circuit 324 of the histogram processor H. The data having been binarized by the binarization processor B is stored into area binarization memory 329 (hereinafter "binary memory").

By use of the above-described histogram processor H, the binarization threshold calculating unit of the microprocessor 325 and the binarization processor B, the binarizing processing for each zone of the density memory is carried out. This enables adaptable binarization without being affected by the size of the mark, the brightness of illumination and the like.

The block S in FIG. 48 denotes a reducing and smoothing processor. The block S includes a reducing and smoothing circuit 330 operable to extract, out of the binary image data stored in the binary memory 329, a region containing picture elements of a number "n×n" (e.g. 4×4) and to compress these picture elements into one picture element. The block S further includes a reduction slice level register 331 for storing therein a reduction threshold (which will be described later) of the reducing and smoothing circuit 330.

Figure 50:
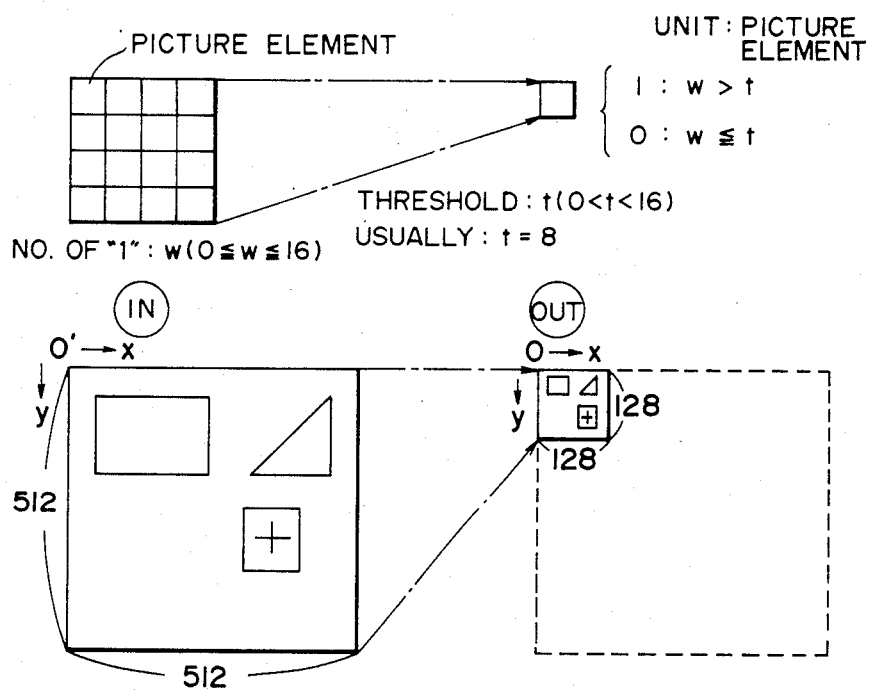
FIG. 50 is a principle view, for explicating the manner of reduction and smoothing.

The reducing and smoothing function of the reducing and smoothing processor S will now be described. FIG. 50 shows a case where the "4×4" picture elements are compressed into one picture element. In this Specification, such reduction as illustrated is referred to as a "reduction rate ¼". In a case of the reduction rate ¼ the sixteen (16=4×4) picture elements of the input binary image data supplied from the binary memory 329 are examined. More specifically, the number w of those of the sixteen picture elements, each bears data "1", is counted. Then, the counted number w is compared with the reduction threshold t.

If $w > t$, the sixteen picture elements being examined are compressed into one picture elements having data "1".

If $w \leq t$, on the other hand, the sixteen picture elements being examined are compressed into one picture element having data "0".

In this manner, binary image data of "512×512" picture elements can be compressed or reduced into a binary image data having for, example, "128×128" picture elements such as illustrated in FIG. 50. By suitably selecting the reduction threshold t, the noise can be removed and the configuration of the subject can be refined. The reducing and smoothing such as described above is effective as a pre-processing for the template matching, in the points described below. Namely, if the template matching is carried out to the binary image having been subjected to the reducing and smoothing process, there are the following advantages:

(1) A small-size template having a smaller number of picture elements can be used. Also, only for a narrow range, the execution of the template matching is necessary. Accordingly, it is not necessary to use a large memory capacity. As a consequence, the hardware can be made compact and the processing time can be reduced.

(2) Noisy components in the image data of the subject (e.g. mark) can be removed. Also, the configuration of the subject is refined. Therefore, the detection rate and the detection accuracy by the template matching can be improved significantly.

The reducing rate and the reduction threshold t can be specified as desired by the microprocessor 325 in accordance with the size of the subject (i.e. mark) and the state of the input image. The binary image data after the reducing and smoothing operation is stored into a reduction area binary image memory 332 (hereinafter "reduction memory").

The block T in FIG. 48 denotes a template matching processor. The block T includes a correlator 333 having a capacity of "32×32" picture elements; and a template register 34 for storing therein reference template groups. The template data as designated by the microprocessor 325 and the data from the reduction memory 332 are compared and checked by the correlator 333. When the degree of correlation as outputted from the correlator 333 becomes maximum, such degree of correlation as well as the address of the reduction memory 332 are stored into a maximum correlation register 335. By multiplying this address by an inverse number of the reducing rate (e.g. four in the case of the reducing rate ¼), the coordinate position of the subject in the input image can be determined with an error or tolerance of ±4 picture elements. The thus determined position is called "coarsely detected position".

The image memory block denoted at M in FIG. 48 and including the density memory 321, the binary memory 329 and the reduction memory 332, as well as the processors corresponding to the blocks H, B, S and T are communicated with an image address bus 336 and an image data bus 337. Also, the blocks M, H, B, S and T are communicated by way of a data bus 338 with the microprocessor 325. These image memories and the registers of the processors are "readable" and "writable" under the influence of the microprocessor 325.

The position detecting device further includes a read address counter 339 adapted to produce address at the time of displaying the data of the image memory on a monitor TV or, alternatively, at the time of read-out of the data of the image memory during the operation of each processor (image processing operation). The position detecting device further includes a write address counter 340 operable to produce address at the time of writing, into the density memory 321, the digital image data having been subjected to the analog-to-digital conversion by the A/D converter 320, or at the time of writing the image data into the image memory during the image processing operation.

Further, there are provided a digital-to-analog converter (DAC) 341 for converting the digital image data, having been stored in the image memory block M, into analog video signals to be displayed in the monitor TV; a reference clock producing circuit 42; and a TV synchronization signal producing circuit 343 operable to produce TV horizontal synchronization signals, vertical synchronization signals, blanking signals, etc. on the basis of the reference clocks supplied from the reference clock producing circuit 342.

Next, a description will be provided of a fine detection portion of the position detecting device according to the present embodiment.

For the fine detection, the microprocessor 325 is operable as a second-binarization threshold calculating unit. In this second-binarization threshold calculating unit, such zones, of the zones defined by the division having been made during the coarse detection processing, that are in the neighborhood of the coarsely detected position are extracted on the basis of the coarsely detected position. Each of the thus extracted zones is further divided into plural zone segments, and binarization thresholds for these zone segments, respectively, are determined. For this purpose, the binarization thresholds of the above-described extracted zones, having been calculated during the coarse detection processing, are used and, in accordance with the interpolation, the binarization threshold for each of the zone segments is approximatingly calculated by the microprocessor 325. The extent or number of zones to be extracted from the neighborhood of the coarsely detected position may be determined by the size of the subject (e.g. mark).

Figure 51:
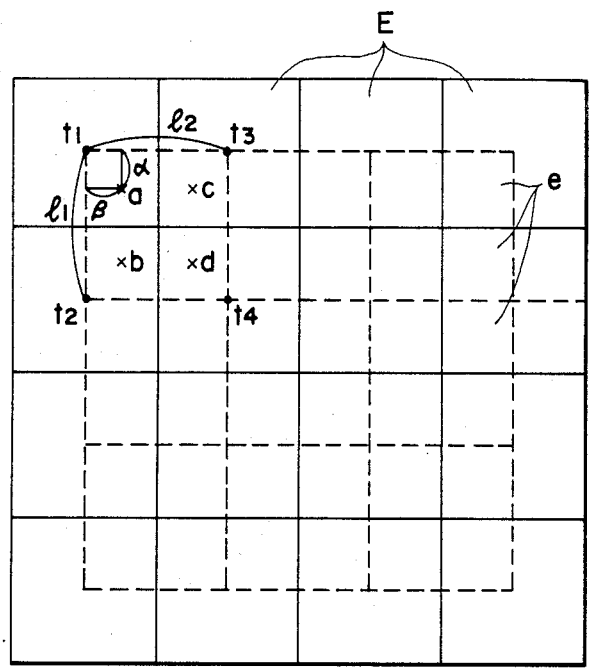
FIG. 51 is a principle view, for explicating the interpolation of the vinarizing threshold.

FIG. 51 schematically shows the manner of calculation for determining the threshold for the second binarization, according to the interpolation. The FIG. 51 example is a case where zones of a number "4×4" in the neighborhood of the coarsely detected position are extracted. In FIG. 51, the regions E of a number "4×4" each enclosed by solid lines are the zones, respectively, defined by the division having been made in the coarse detection processing. Also, the sections e each enclosed by solid lines and broken lines, dividing the region E into four, are the zone segments defined for the purpose of fine detection processing. In FIG. 51, reference characters t1, t2, t3 and t4 denote the binarization thresholds for the corresponding zones, respectively, in the coarse detection processing. Each of these values t1–t4 is taken as the binarization threshold at the center of corresponding one of the zones. Then, from these binarization thresholds t1–t4, binarization thresholds a, b, c and d for the respective zone segments in the fine detection processing are calculated by approximation and in accordance with the interpolation. For example, the binarization threshold can be expressed as follows:

$$a = t_1 \frac{l_1 - \alpha}{l_1} \frac{l_2 - \beta}{l_2} + t_2 \frac{\alpha}{l_1} \frac{l_2 - \beta}{l_2} + t_3 \frac{l_1 - \alpha}{l_1} \frac{\beta}{l_2} + t_4 \frac{\alpha}{l_1} \frac{\beta}{l_2}$$

In accordance with the calculation by approximation as set forth above, the binarization threshold of each of all the zone segments, for the fine detection processing, is determined. Then, for each of the zone segments having a very small extent as compared with each zone defined for the coarse detection processing, the image data is binarized by use of corresponding one of the second-detected binarization thresholds. Accordingly, the position measurement accuracy can be improved significantly. The binarization processing is carried out by the binarizing processor as in the case of the coarse detection.

Figure 52:
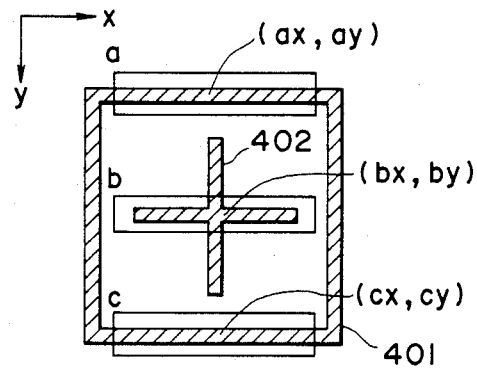
FIG. 52 is a principle view, for explicating the calculation of the center of gravity.

FIG. 52 is a schematic illustration explicating how the position detection marks 401 and 402, usable in the present embodiment, are binarized during the fine detection processing. One of the marks 401 and 402 may be provided, for example, on the reticle 204 (FIG. 45), while the other may be provided on the glass plate 207. As an example, the mark portion (hatched region) is represented by "1", while the other portion is represented by "0". In a center-of-gravity calculating portion, the microprocessor 325 is used to calculate the center of gravity for each of the components of the subject. In this embodiment, for example, the center of gravity of the line-segment element of the mark is calculated. First, on the basis of the coarsely detected position, such regions a, b and c each containing a linear component of the mark can be set. With respect to each of these regions, the center of gravity of the linear component is determined. The centers of gravity as determined are now denoted by (ax, ay), (bx, by) and (cx, cy). The Y-axis position Ym of the center of the mark in the X-Y coordinate system is given by the following equation:

Ym=(ay+2by+cy)/4

Similarly to the case of the Y-axis position, the X-axis position of the center of the mark can be detected by setting regions extending in the X direction.

Described above is the processing made in the center-of-gravity calculation unit.

Owing to the above-described fine detection processing, which comprises second or re-binarization, made to the portion in the neighborhood of the coarsely detected position, and because of the calculation of the center of gravity, the position detection accuracy is improved remarkbly. Generally, errors or tolerances in the position detection accuracy are not greater than ±1 picture element, are practical, and errors or tolerances in the position detection accuracy of ±½ picture element, is attainable. Accordingly, insufficiency of the detection accuracy by the coarse detection processing can be fully compensated for.

The above-described operation according to one embodiment of the present invention is illustrated in the flow chart of FIG. 53. That is, in response to the input of the image signals at Step 501, the coarse detection is executed at Step 502. Subsequently, in accordance with the result of coarse detection, the fine detection is carried out at Step 503. The result of fine detection, i.e. the information concerning the position of the mark, is outputted (Step 504). Details of the Steps 502 and 503 are such as having been described in the foregoing.

It is to be noted that the second binarization described above may be omitted in a case where the X/Y projection integration unit shown in FIG. 40 is provided and if, by use of the center of gravity of the data obtained as a result of the projection integration in the mark direction (i.e. in the manner as has been described with reference to FIGS. 39–42), the calculation of the center of gravity in the fine detection processing is executed on the data of the density memory. Since, in such case, the center-of-gravity calculation is executed with respect to the three-dimensional directions including the brightness (density), further improvement in the position detection accuracy is attainable.

Next, a description will be provided of to the correction of geometrical distortion of the image input system.

In image input system used for the reticle alignment, as described, possible distortion of the lens optical system, possible graphical distortion of the image pickup device such as the CCD camera, possible sampling error at the time of analog-to-digital conversion of the video signal, and the like are the factors that cause geometrical distortion of the image being input. In order to obtain correct and accurate measurement results, it is necessary to correct such distortion. This is achieved in the present embodiment.

Figure 54:
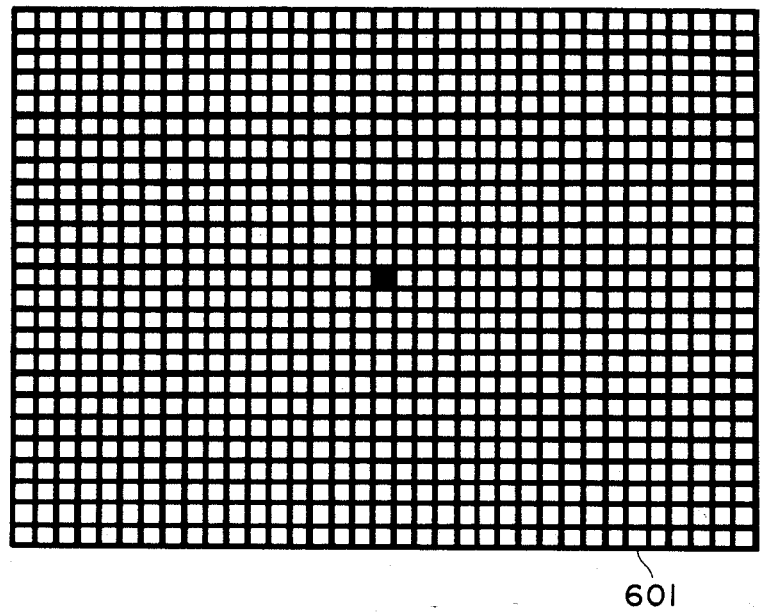
FIG. 54 is an example of an absolute grid formed on a reticle.

First, the manner of correction of the geometrical distortion of the image pickup system will be described. FIG. 54 shows an absolute grid 601 which is formed on a reticle by use of electron beams. Thus, the patterning accuracy is sufficiently high. The correction of distortion is carried out on the basis of transformation (linear transformation equation) between the actual grid shown in FIG. 54 and a grid image obtained as a result of the observation of the grid by the image pickup system.

The transformation from the actual grid (hereinafter "real grid") to the grid image can be approximated by local linear transformation. In the grid image, the position of each intersection of the grid or the position of the center of each region enclosed by the lines of grid, can be detected by the center-of-gravity calculation. The thus detected position is now denoted by (X', Y'). Also, the position of the corresponding intersection on the real grid is denoted by (x, y). The relation is expressed as follows:

$$\begin{pmatrix} x' \\ y' \end{pmatrix} = \begin{pmatrix} a & b \\ c & d \end{pmatrix} \begin{pmatrix} x \\ y \end{pmatrix} + \begin{pmatrix} e \\ f \end{pmatrix} \quad (2)$$

It is assumed that $$X' = \begin{pmatrix} x' \\ y' \end{pmatrix}, X = \begin{pmatrix} x \\ y \end{pmatrix}, A = \begin{pmatrix} a & b \\ c & d \end{pmatrix} \text{(linear transformation) and}$$

$$E = \begin{pmatrix} e \\ f \end{pmatrix}$$

Then, the equation (2) can be rewritten as follows:

$$X' = AX + E$$

It follows therefrom that $$X = A^{-1}(X' - E)$$

Figure 55:
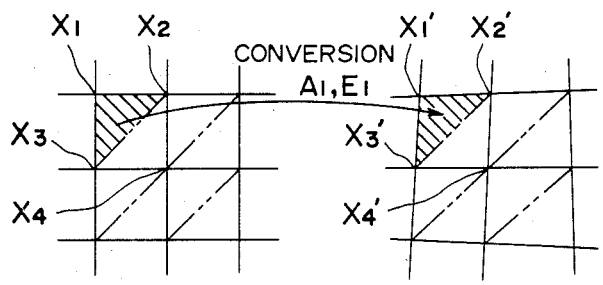
FIG. 55 shows a principle view, showing a real grid and a grid image detected by the observation of the real grid.

FIG. 55 schematically shows a portion of the real grid and the corresponding portion of the grid image. By detecting the positions X1', X2', X3' and by solving the following simultaneous equations, the value E1 and the linear transformation A1 are determined.

$$X1' = A1X1 + E1$$

$$X2' = A1X2 + E1$$

$$X3' = A1X3 + E1$$

Subsequently, the position X' as detected in a region (X1', X2' and X3') as enclosed by the points X1', X2' and X3', is corrected on the basis of A1 and E1. Thus, $$X = A1^{-1}(X' - E) \quad (3)$$

is obtained. Thereafter, the position X4' is detected, and calculations are made to determine A2 and E3 on the basis of X1', X2' and X4'.

Figure 56:
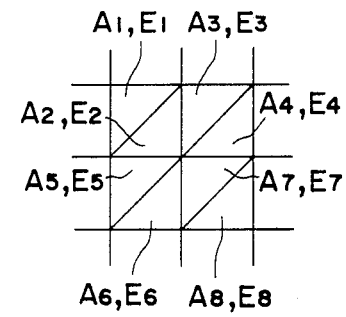
FIG. 56 is a principle view, for explicating a correction map.

In this manner, in the whole range of the image, the positions X1', X2', ... and Xn' are detected and, on the basis of the result of detection, the values A1 and E1 corresponding to each local region are determined such as is schematically illustrated in FIG. 56. Thus, an image pickup system distortion correcting map (hereinafter "correction map") is obtained.

By correcting the detected position in the image by use of the correction map and in accordance with equation (3), high-precision position detection is attainable. While it is sufficient to once prepare such correction map in view of the inherency of the image pickup system, if the distortion characteristics change with time, it is necessary to prepare a new correction map periodically.

Further, if much higher precision is required, the approximation may be made on the basis of a higher order transformation. If, to the contrary, very high precision is not required, the measuring points X1', X2'. .. and Xn' may be thinned out.

Figure 57:
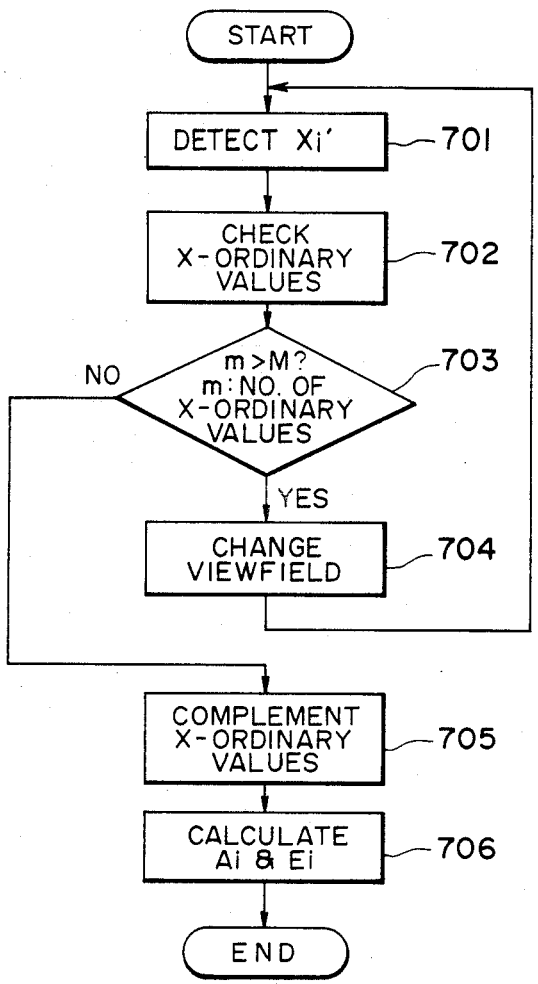
FIG. 57 is a flow chart showing the preparation of the correction map.

It is to be noted that, due to a possible defect of the absolute grid 601 formed on the reticle, a possible scratch on the reticle, possible adhesion of any foreign particle on the reticle, etc., there is a possibility that all the results of detection, now represented by Xi', having been made in the manner described above are not correct. Of course, considerations have been made of such inconvenience, in the present embodiment. This will now be described taken in conjunction with the flow chart of FIG. 57.

After completion of the detection of the positions of the grid intersections at Step 701, examination is made as to any extraordinary value included in the detection results Xi' (Step 702). Details of the examination will be described later. Subsequently, at Step 703, the number m of the extraordinary values is discriminated. If the number m is greater than a predetermined upper limit M which is preset with respect to the number of the extraordinary values, then the viewfield of the objective lens system of the image pickup system is changed (Step 704). Thus the sequence goes back to Step 701, such that the intersection "Xi'" detection is executed again with respect to such region as including a smaller number of extraordinary values. Details of the detection with the modified viewfield will be described later. The value of the upper limit M is determined suitably. For example, a number which is equal to 10% of the total times of measurement (i.e. the number of intersections Xi') may be selected. If m≦M (Step 703), the sequence goes to Step 705.

Figure 58:
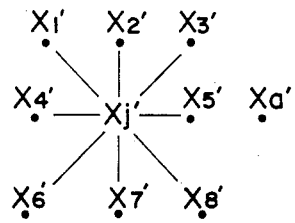
FIG. 58 is a princple view, for explicating the manner of compremeting an extraordinary value.

Step 705 is a process for complementing the discriminated extraordinary value or values in the detection results Xi'. Where an extraordinary value is denoted by Xj', the complementing thereof is carried out by using adjacent values Xi' lying in eight radial directions about Xj'. The manner of such complementing is schematically illustrated in FIG. 58.

When Xj' is extraordinary and the neighboring X1'–X8' are correct, Xj' is determined so that d becomes minium wherein d is:

$$d = ||X4' - Xj'| - |Xj' - X5'|| \quad (4)$$
$$+ ||X2' - Xj'| - |Xj' - X7'||$$
$$+ ||X3' - Xj'| - |Xj' - X6'||$$
$$+ ||X1' - Xj'| - |Xj' - X8'||$$

Further, if all the values in the neighborhood of Xj' are not correct, the value d is determined by calculation using (i) a discriminated correct value (Xi') in each of the eight directions which value is nearest to Xj' and (ii) the positional relation with respect to such value. For example, X5' is also extraordinary and Xa' which is at the next intersection of the grid (see FIG. 58) in the same direction is correct, then the component |Xj'–X5'| of equation (4) is rewritten as |Xj'–Xa'|/2. Namely, d is given by:

$$d = |K1|Xa' - Xj'| - K2|Xj' - Xb'||$$
$$+ |K3|Xc' - Xj'| - K4|Xj' - Xd'||$$
$$+ |K5|Xe' - Xj'| - K6|Xj' - Xf'||$$
$$+ |K7|Xg' - Xj'| - K8|Xj' - Xi'||$$

wherein $Xa'$, $Sb'$, ... and $Xi'$ are the correct values lying, respectively, in the eight directions and being nearest to $Xj'$ in respective directions; and $k1$, $k2$, ... and $k8$ are coefficients representing their positional relation in the real grid.

After the complementing, Ai and Ei are calculated at Step 706, and the correction map is prepared.

Now a description will be provided of the examination of extraordinariness.

If the correction is made on the basis of Aj and Ej determined in accordance with the detected values including $Xj'$ which is extraordinary, there is the possibility of deterioration of the detection accuracy to the contrary. The extraordinariness examination is made to discriminate such extraordinary value $Xj'$. It is to be noted that the examination is made to the whole of the viewfield of the objective lens, not regionally.

Here, the intersections $X1$, $X2$, ... and $Xn$ of the real grid are represented by $di$, and the linear transformation is executed to the whole, not regionally. The intersections of the grid after the transformation are represented by $di'$. The linear transformation to the whole can be expressed as follows:

$$di' = \begin{pmatrix} 1 + \beta x & -\theta y \\ \theta x & 1 + \beta y \end{pmatrix} di + \begin{pmatrix} Sx \\ Sy \end{pmatrix}$$

wherein $\theta$ is the inclination, $\beta$ is the magnification, x and y denote the directions, and S is the amount of shift.

Where the detected values $X1'$, $X2'$, ... and $Xn'$ concerning the intersections on the grid image are represented by $li$, then $$V = \frac{1}{n} \Sigma |r|^2 \text{ (where } r = di' - li\text{)}$$

$$\sigma = \sqrt{V \cdot n/(n-1)}$$

By use of the dispersion $\sigma$, the extraordinariness is discriminated. Namely, of the grid intersections resulting from the linear transformation made evenly to the whole, the grid intersection $di'$ nearest to the detected $li$ is determined in acordance with the least square method and, subsequently, whether or not $li$ is extraordinary is discriminatd on the basis of the dispersion of $|Di'' - li|$ at that time.

If there is only one extraordinary value, that is where a certain value $Xi$ of the values $li$ is extraordinary, it can be detected in the manner described below.

Figures 59A, 59B:
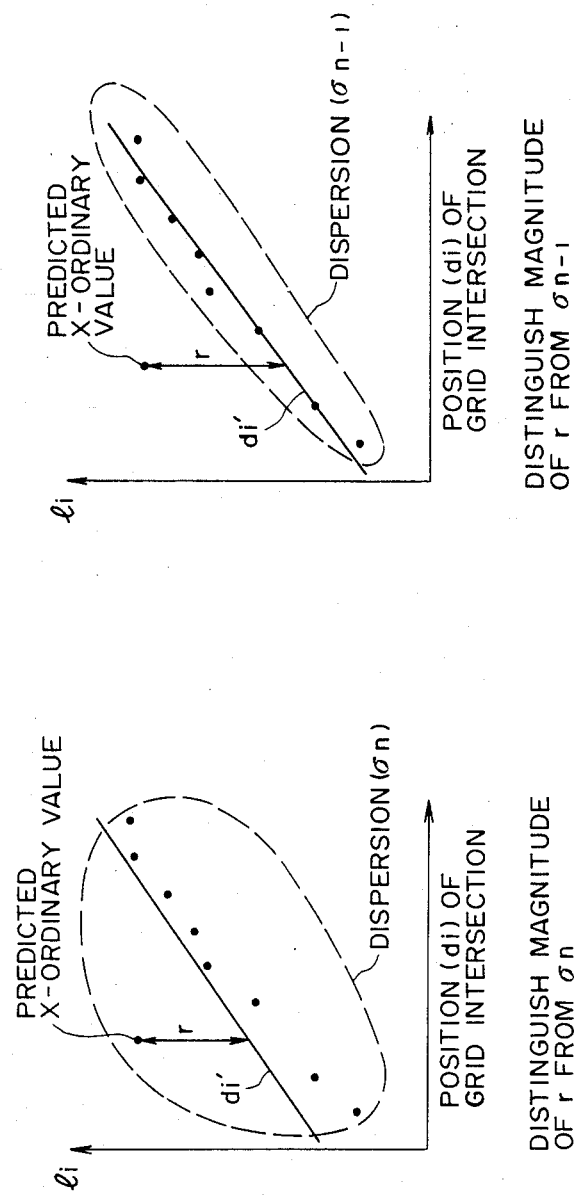
FIGS. 59A, 59B, 60, 61 and 62A–62D are graphs, respectively, for explicating the manner of discrimination of extraordinary values.

In a case where only one of the detected values concerning the corresponding grid intersections of a number n is extraordinarily deviated, such as illustrated in FIG. 59A or 59B (wherein the deviation and the positions of the grid intersections are illustrated one-dimensionally for convenience in explanation), such extraordinary one can be detected in accordance with the following discrimination:

$$r/\sigma > K$$

wherein r and $\sigma$ are the values being illustrated while K is a constant.

As for the dispersion $\sigma$, it is preferable to use "$\sigma_{n-1}$" (FIG. 59B) detected from the data with the predicted extraordinary value being excluded, rather than "$\sigma_n$" (FIG. 59A) wherein the predicted extraordinary value is included, since use of the former can avoid deterioration of $\sigma$ itself so that the extraordinariness can be more clearly distinguished. The discrimination is therefore based upon the fact that extraordinariness of the detected values $X1'$, $X2'$, ... and $Xn'$ results from any factor other than normally random errors (see FIG. 69) and, therefore, does not correspond to the distribution $N(m, \sigma_{n-1})$ with the extraordinary value being excluded. Thus, the manner of discrimination of the extraordinariness can be expressed as follows:

Discrimination of Extraordinary Value

"If $r/\sigma > K$, the value concerning the i-th intersection (5) is determined as extraordinary" wherein $$r = \left| \begin{pmatrix} \beta x & -\theta y \\ \theta x & \beta y \end{pmatrix} di + \begin{pmatrix} Sx \\ Sy \end{pmatrix} - li \right|$$

$$\sigma = \sqrt{V \cdot n/(n-1)}$$

$K$ = constant (e.g. 3.0)
$\beta x$, $\beta y$, $\theta x$, $\theta y$, $Sx$, $Sy$ and $V$ are those detected while excluding the i-th intersection of the grid, and $di$ and $li$ are coordinates of the i-th intersection Since the above-described discrimination method comprises prediction of the magnitude of random errors of the process with use of dispersion $\sigma$, and discrimination based upon the predicted magnitude, it is possible with this method to discriminate any extraordinary error independent from the process.

In order to detect one extraordinary grid intersection of the intersections of a number n (thus, i = 1, 2, ... or n), it is necessary to execute the discrimination by n times. This requires a number of calculations and therefore is not practical. In consideration of this, it is preferable to conduct the discrimination with regard to only such intersection which is predicted as most extraordinary. If the definition (5) applies to such intersection, it is excluded.

The intersection which is to be predicted as an extraordinary intersection is the one which is farthest from the grid intersections $di'$ having been determined by the correction made to the whole intersections of the number n.

If, on the other hand, plural extraordinary values are included, namely if two or more intersections are extraordinary, "$r_i/\sigma$" is not detected because "i" in the equation (4) is not single. Further, even if intersections of a number m, of the intersections of the number n, are discriminated as extraordinary by some means, there are possible combinations of a number "nCm" so that the calculation required is too complicated. Also, it is difficult to discriminate the number m In view of this, where many intersections are extraordinary, one of them is excluded in a similar manner as has been described with reference to the case of single extraordinary value, and, subsequently, the next one intersection of the intersections of the number n-1 is excluded in the same way. By repeating such thinning-out, finally the intersections of the number m are excluded.

If, in this case, there are two extraordinary values concerning two intersections, the exclusion of one intersection does not cause the value "$r/\sigma$" to increase because $\sigma$ is still large due to the non-excluded one of the extraordinary values. When such second extraordinary intersection is additionally excluded, $\sigma$ becomes smaller with the result that $r/\sigma$ increases.

Figure 61:
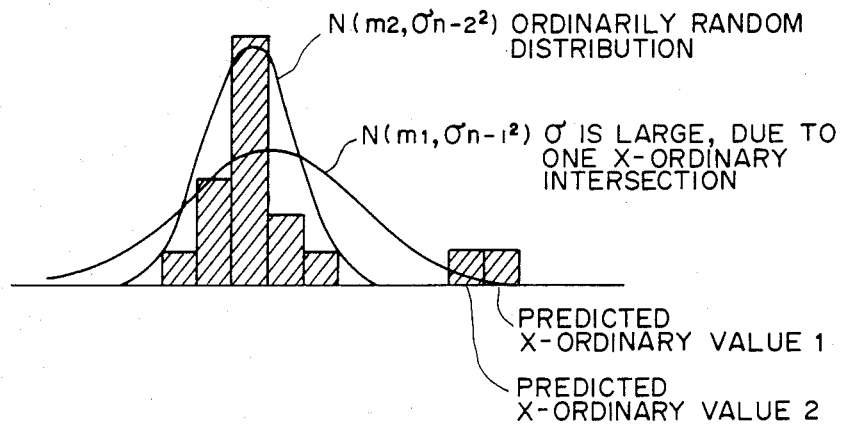
Figure 62A:
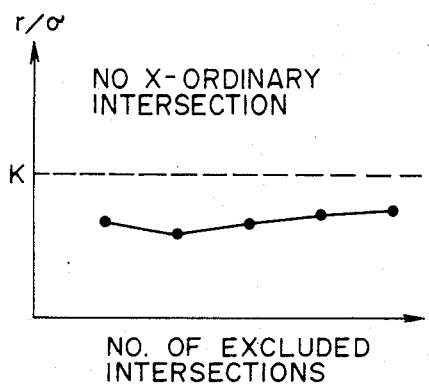
Figure 62B:
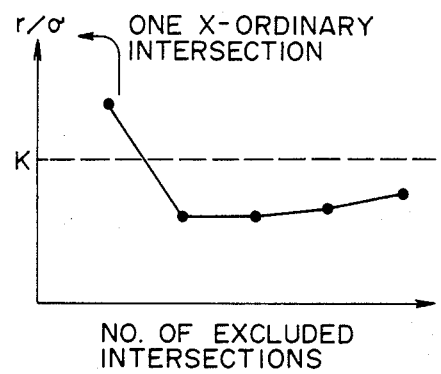
Figure 62C:
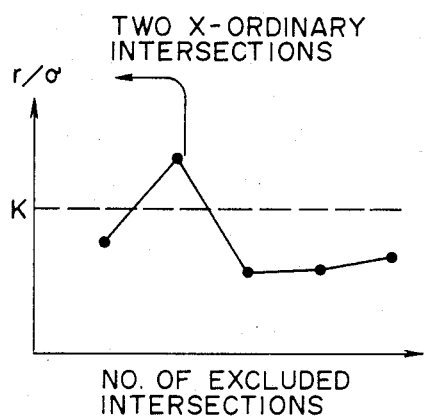
Figure 62D:
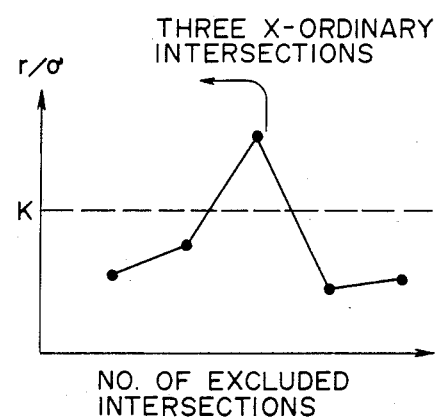

The manner of change of $r/\sigma$ is schematically illustrated in FIGS. 62A–62D. If there are extraordinary values in relation to two intersections, such as in the FIG. 61 case, $r/\sigma$ becomes maximum with the exclusion two intersections as seen in FIG. 62C. From this, it will be understood that the value of $r/\sigma$ is monitored and recorded while excluding intersections one by one, and, if maximum $r/\sigma$ becomes greater than K, such intersections which have already been excluded before $r/\sigma$ goes beyond K are disregarded as extraordinary values. If, on the other hand, $r/\sigma$ does not go beyond K, it is discriminated that no extraordinary value is included.

With the sequential exclusion of the predicted extraordinary values, $\sigma$ decreases gradually. When the number of non-excluded or remaining intersections becomes equal to "three", $\sigma=0$ and $r/\sigma=\infty$. The exclusion of intersections of such number, that is too large in consideration of the number of all the intersections originally included, is not reasonable. Therefore, an upper limit M is specified in relation to the number of intersections which may be excluded.

Figure 63:
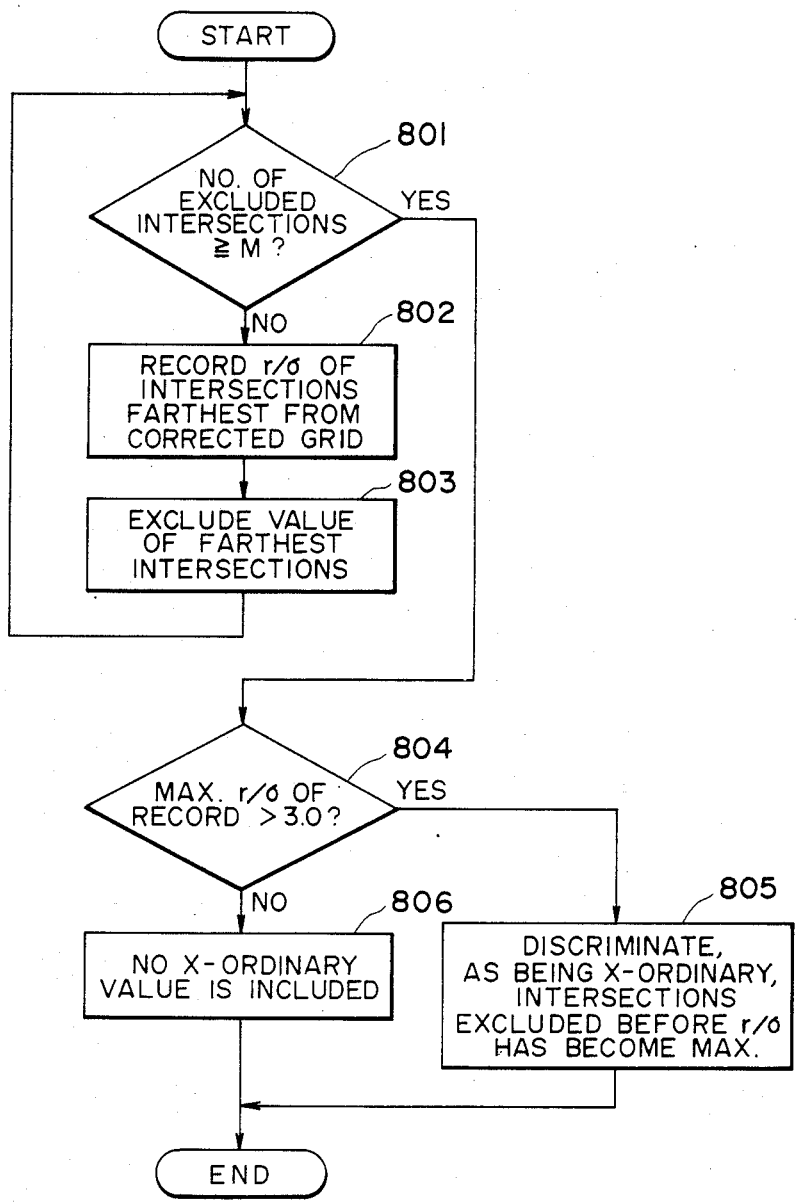
FIG. 63 is a flow chart showing the flow of discriminating of extraordinary values.

The argorithm for finally determining the extraordinary value or values in such as illustrated in the flow chart of FIG. 63, regardless of the number of the extraordinary intersections.

Next, a description will be provided of viewfield change and a measurement based on the changed viewfield.

Referring now to FIG. 64A, there are schematically illustrated regions ①, ② and ③ each having been discriminated as including no extraordinary value on the basis of the above-described extraordinariness examination. The dots in FIG. 64A denotes the intersections of the absolute grid 601 on the reticle as being observed by the image pickup device, i.e., the intersections on the grid image.

From the FIG. 64A state, the reticle is moved relative to the viefield of the image pickup device. In this embodiment, the objective lens optical system is moved in the X and/or Y direction by a driving motor (not shown) so that the subject of observation is moved relative to the viewfield. By processing the image as observed with the thus modified viewfield in the manner described hereinbefore, a correction map is obtainable.

FIG. 64B schematically shows the manner that, after a correction map such as illustrated in FIG. 64A is obtained, the viewfield is relatively shifted rightwardly by an amount corresponding to two intersections such that accurate correction-map information with regard to the regions in the viewfield of the objective lens optical system, corresponding to the regions ①–③ and ①'–③', is obtained. The above-described operation is repeated so that the extraordinary values in the correction map preparing data are removed or so that the number of the extraordinary values become less than the upper limit M. By doing so, a more accurate correction map not being affected by any defect or scratch on the mark or the like, can be prepared.

Next, a description will be provided of the monitoring of the reticle position.

The automatic alignment system of the present embodiment is not arranged so as to observe the reticle and the wafer at the same position. For this reason, it is a requirement that the relative positional relation between the respective detection systems does not involve an error. Further, accurate alignment is not attainable if the reticle position is displaced during the alignment operation of the wafer. Accordingly, it is very desirable to continuously monitor the reticle position.

Referring now to FIG. 65, denoted at LTS is a reticle stage for carrying thereon the reticle LT and being movable in the X, Y and $\theta$ directions; at WS, is a wafer stage for carrying thereon the wafer WF and being movable in the X, Y and $\theta$ directions; at M1, a mirror; at BM, a reference mask; at D, a detector; and at OB1 and OB2, detecting systems which are provided for aligning the reticle and which are of the type described with reference to FIG. 45. The elements M1, BM and D are components of the wafer detection system described hereinbefore. In FIG. 65, these detection systems are illustrated schematically, and various other components shown in FIG. 17 or 45 are omitted in the illustration of FIG. 65. Denoted at MO and MOL are driving systems for driving and positioning the wafer stage and the reticle stage, respectively. Denoted at ARM is a processing unit for controlling the operations of the driving systems in response to signals from the wafer position detecting system and the reticle position detecting system, and on the basis of the calculation of the positional error. Actually the wafer stage WS is provided with a laser interferometer measuring system such as at IFM in FIG. 17, although it is not illustrated in FIG. 65. The positional information obtained by the laser interferometer measuring system is supplied to the processing unit ART.

After completion of the reticle-to-wafer alignment, the reticle is usually held immovable. However, it is possible that the reticle position is displaced for any reason. In the present embodiment, the reticle position is monitored by the detection systems OB1 and OB2 during the alignment operation of the wafer, and the processing unit ART operates to feedback the reticle position to the driving system MOL so that the reticle is continuously held at a predetermined position. Namely, the reticle position is monitored and, if it is displaced from the predetermined position, the reticle is moved. By this, the positional accuracy of the reticle is ensured.

In place of moving the reticle, the positional deviation of the reticle may be reflected to the position of the wafer. That is, the system may be arranged so that, when the reticle position is shifted from the predetermined position, the processing unit operates to feedback the shift of the reticle position to the instruction signal to be supplied to the wafer positioning system.

Further, both of the reticle and the wafer may be moved so as to retain the desired positional relation.

As a matter of course, the monitoring and correction of the reticle position may be executed only at a desired time.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus for projecting a pattern formed on a first object upon a second object, having a mark and a radiation-sensitive layer, by use of a projection optical system to thereby expose the radiation-sensitive layer to the pattern of the first object, said apparatus comprising:

an illumination optical system adapted to illuminate, from between the projection optical system and the second object without use of the projection optical system, the surface of the second object on a side thereof on which the radiation-sensitive layer is provided; and a detection optical system for detecting, by use of the projection optical system and by use of a light from said illumination optical system, the mark of the second member from the side thereof on which the radiation-sensitive layer is provided, wherein said detection optical system has an numerical aperture of sin A with respect to the second object, wherein said illumination optical system supplies an illuminating light to the second object at an angle B with respect to an optical axis of the projection optical system, and wherein A and B satisfy the following relation: $B \geq A + 10°$.

2. An apparatus according to claim 1, wherein the illuminating light is projected upon the second object with a Brewster angle at respect to the radiation sensitive layer provided on the second object.

3. An apparatus according to claim 1, wherein the illuminating light is projected upon the second object in a direction perpendicular to an edge, to be detected, of the mark of the second object.

4. An apparatus according to claim 1, wherein said illumination optical system changes the angle over time, at which the illuminating light is incident upon the second member.

5. An apparatus according to claim 1, wherein said illumination optical system includes a stop provided therein to restrict the direction of the light impinging on the mark and the region on the second member to be irradiated with the illuminating light.

6. An apparatus according to claim 5, wherein said stop is inclined with respect to an optical axis of said illumination optical system.

7. An apparatus according to claim 1, wherein said detection optical system includes a spatial filter corresponding to the mark of the second object.

8. An apparatus according to claim 1, wherein said illumination optical system includes a light source comprising laser for producing the illuminating light.

9. An apparatus according to claim 8, wherein said illumination optical system produces illuminating light incident upon the second member in a P-polarized state.

10. An apparatus according to claim 8, wherein said illumination optical system includes a plurality of lasers producing lasers beams of different wavelengths and wherein said apparatus further comprises a plurality of detection optical system of a number corresponding to the number of said lasers.

11. An apparatus according to claim 8, wherein the laser beam is incident upon the second object with such angle of incidence that is effective to cause, when the mark is irradiated with the laser beam, a high-order diffraction light to be reflected from the mark and to advance substantially in parallel to the optical axis of the projection optical system.

12. A projection exposure apparatus for projecting a pattern formed on a first object upon a second object having a mark by use of a projection optical system, said apparatus comprising:

first illuminating means for illuminating the second object from between the projection optical system and the second object without use of the projection optical system;

second illumination means for illuminating a plate-like member having a reference mark formed therein;

detection means operable to detect the mark of the second object by use of an illuminating light supplied from said first illumination means and by use of the projection optical system, said detection means being also operable to detect the reference mark by use of an illuminating light supplied from said second illumination means and passing through said plate-like member, wherein said detection means has an numerical aperture of sin A with respect to the second object, wherein said first illumination means supplies an illuminating light to the second object at an angle B with respect to an optical axis of the projection optical system, and wherein A and B satisfy the following relation: $B \geq A + 10°$; and control means for controlling the positional relation between the first and second objects in accordance with the detection by said detecting means.

13. An apparatus according to claim 12, wherein the reference mark is defined by an aperture formed in the plate-like member.

14. An apparatus for projecting a pattern formed on a first object upon a second object having a mark by use of a projection optical system, said apparatus comprising:

illumination means for illuminating the second object from between the projection optical system and the second object without use of the projection optical system;

imaging means for imaging, upon the second object, a reference mark formed on a plate-like member, by use of an illuminating light supplied from said illumination means and passing through the projection optical system;

detection means for detecting an image of the mark of the second object, which image is partially shaded by means of said reference mark, wherein said detection means has a numerical aperture of sin A with respect to the second object, wherein said illumination means supplies an illuminating light to the second object at an angle B with respect to an optical axis of the projection optical system, and wherein A and B satisfy the followimg relation: $B \geq A + 10°$; and means for controlling the positional relation between the first and second objects in accordance with the detection by said detection means.

15. An apparatus according to claim 14, wherein said detection means is arranged to scan the image of the mark of the second object, having been transmitted through said plate-like member, and also to photoelectrically convert the scanned image into an electrical signal.

16. An appartus for projecting a pattern formed on a first object upon a second object having a mark by use of projection optical system, said apparatus comprising illumination means for illuminating the second object from between the projection optical system and the second object without using the projection optical system;

means for scanning an image of the mark of the second object formed with the aid of the projection optical system and an image of reference mark provided on a plate-like member;

means for receiving the scanned images and converting the scanned images into electrical signals;

means for detecting the positional deviation of the second object from the reference mark, on the basis of the electrical signals; and control means for controlling the positional relation between the first and second objects in accordance with the detection by said detecting means.

17. An apparatus according to claim 16, wherein said detecting means includes a plurality of light receiving means and wherein the image of the mark of the second object and the image of the reference mark are received separately by said plurality of light receiving means.

18. An apparatus according to claim 16, wherein said receiving means receives the image of the mark of the second object and the image of the reference mark with a predetermined time difference.

19. An apparatus according to claim 16, wherein each of the second object and the plate-like member has at least two marks provided with respect to X and Y directions, respectively, of an X-Y coordinate system and wherein said detecting means detects one of said at least two marks, associated with one of the X and Y directions, independently of the other associated with the other direction.

20. An apparatus according to claim 19, wherein said scanning means includes one movable polygonal mirror and wherein the images of the mark elements of the mark of the second object and the reference mark are scanned with the aid of movement of said polygonal mirror.

21. An apparatus for proejcting a pattern formed on a first object upon a second object having a mark by use of a projection optical system, said apparatus comprising:

an illumination optical system for illuminating the second object from between the projection optical system and the second object without using the projection optical system;

a detector for detecting, by use of the projection optical system, an image of the mark of the second object as illuminated by said illumination optical system;

means for monitoring a change in the sensitivity of said detector; by irradiating said detector with a light from a standard light source; and means for controlling the positional relation between the first and second objects in accordance with an output of said detector when the image of the mark is detected thereby.

22. An apparatus according to claim 21, further comprising means for compensating for the change in the sensitivity of said detector, detected as a result of the monitoring, by controlling the intensity of light to be supplied form said illumination optical system.

23. An apparatus for projecting a pattern formed on a first object upon a second object having a mark by use of a projection optical system, said apparatus comprising:

an illumination optical system for illuminating the second object from between the projection optical system and the second object without using the projection optical system, said illumination optical system including a single-mode fiber for directing an illuminating light to the second object;

means for detecting, by use of the projection optical system, the mark of the second object by use of the illuminating light from said illumination optical system, wherein said detection means has an numerical aperture of sin A with respect to the second object, wherein said illumination optical system supplies an illuminating light to the second object at an angle B with respect to an optical axis of the projection optical system, and wherein A and B satisfy the following relation: $B \geq A + 10°$; and control means for controlling the positional relation between the first and second objects in accordance with the detection by said detecting means.

24. An apparatus according to claim 23, wherein said illumination optical system includes a gradient index type lens system and an expander lens system provided adjacent to opposite ends of said single mode fibers.

25. An apparatus according to claim 23, wherein said illumination optical system comprises a plurality of illumination lights, and wherein said illumination optical system illuminates the second object by use of said plurality of illuminating light supplied along different optical path lengths.

26. An apparatus for projecting a pattern formed on a first object upon a second object having a mark by use of a projection optical system, said apparatus comprising:

an illumination optical system arranged to illuminate the second object from between the projection optical system and the second object and without using the projection optical system, said illumination optical system illuminating the scond object by use of lights projected in sequence and in a plurality of directions;

detection means for detecting, by use of the projection optical system, the mark of the second object by use of the lights projected in sequence from said illumination optical system, wherein said detection means has an numerical aperture of sin A with respect to the second object, wherein said illumination optical system supplies an illuminating light to the second object at an angle B with respect to an optical axis of the projection optical system, and wherein A and B satisfy the following relation: $B \geq A + 10°$; and means for controlling the positional relation between the first and second objects in accordance with the detection by said detection means.

27. An apparatus for projecting a pattern formed on a first object upon a second object having a mark by use of a projection optical system, said apparatus comprising:

an illumination optical system arranged to illuminate the second object from between the projection optical system and the second object and without using the projection optical system, said illumination optical system illuminating the second object by use of lights projected in sequence and in a plurality of directions;

detection means for detecting, by use of the projection optical system, the mark of the second object by use of the lights projected in sequence from said illumination optical system; and means for controlling the positional relation between the first and second objects in accordance with the detection by said detecting means, wherein said illumination optical system is adapted to project the lights toward the second object, in sequence and in four directions congruent with axes of an X-Y coordinate system defined on the second object.

28. An apparatus for projecting a pattern formed on a first object upon a second object having a mark by use of a projection optical system, said apparatus comprising:

an illumination optical system arranged to illuminate the second object from between the projection optical system and the second object without using the projection optical system, said illumination optical system illuminating the second object by use of lights projected in sequence and in a plurality of directions;

detection means for detecting, by use of the projection optical system, the mark of the second object by use of the lights produced in sequence from said illumination optical system; and means for controlling the positional relation between the first and second objects in accordance with the detection by said detecting means, wherein said illumination optical system is adapted to sequentially project lights in two of four directions in an alternate fashion with the remaining two of the four directions.

29. An apparatus for projecting a pattern formed on a first object upon a second object having a mark by use of projection optical system, said apparatus comprising:

an illumination optical system for illuminating the second object from between the projection optical system and the second object without using the projection optical system;

image detecting means for receiving an image of the mark of the second object as illuminated by said illumination optical system, the image being formed with the aid of the projection optical system, wherein said image detecting means generates image data in response to the reception of the image by said image detecting means, wherein said image detecting means has an numerical aperture of sin A with respect to the second object, wherein said illumination optical system supplies an illuminating light to the second object at an angle B with respect to an optical axis of the projection optical system, and wherein A and B satisfy the following relation: $B \geq A + 10°$; and control means for controlling the positional relation between the first and second objects in accordance with the image data.

30. An apparatus according to claim 29, wherein said illumination optical system is arranged to illuminate the second object by use of lights projected in sequence in a plurality of directions.

31. An apparatus for projecting a pattern formed on a first object upon a second object having a mark, by use of a projection optical system and with use of light of a first wavelength, said apparatus comprising:

an illumination optical system for illuminating the second object by use of a light of a second wavelength different from the first wavelength;

a detection optical system having a plurality of rear-surface reflection type mirrors each having parallel surfaces, said mirrors being disposed so as to be inclined with respect to an optical axis of said detection optical system;

detecting means for detecting, by use of the projection optical system and said detection optical system, the mark of the second object by use of the light from said illuminatiom optical system; and means for controlling the positional relation between the first and second objects in accordance with the detection by said detecting means.

32. An apparatus according to claim 31, wherein said illumination optical system is arranged to illuminate the second object from between the projection optical system and the second object without using the projection optical system.

33. An apparatus for projecting a pattern, formed on a first object having an alignment mark upon a second object by use of a projection optical system, said apparatus comprising:

illumination means for illuminating with incoherent illuminating light, in a direction opposite to the directon of pattern projection, a reference mark formed on a plate-like member and the alignment mark of the first object, wherein said illumination means transmits the incoherent illuminating light through the reference mark of the plate-like member, and wherein the plate-like member is disposed between the projection optical system and the first object, wherein said illumination means illuminates the reference mark on the plate-like member and the alignment mark on the first oject from between the projection optical system and the plate-like member; and means for receiving the light from said illumination means to obtain image data;

means for calculating the relative positional deviation between the reference mark and the alignment mark on the basis of the image data; and means for aligning the first object on the basis of the positional deviation calculated by said calculating means.

34. An apparatus according to claim 33, whrein said illumination means comprises a Hg lamp for generating light comprising transmitting illumination light comprising g-line rays supplied from a Hg lamp.

35. An apparatus according to claim 33, wherein said apparatus further comprises means for producing light to be used for the projection of the pattern upon the second object and wherein the illuminating light is introduced from said producing means.

36. An apparatus for projecting a pattern, formed on a first object having a mark, upon a second object having a mark by use of a projection optical system, said apparatus comprising:

first mark supporting means for supporting a first reference mark operable as an index for the alignment of the first object;

second mark supporting means for supporting a second reference mark operable as an index for the alignment of the second object;

means for continuously monitoring the position of the mark of the first object with respect to the first reference mark;

detecting means for detecting, by use of the projection optical system, the positional relation between the mark provided on the second object and the second reference mark; and control means for controlling the position of the second object in accordance with the detection by said detecting means.

37. An apparatus according to claim 36, wherein said monitoring means generates an output relating to data for moving the first object so that the first object is continuously held at a predetermined position.

38. An apparatus according to claim 36, wherein said monitoring means generates an output relating to data for controlling the movement of the second object to control the position of the second object.

39. An apparatus for projecting a pattern, formed on a first object having a mark, upon a second object by use of a projection optical system, said apparatus comprising:

mark supporting means for supporting a reference mark operable as an index for the alignment of the first object;

image pickup means for observing the reference mark and the mark provided on the first object;

means operable to cause said image pickup means to observe a grid-like distortion measuring reference mark, and for preparing correction data on the basis of the positions of intersections of the distortion measuring reference mark and the positions of the intersections as detected as a result of the observation by said image pickup menas; and means for aligning the mark of the first object with the reference mark supported by said supporting means, on the basis of the observation of the reference mark and the mark of the first object by said image pickup means and in accordance with the correction data.

40. An apparatus for projecting a pattern formed on a first object upon a second object by use of a projection optical system, said apparatus comprising:

an illumination optical system for illuminating the second object from between the projection optical system and the second object without using the projection optical system;

a detector for receiving an image, formed through the projection optical system, of the second object as illuminated by said illumination optical system, said detector also receiving an image, formed through the projection optical system, of a second object, which is a standard, placed on a predetermined position and illuminated by said illumination optical system;

means for comparing a signal produced from said detector in response to the reception of the image of the standard, with a preparatorily stored reference value; and means for correcting the intensity of the light from said illumination optical system in accordance with the comparison by said comparing means.

41. An apparatus according to claim 40, wherein said correcting means includes a polarizing member actable on the light from said illumination means.

42. An apparatus according to claim 40 wherein said correcting means includes a neutral density filter actable on the light from said illumination optical system.

43. An apparatus according to claim 40, wherein said detector has a sensitivity and wherein the sensitivity of the detector is adjusted prior to the reception of the signal from the standard.

* * * * *

UNITED STATES PATENT AND TRADEMARK OFFICE
CERTIFICATE OF CORRECTION

PATENT NO. : 4,814,829

DATED : March 21, 1989

INVENTOR(S) : Kosugi, et al.

It is certified that error appears in the above-identified patent and that said Letters Patent is hereby corrected as shown below:

COLUMN 1:

Line 60, "variation" shoud read --variegation--.

COLUMN 3:

Line 18, "idealistic" should read --ideal--.

Line 23, "of components" should read --of the components--.

Line 53, "a" should read --at the--.

COLUMN 4:

Line 30, "is a" should read --is proposed a--.

COLUMN 5:

Line 3, "eef-" should read --ref- --.

Line 28, "signal the" should read --signal, and the--.

COLUMN 6:

Line 23, "firs member" should read --first member--.

Line 68, "toon" should read --tion--.

UNITED STATES PATENT AND TRADEMARK OFFICE
CERTIFICATE OF CORRECTION

PATENT NO. : 4,814,829
DATED : March 21, 1989
INVENTOR(S) : Kosugi, et al.

It is certified that error appears in the above-identified patent and that said Letters Patent is hereby corrected as shown below:

COLUMN 10:

Line 39, "analog-to-device," should read --analog-to-digital--.

Line 40, delete "digital".

Line 66, "illumination" should read --illumination optical system--.

COLUMN 11:

Line 9, "preparatoril" should read --preparatorily--.

COLUMN 13:

Line 9, "direct" should read --indirect--.

Line 20, "vinarization." should read --binarization.--

Line 24, "vinarizing" should read --binarizing--.

Line 39, "comprementing" should read --complementing--.

COLUMN 15:

Line 34, "scatter" should read --scattered--.

UNITED STATES PATENT AND TRADEMARK OFFICE
CERTIFICATE OF CORRECTION

PATENT NO. : 4,814,829

DATED : March 21, 1989

INVENTOR(S) : Kosugi, et al.

It is certified that error appears in the above-identified patent and that said Letters Patent is hereby corrected as shown below:

COLUMN 17:

Line 26, "633 +nm" should read --633 nm--.

Line 27, "Ar ion" should read --Ar +ion--.

Line 41, "attainble." should read --attainable.--.

COLUMN 18:

Line 58, "predectable," should read --predictable,--.

COLUMN 20:

Line 13, delete "be made to"

COLUMN 21:

Line 27, "attainble" should read --attainable--.

Line 46, "enormousy" should read --enormously--.

Line 64, "diffration" should read --diffraction--.

COLUMN 22:

Line 9, "abovedescribed" should read --above-described--.

UNITED STATES PATENT AND TRADEMARK OFFICE
CERTIFICATE OF CORRECTION

PATENT NO. : 4,814,829

DATED : March 21, 1989

INVENTOR(S) : Kosugi, et al.

It is certified that error appears in the above-identified patent and that said Letters Patent is hereby corrected as shown below:

COLUMN 23:

Line 42, "filter $E1_x$" should read --filter $F1_x$--.

COLUMN 24:

Line 27, "$MK1_x$ It" should read --$MK1_x$. It--.

COLUMN 25:

Line 33, "aperrure" should read --aperture--.

COLUMN 29:

Line 21, "He-Cd laesr" should read --He-Cd laser--.

Line 27, "lignment" should read --alignment--.

Line 50, "non-hotoprinting" should read --non-photoprinting--.

COLUMN 30:

Line 26, "formtion" should read --formation--.

COLUMN 31:

Line 24, "effectiv" should read --effective--.

UNITED STATES PATENT AND TRADEMARK OFFICE
CERTIFICATE OF CORRECTION

PATENT NO. : 4,814,829            Page 5 of 11

DATED : March 21, 1989

INVENTOR(S) : Kosugi, et al.

It is certified that error appears in the above-identified patent and that said Letters Patent is hereby corrected as shown below:

COLUMN 32:

Line 40, "monito" should read --monitoring--.

COLUMN 34:

Line 56, "definit" should read --definite--.

COLUMN 36:

Line 6, "suchc" should read --such--.

COLUMN 37:

Line 14, delete "much".

COLUMN 38:

Line 67, "characterers SDW" should read --characters SDW--.

UNITED STATES PATENT AND TRADEMARK OFFICE
CERTIFICATE OF CORRECTION

PATENT NO. : 4,814,829

DATED : March 21, 1989

INVENTOR(S) : Kosugi, et al.

It is certified that error appears in the above-identified patent and that said Letters Patent is hereby corrected as shown below:

COLUMN 39:

Line 23, "$MK1_Y(MK1_X)$ Also," should read --$MK1_Y(MK1_X)$. Also,--.

Line 29, "mar MK1Y" should read --$MK1_Y$--.

Line 31, "extend" should read --extending--.

Line 33, "detail." should read --more detail.--

Line 60, "WBM ,and therein." should read --WBM and stored therein.--.

COLUMN 40:
    Line 5, before "step" insert --At--.
    Line 6, "respect" should read --respect to--.

COLUMN 41:

Line 37, "abovedescribed" should read --above-described--.

Line 47, "retricle" should read --reticle--.

COLUMN 42:

Line 2, "accomplished" should read --accomplished.--.

Line 66, "referece" should read --reference--.

UNITED STATES PATENT AND TRADEMARK OFFICE
CERTIFICATE OF CORRECTION

PATENT NO. : 4,814,829
DATED : March 21, 1989
INVENTOR(S) : Kosugi, et al.

It is certified that error appears in the above-identified patent and that said Letters Patent is hereby corrected as shown below:

COLUMN 43:

Line 19, "glass plate 207'," should read --glass plate 207,--.

Line 27, "glass plate 207'" should read --glass plate 207--.

Line 66, "ompared" should read --compared--.

COLUMN 44:

Line 44, "hitogram" should read --histogram--.

Line 67, "resistor 327." should read --register 327.--.

COLUMN 45:

Line 39, "elements" should read --element--.

COLUMN 46:

Line 11, "register 34" should read --register 334--.

COLUMN 50:

Line 63, "example, X5'" should read --example, if X5'--.

UNITED STATES PATENT AND TRADEMARK OFFICE
CERTIFICATE OF CORRECTION

PATENT NO. : 4,814,829
DATED : March 21, 1989
INVENTOR(S) : Kosugi, et al.

It is certified that error appears in the above-identified patent and that said Letters Patent is hereby corrected as shown below:

COLUMN 51:

Line 7, "Xa', Sb',... and Xi'" should read --Xa', Xb',... and Xi'--.

Line 52, "discriminatd" should read --discriminated--, and "|Di"-li|" should read --|di"-li|--.

COLUMN 52:

Line 3, "extrarodinary" should read --extraordinary--.

Figure 60:
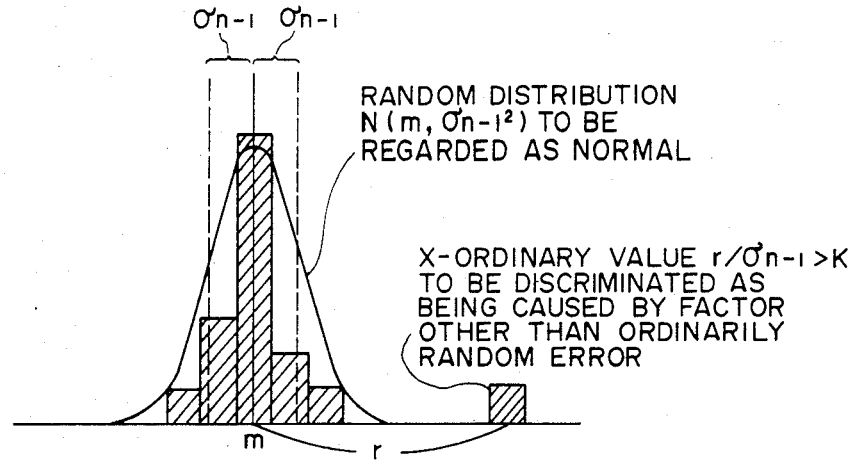

Line 10, "(see FIG. 69)" should read --(see FIG. 60)--.

Line 64, "number m In" should read --number m. In--.

COLUMN 53:

Line 14, "sion two" should read --sion of two--.

Line 32, "argorithm" should read --algorithm--.

Line 33, "in" (first occurrence) should read --is--.

Line 48, "viefield" should read --viewfield--.

COLUMN 54:

Line 42, "any" should read --some--.

UNITED STATES PATENT AND TRADEMARK OFFICE
CERTIFICATE OF CORRECTION

PATENT NO. : 4,814,829

DATED : March 21, 1989

INVENTOR(S) : Kosugi, et al.

It is certified that error appears in the above-identified patent and that said Letters Patent is hereby corrected as shown below:

COLUMN 55:

Line 30, "with" should read --at--, and "at" should read --with--.

Line 54, "laser" should read --a laser--.

Line 60, "lasers beams" should read --laser beams--.

Line 62, "detection optical system" should read --detection optical systems--.

COLUMN 56:

Line 56, "followimg" should read --following--.

Line 67, "appartus" should read --apparatus--.

COLUMN 57:

Line 1, "projection optical system," should read --a projection optical system--.

Line 8, "reference mark" should read --a reference mark--.

Line 64, "form" should read --from--.

UNITED STATES PATENT AND TRADEMARK OFFICE
CERTIFICATE OF CORRECTION

PATENT NO. : 4,814,829

DATED : March 21, 1989

INVENTOR(S) : Kosugi, et al.

It is certified that error appears in the above-identified patent and that said Letters Patent is hereby corrected as shown below:

COLUMN 58:

Line 29, "illuminating light" should read --illuminating lights--.

COLUMN 59:

Line 35, "projection optical system," should read --a projection optical system,--.

Line 48, "an" should read --a--.

COLUMN 60:

Line 9, "illuminatiom" should read --illumination--.

Line 19, "mark" should read --mark,--.

Line 24, "directon" should read --direction--.

Line 33, "oject" should read --object--.

Line 44, "whrein" should read --wherein--.

COLUMN 61:

Line 27, "intersections" should read --the intersections--.

UNITED STATES PATENT AND TRADEMARK OFFICE
CERTIFICATE OF CORRECTION

PATENT NO. :   4,814,829

DATED      :   March 21, 1989

INVENTOR(S) :  Kosugi, et al.

It is certified that error appears in the above-identified patent and that said Letters Patent is hereby corrected as shown below:

COLUMN 62:

Line 28, "claim 40" should read --claim 40,--.

Signed and Sealed this

First Day of January, 1991

Attest:

HARRY F. MANBECK, JR.

Attesting Officer

Commissioner of Patents and Trademarks